(12) United States Patent
Patla et al.

(10) Patent No.: US 11,810,731 B2
(45) Date of Patent: Nov. 7, 2023

(54) PHOTOVOLTAIC CELLS

(71) Applicant: Hewlett-Packard Development Company, L.P., Spring, TX (US)

(72) Inventors: Israel Patla, Nes Ziona (IL); Faina Kogan, Nes Ziona (IL); Itay Eyal, Nes Ziona (IL); Yaron Grinwald, Nes Ziona (IL); Mark Sandler, Nes Ziona (IL)

(73) Assignee: Hewlett-Packard Development Company, L.P., Spring, TX (US)

( * ) Notice: Subject to any disclaimer, the term of this patent is extended or adjusted under 35 U.S.C. 154(b) by 36 days.

(21) Appl. No.: 17/484,587

(22) Filed: Sep. 24, 2021

(65) Prior Publication Data

US 2022/0375695 A1 Nov. 24, 2022

Related U.S. Application Data

(63) Continuation-in-part of application No. 17/324,719, filed on May 19, 2021.

(51) Int. Cl.
*H01L 31/00* (2006.01)
*H01G 9/20* (2006.01)
(Continued)

(52) U.S. Cl.
CPC ......... *H01G 9/2059* (2013.01); *C09D 11/037* (2013.01); *C09D 11/107* (2013.01); *C09D 11/52* (2013.01); *H10K 71/13* (2023.02)

(58) Field of Classification Search
CPC .................................................. C09D 11/52
See application file for complete search history.

(56) References Cited

U.S. PATENT DOCUMENTS

2015/0357497 A1  12/2015  Mu et al.
2019/0002719 A1*  1/2019  Pousthomis ......... C09K 11/703
(Continued)

FOREIGN PATENT DOCUMENTS

CN    103928077 A  *  7/2014  ....... C09D 123/0869
CN    103928077 A      7/2014
(Continued)

OTHER PUBLICATIONS

English machine translation of CN 109860399 A (Year: 2023).*
(Continued)

*Primary Examiner* — Angelo Trivisonno
(74) *Attorney, Agent, or Firm* — Dierker & Kavanaugh, P.C.

(57) ABSTRACT

Described herein is a liquid electrophotographic photovoltaic ink composition comprising: a dispersion of a material with a perovskite structure, a thermoplastic resin and conductive particles in a carrier liquid; wherein the material with a perovskite structure has a chemical formula selected from $ABX_3$ and $A_2BX_6$; wherein A is a cation, B is a cation and X is an anion; and wherein the thermoplastic resin comprises: a copolymer of an alkylene monomer and a monomer having acidic side groups; and/or a copolymer of an alkylene monomer and an ethylenically unsaturated monomer comprising an epoxide; and/or a copolymer of an alkylene monomer, an ethylenically unsaturated monomer comprising an epoxide, and a monomer selected from a monomer having acidic side groups, a monomer having ester side groups and a mixture thereof. Also described is a method of producing a photovoltaic cell using the LEP ink and the printed cell produced by the method.

15 Claims, 7 Drawing Sheets

(51) Int. Cl.
  *C09D 11/107* (2014.01)
  *C09D 11/037* (2014.01)
  *C09D 11/52* (2014.01)
  *H10K 71/13* (2023.01)

(56) References Cited

U.S. PATENT DOCUMENTS

2021/0122887 A1    4/2021  Dong et al.
2022/0145108 A1*   5/2022  Endo .................... C09K 11/665

FOREIGN PATENT DOCUMENTS

| CN | 109860399 A | * | 6/2019 |
| CN | 109860399 A |   | 6/2019 |
| WO | WO-2021096528 |   | 5/2021 |
| WO | WO-2021096567 |   | 5/2021 |

OTHER PUBLICATIONS

English machine translation of CN 103928077 A (Year: 2023).*
Tiong ("Octadecylamine-Functionalized Single-Walled Carbon Nanotubes for Facilitating the Formation of a Monolithic Perovskite Layer and Stable Solar Cells") Adv. Funct. Mater. 2018, 28, 1705545 (Year: 2018).*
Pajor-Swierzy et al., "Air stable copper-silver core-shell submicron particles: Synthesis and conductive ink formulation", Colloids and Surfaces A: Physicochemical. Engineering Aspects, vol. 521, 2017, pp. 272-280.

* cited by examiner a)

| 1 |
|---|
| 2 |
| 3 | b)

| 1 |
|---|
| 4 |
| 2 |
| 3 | c)

| 1 |
|---|
| 4 |
| 2 |
| 5 |
| 3 |

Figure 1

PHOTOVOLTAIC CELLS

BACKGROUND

A photovoltaic cell (solar cell) converts light energy into electrical energy. A photovoltaic cell may comprise one or more photovoltaic layers positioned between an anode and a cathode. When light falls on the photovoltaic layer, the light is absorbed and generates particles with a positive or negative charge (holes and electrons). When an external load is connected between electrodes, electricity flows through the cell.

BRIEF DESCRIPTION OF THE FIGURES

FIG. 1 is a schematic representation of three different photovoltaic cells.

DETAILED DESCRIPTION

Figure 2:
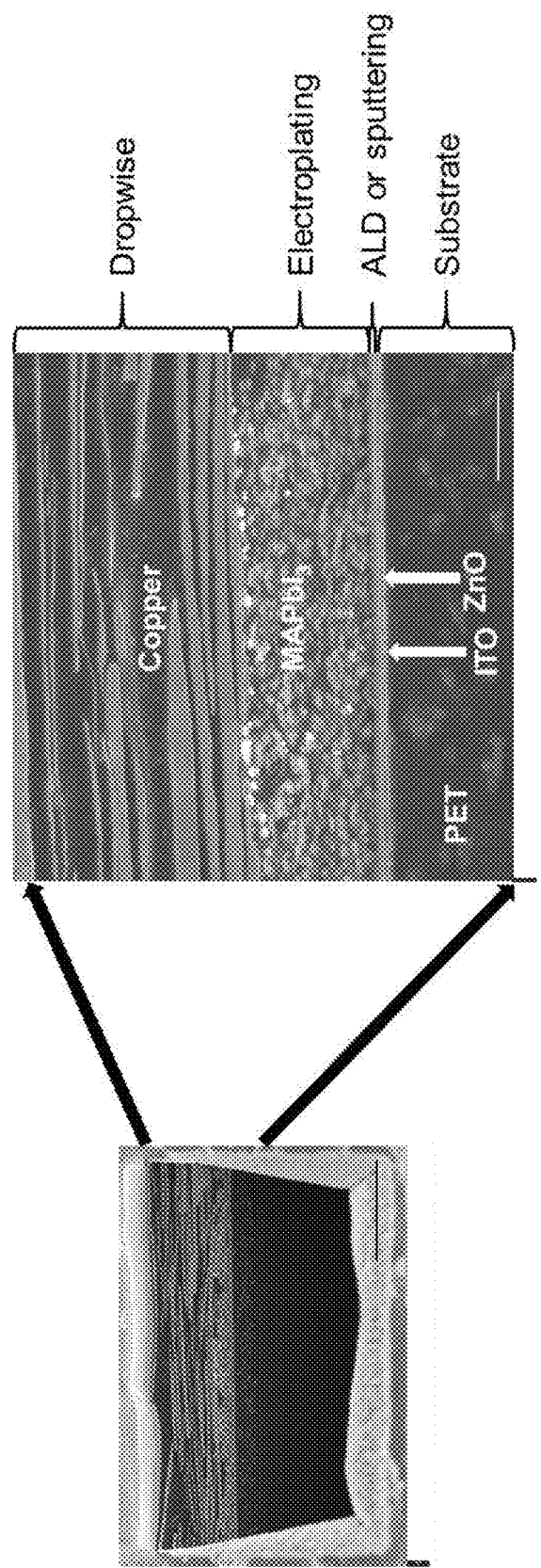
FIG. 2 shows an SEM-FIB cross-section of a photovoltaic cell at low magnification (left, scale bar: 10 μm) and high magnification (right, scale bar: 1 μm).

Before the present disclosure is disclosed and described, it is to be understood that this disclosure is not limited to the particular process steps and materials disclosed herein because such process steps and materials may vary somewhat. It is also to be understood that the terminology used herein is used for the purpose of describing particular embodiments. The terms are not intended to be limiting because the scope is intended to be limited by the appended claims and equivalents thereof.

It is noted that, as used in this specification and the appended claims, the singular forms "a," "an," and "the" include plural referents unless the context clearly dictates otherwise.

As used herein, "carrier fluid", "carrier liquid," "carrier," "liquid carrier" or "carrier vehicle" refers to the fluid in which pigment particles, resin, charge directors and other additives can be dispersed to form a liquid electrostatic ink composition or liquid electrophotographic ink composition. The carrier liquids may include a mixture of a variety of different agents, such as surfactants, co-solvents, viscosity modifiers, and/or other possible ingredients.

As used herein, "liquid electrostatic ink composition" or "liquid electrophotographic composition" generally refers to an ink composition that is typically suitable for use in an electrostatic printing process, sometimes termed an electrophotographic printing process. It may comprise pigment particles having a thermoplastic resin thereon. The electrostatic ink composition may be a liquid electrostatic ink composition, in which the pigment particles having resin thereon are suspended in a carrier liquid. The pigment particles having resin thereon will typically be charged or capable of developing charge in an electric field, such that they display electrophoretic behaviour. A charge director may be present to impart a charge to the pigment particles having resin thereon.

As used herein, "co-polymer" refers to a polymer that is polymerized from at least two monomers.

As used herein, "melt flow rate" generally refers to the extrusion rate of a resin through an orifice of defined dimensions at a specified temperature and load, usually reported as temperature/load, e.g. 190° C./2.16 kg. Flow rates can be used to differentiate grades or provide a measure of degradation of a material as a result of molding. In the present disclosure, unless otherwise stated, "melt flow rate" is measured per ASTM D1238 Standard Test Method for Melt Flow Rates of Thermoplastics by Extrusion Plastometer, as known in the art. If a melt flow rate of a particular polymer is specified, unless otherwise stated, it is the melt flow rate for that polymer alone, in the absence of any of the other components of the liquid electrostatic ink composition.

As used herein, "acidity," "acid number," or "acid value" refers to the mass of potassium hydroxide (KOH) in milligrams that neutralizes one gram of a substance. The acidity of a polymer can be measured according to standard techniques, for example as described in ASTM D1386. If the acidity of a particular polymer is specified, unless otherwise stated, it is the acidity for that polymer alone, in the absence of any of the other components of the liquid toner composition.

As used herein, "melt viscosity" generally refers to the ratio of shear stress to shear rate at a given shear stress or shear rate. Testing is generally performed using a capillary rheometer. A plastic charge is heated in the rheometer barrel and is forced through a die with a plunger. The plunger is pushed either by a constant force or at constant rate depending on the equipment. Measurements are taken once the system has reached steady-state operation. One method used is measuring Brookfield viscosity @ 140° C., units are mPa·s or cPoise, as known in the art. Alternatively, the melt viscosity can be measured using a rheometer, e.g. a commercially available AR-2000 Rheometer from Thermal Analysis Instruments, using the geometry of: 25 mm steel plate-standard steel parallel plate, and finding the plate over plate rheometry isotherm at 120° C., 0.01 Hz shear rate. If the melt viscosity of a particular polymer is specified, unless otherwise stated, it is the melt viscosity for that polymer alone, in the absence of any of the other components of the electrostatic composition.

A certain monomer may be described herein as constituting a certain weight percentage of a polymer. This indicates that the repeating units formed from the said monomer in the polymer constitute said weight percentage of the polymer.

If a standard test is mentioned herein, unless otherwise stated, the version of the test to be referred to is the most recent at the time of filing this patent application.

As used herein, "electrostatic printing" or "electrophotographic printing" generally refers to the process that provides an image that is transferred from a photo imaging substrate either directly or indirectly via an intermediate transfer member to a print substrate, such as a paper or a plastic substrate. As such, the image is not substantially absorbed into the photo imaging substrate on which it is applied. Additionally, "electrophotographic printers" or "electrostatic printers" generally refer to those printers capable of performing electrophotographic printing or electrostatic printing, as described above. "Liquid electrostatic printing" is a specific type of electrostatic printing in which a liquid composition is employed in the electrophotographic process rather than a powder toner. An electrostatic printing process may involve subjecting the electrostatic composition to an electric field, for example, an electric field having a field gradient of 50-400 V/μm, or more, in some examples, 600-900V/μm, or more.

As used herein, "NVS" is an abbreviation of the term "non-volatile solids".

As used herein, the term "about" is used to provide flexibility to a numerical range endpoint by providing that a given value may be a little above or a little below the endpoint to allow for variation in test methods or apparatus. The degree of flexibility of this term can be dictated by the particular variable and would be within the knowledge of those skilled in the art to determine based on experience and the associated description herein.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not just the numerical values explicitly recited as the limits of the range, but also to include all the individual numerical values or sub-ranges encompassed within that range as if each numerical value and sub-range is explicitly recited. As an illustration, a numerical range of "about 1 wt % to about 5 wt %" should be interpreted to include not just the explicitly recited values of about 1 wt % to about 5 wt %, but also to include individual values and sub-ranges within the indicated range. Thus, included in this numerical range are individual values such as 2, 3.5, and 4 and sub-ranges such as from 1-3, from 2-4, and from 3-5, etc. This same principle applies to ranges reciting a single numerical value. Furthermore, such an interpretation should apply regardless of the breadth of the range or the characteristics being described.

As used herein, unless otherwise stated, wt. % values are to be taken as referring to a weight-for-weight (w/w) percentage of solids in the ink composition, and not including the weight of any carrier fluid present.

Unless otherwise stated, any feature described herein can be combined with any aspect or any other feature described herein.

In an aspect, there is described a liquid electrophotographic (LEP) photovoltaic ink composition. The LEP photovoltaic ink composition may comprise:

a dispersion of a material with a perovskite structure, a thermoplastic resin and conductive particles in a carrier liquid;

wherein the material with a perovskite structure has a chemical formula selected from $ABX_3$ and $A_2BX_6$;

wherein A is a cation, B is a cation and X is an anion; and wherein the thermoplastic resin comprises:

a copolymer of an alkylene monomer and a monomer having acidic side groups; and/or a copolymer of an alkylene monomer and an ethylenically unsaturated monomer comprising an epoxide; and/or a copolymer of an alkylene monomer, an ethylenically unsaturated monomer comprising an epoxide, and a monomer selected from a monomer having acidic side groups, a monomer having ester side groups and a mixture thereof.

In another aspect, there is provided a printed photovoltaic cell. The printed photovoltaic cell may comprise:

an anode;

a cathode; and a liquid electrophotographically printed photovoltaic layer disposed between the anode and the cathode;

wherein the photovoltaic layer comprises a thermoplastic resin, a material with a perovskite structure and conductive particles;

wherein the material with a perovskite structure has a chemical formula selected from $ABX_3$ and $A_2BX_6$;

wherein A is a cation, B is a cation and X is an anion; and wherein the thermoplastic resin comprises:

a copolymer of an alkylene monomer and a monomer having acidic side groups; and/or a copolymer of an alkylene monomer and an ethylenically unsaturated monomer comprising an epoxide; and/or a copolymer of an alkylene monomer, an ethylenically unsaturated monomer comprising an epoxide, and a monomer selected from a monomer having acidic side groups, a monomer having ester side groups and a mixture thereof.

In another aspect, there is provided a method of producing a printed photovoltaic cell. The method of producing the printed photovoltaic cell may comprise:

printing a liquid electrophotographic photovoltaic ink composition onto a substrate comprising an anode to form a liquid electrophotographically printed photovoltaic layer; and applying a composition to form a cathode;

wherein the printed photovoltaic layer is disposed between the anode and the printed cathode;

wherein the photovoltaic ink composition comprises a dispersion of a material with a perovskite structure, a thermoplastic resin and conductive particles in a carrier liquid;

wherein the material with a perovskite structure has a chemical formula selected from $ABX_3$ and $A_2BX_6$;

wherein A is a cation, B is a cation and X is an anion;

wherein the thermoplastic resin comprises:

a copolymer of an alkylene monomer and a monomer having acidic side groups; and/or a copolymer of an alkylene monomer and an ethylenically unsaturated monomer comprising an epoxide; and/or a copolymer of an alkylene monomer, an ethylenically unsaturated monomer comprising an epoxide, and a monomer selected from a monomer having acidic side groups, a monomer having ester side groups and a mixture thereof.

Also described herein is an ink set for producing a photovoltaic cell. The ink set may comprise:
an electrically conductive LEP ink composition comprising:
a liquid carrier; and
particles comprising a thermoplastic resin and electrically conductive metal particles; and
a LEP photovoltaic ink composition comprising:
a dispersion of a material with a perovskite structure, a thermoplastic resin and conductive particles in a carrier liquid;
wherein the material with a perovskite structure has a chemical formula selected from $ABX_3$ and $A_2BX_6$;
wherein A is a cation, B is a cation and X is an anion; and wherein the thermoplastic resin comprises:
a copolymer of an alkylene monomer and a monomer having acidic side groups; and/or
a copolymer of an alkylene monomer and an ethylenically unsaturated monomer comprising an epoxide; and/or
a copolymer of an alkylene monomer, an ethylenically unsaturated monomer comprising an epoxide, and a monomer selected from a monomer having acidic side groups, a monomer having ester side groups and a mixture thereof.

Also described herein is a printed photovoltaic cell comprising:
an anode;
a liquid electrophotographically printed cathode; and
a liquid electrophotographically printed photovoltaic layer disposed between the anode and the cathode;
wherein the photovoltaic layer comprises a thermoplastic resin and a material with a perovskite structure;
wherein the material with a perovskite structure has a chemical formula selected from $ABX_3$ and $A_2BX_6$;
wherein A is a cation, B is a cation and X is an anion; and
wherein the thermoplastic resin comprises:
a copolymer of an alkylene monomer and a monomer having acidic side groups; and/or
a copolymer of an alkylene monomer and an ethylenically unsaturated monomer comprising an epoxide; and/or
a copolymer of an alkylene monomer, an ethylenically unsaturated monomer comprising an epoxide, and a monomer selected from a monomer having acidic side groups, a monomer having ester side groups and a mixture thereof; and
wherein the printed cathode comprises:
a thermoplastic resin; and
electrically conductive metal particles.

Also described herein is a method of producing a printed photovoltaic cell comprising: printing a liquid electrophotographic photovoltaic ink composition onto a substrate comprising an anode to form a liquid electrophotographically printed photovoltaic layer; and
printing an electrically conductive liquid electrophotographic ink composition to form a liquid electrophotographically printed cathode;
wherein the printed photovoltaic layer is disposed between the anode and the printed cathode;
wherein the photovoltaic ink composition comprises a dispersion of a material with a perovskite structure and a thermoplastic resin in a carrier liquid;
wherein the material with a perovskite structure has a chemical formula selected from $ABX_3$ and $A_2BX_6$;
wherein A is a cation, B is a cation and X is an anion;
wherein the thermoplastic resin comprises:
a copolymer of an alkylene monomer and a monomer having acidic side groups; and/or
a copolymer of an alkylene monomer and an ethylenically unsaturated monomer comprising an epoxide; and/or
a copolymer of an alkylene monomer, an ethylenically unsaturated monomer comprising an epoxide, and a monomer selected from a monomer having acidic side groups, a monomer having ester side groups and a mixture thereof; and
wherein the electrically conductive ink composition comprises:
a liquid carrier; and
particles comprising a thermoplastic resin and electrically conductive metal particles.

Also describe herein is an ink set for producing a photovoltaic cell. The ink set for producing a photovoltaic cell may comprise:
an electrically conductive liquid electrophotographic ink composition comprising:
a liquid carrier; and
particles comprising a thermoplastic resin and electrically conductive metal particles; and
a liquid electrophotographic photovoltaic ink composition comprising:
a dispersion of a material with a perovskite structure and a thermoplastic resin in a carrier liquid;
wherein the material with a perovskite structure has a chemical formula selected from $ABX_3$ and $A_2BX_6$;
wherein A is a cation, B is a cation and X is an anion; and
wherein the thermoplastic resin comprises:
a copolymer of an alkylene monomer and a monomer having acidic side groups; and/or
a copolymer of an alkylene monomer and an ethylenically unsaturated monomer comprising an epoxide; and/or
a copolymer of an alkylene monomer, an ethylenically unsaturated monomer comprising an epoxide, and a monomer selected from a monomer having acidic side groups, a monomer having ester side groups and a mixture thereof.

Significant research into perovskite based solar cells (PSCs) is currently ongoing as this type of solar cell may provide comparable performance to silicon based solar cells, at a much lower cost. However, current perovskite based solar cells have a high sensitivity to humidity and oxygen, and are produced by processes that involve harmful solvents such as DMF and DMSO. Moreover, perovskite crystals produced by deposition from these solvents results in defects in the crystal structure.

Perovskite based solar cells generally include a gold or silver layer as the cathode that is deposited by sputtering methods. This approximately 100 nm thick layer is easily damaged by mechanical impact and requires the use of precious metals, which have relatively low abundance and thus high cost.

Examples of the photovoltaic cells, methods and compositions described herein have been found to avoid or at least mitigate at least one of these difficulties. It has been found that photovoltaic cells comprising a material with a perovskite structure can be produced by liquid electrophotographic printing of both the photovoltaic layer and the cathode. This process provides a simple method of producing stable photovoltaic cells containing material with a perovskite structure, without requiring the use of harmful solvents or producing crystal defects. Moreover, LEP printing of the cathode results in a more durable and flexible cathode.

Furthermore, it has also been found that the inclusion of conductive particles in the LEP photovoltaic ink composition increases the efficiency of the printed photovoltaic cell. Indeed, the inclusion of less than 1 wt. % single walled carbon nanotubes in the LEP photovoltaic ink composition provided an improvement in cell efficiency of four orders of magnitude.

Inks and Ink Sets

In an aspect, there is provided a liquid electrophotographic photovoltaic ink composition. There is also provided an ink set for producing a photovoltaic cell. The ink set for producing a photovoltaic cell may comprise an electrically conductive liquid electrophotographic ink composition and a liquid electrophotographic photovoltaic ink composition. In some examples, the ink set may further comprise an electron transport composition.

In some examples, the LEP photovoltaic ink composition comprises a dispersion of a material with a perovskite structure, a thermoplastic resin and, optionally, conductive particles in a carrier liquid. The liquid electrophotographic photovoltaic ink composition may comprise a dispersion of a material with a perovskite structure, a thermoplastic resin and, optionally, conductive particles in a carrier liquid; wherein the material with a perovskite structure has a chemical formula selected from $ABX_3$ and $A_2BX_6$; wherein A is a cation, B is a cation and X is an anion; and wherein the thermoplastic resin comprises: a copolymer of an alkylene monomer and a monomer having acidic side groups; and/or a copolymer of an alkylene monomer and an ethylenically unsaturated monomer comprising an epoxide; and/or a copolymer of an alkylene monomer, an ethylenically unsaturated monomer comprising an epoxide, and a monomer selected from a monomer having acidic side groups, a monomer having ester side groups and a mixture thereof.

In some examples, the ink set for producing a photovoltaic cell comprises an electrically conductive liquid electrophotographic ink composition comprising: a liquid carrier; and particles comprising a thermoplastic resin and electrically conductive metal particles; and a liquid electrophotographic photovoltaic ink composition comprising: a dispersion of a material with a perovskite structure and a thermoplastic resin in a carrier liquid; wherein the material with a perovskite structure has a chemical formula selected from $ABX_3$ and $A_2BX_6$; wherein A is a cation, B is a cation and X is an anion; and wherein the thermoplastic resin comprises a copolymer of an alkylene monomer and a monomer having acidic side groups; and/or a copolymer of an alkylene monomer and an ethylenically unsaturated monomer comprising an epoxide; and/or a copolymer of an alkylene monomer, an ethylenically unsaturated monomer comprising an epoxide, and a monomer selected from a monomer having acidic side groups, a monomer having ester side groups and a mixture thereof.

In some examples, the ink set for producing a photovoltaic cell comprises an electrically conductive liquid electrophotographic ink composition comprising: a liquid carrier; and particles comprising a thermoplastic resin and electrically conductive metal particles; and a liquid electrophotographic photovoltaic ink composition comprising: a dispersion of a material with a perovskite structure, a thermoplastic resin and conductive particles in a carrier liquid; wherein the material with a perovskite structure has a chemical formula selected from $ABX_3$ and $A_2BX_6$; wherein A is a cation, B is a cation and X is an anion; and wherein the thermoplastic resin comprises a copolymer of an alkylene monomer and a monomer having acidic side groups; and/or a copolymer of an alkylene monomer and an ethylenically unsaturated monomer comprising an epoxide; and/or a copolymer of an alkylene monomer, an ethylenically unsaturated monomer comprising an epoxide, and a monomer selected from a monomer having acidic side groups, a monomer having ester side groups and a mixture thereof.

In some examples, the ink set for producing a photovoltaic cell comprises an electrically conductive liquid electrophotographic ink composition comprising: a liquid carrier; and particles comprising a thermoplastic resin and electrically conductive metal particles; and a liquid electrophotographic photovoltaic ink composition comprising: a dispersion of a material with a perovskite structure and a thermoplastic resin in a carrier liquid; wherein the material with a perovskite structure has a chemical formula selected from $ABX_3$ and $A_2BX_6$; wherein A is a cation, B is a cation and X is an anion; and wherein the thermoplastic resin comprises a copolymer of an alkylene monomer and an ethylenically unsaturated monomer comprising an epoxide.

In some examples, the ink set for producing a photovoltaic cell comprises an electrically conductive liquid electrophotographic ink composition comprising: a liquid carrier; and particles comprising a thermoplastic resin and electrically conductive metal particles; and a liquid electrophotographic photovoltaic ink composition comprising: a dispersion of a material with a perovskite structure, a thermoplastic resin and conductive particles in a carrier liquid; wherein the material with a perovskite structure has a chemical formula selected from $ABX_3$ and $A_2BX_6$; wherein A is a cation, B is a cation and X is an anion; and wherein the thermoplastic resin comprises a copolymer of an alkylene monomer and an ethylenically unsaturated monomer comprising an epoxide.

In some examples, the electrically conductive liquid electrophotographic ink composition comprises a liquid carrier; and particles comprising a thermoplastic resin and electrically conductive metal particles.

In some examples, the liquid electrophotographic photovoltaic ink composition comprises a dispersion of a material with a perovskite structure and a thermoplastic resin in a carrier liquid. In some examples, the liquid electrophotographic photovoltaic ink composition comprises a dispersion of a material with a perovskite structure, a thermoplastic resin and conductive particles in a carrier liquid. In some examples, the liquid electrophotographic photovoltaic ink composition comprises a dispersion of a material with a perovskite structure, a thermoplastic resin and optionally conductive particles in a carrier liquid; wherein the material with a perovskite structure has a chemical formula selected from $ABX_3$ and $A_2BX_6$; wherein A is a cation, B is a cation and X is an anion; and wherein the thermoplastic resin comprises a copolymer of an alkylene monomer and a monomer having acidic side groups; and/or a copolymer of an alkylene monomer and an ethylenically unsaturated monomer comprising an epoxide; and/or a copolymer of an alkylene monomer, an ethylenically unsaturated monomer comprising an epoxide, and a monomer selected from a monomer having acidic side groups, a monomer having ester side groups and a mixture thereof.

The thermoplastic resin of the liquid electrophotographic photovoltaic ink composition may be referred to herein as the PV thermoplastic resin to distinguish it from the thermoplastic resin of the electrically conductive liquid electrophotographic ink composition, which may be referred to herein as the EC thermoplastic resin.

Electrically Conductive Liquid Electrophotographic Ink Composition

In some examples, the electrically conductive liquid electrophotographic (LEP) ink composition comprises a liquid carrier; and particles comprising a thermoplastic resin and electrically conductive metal particles. In some examples, the electrically conductive liquid electrophotographic (LEP) ink composition comprises a liquid carrier; a thermoplastic resin and electrically conductive metal particles.

In some examples, the electrically conductive LEP ink composition further comprises a charge adjuvant. In some examples, the electrically conductive liquid electrophotographic (LEP) ink composition comprises a liquid carrier; a charge adjuvant; and particles comprising a thermoplastic resin and electrically conductive metal particles.

In some examples, the electrically conductive LEP ink composition further comprises a charge director. In some examples, the electrically conductive liquid electrophotographic (LEP) ink composition comprises a liquid carrier; a charge director; and particles comprising a thermoplastic resin and electrically conductive metal particles. In some examples, the electrically conductive liquid electrophotographic (LEP) ink composition comprises a liquid carrier; a charge adjuvant; a charge director; and particles comprising a thermoplastic resin and electrically conductive metal particles.

As used herein, the phrase "electrically conductive liquid electrophotographic ink composition" may refer to a liquid electrophotographic ink composition that, once printed, produces an electrically conductive printed layer, for example, a printed layer that may function as a cathode. In some examples, the electrically conductive liquid electrophotographic ink composition itself may not be electrically conductive.

Liquid Carrier

During printing, the electrically conductive LEP ink composition may comprise a liquid carrier. Generally, the liquid carrier can act as a dispersing medium for the other components in the electrically conductive LEP ink composition. For example, the liquid carrier can comprise or be a hydrocarbon, silicone oil, vegetable oil, and so forth.

The carrier liquid/liquid carrier can include, but is not limited to, an insulating, non-polar, non-aqueous liquid that can be used as a medium for toner particles. The carrier liquid can include compounds that have a resistivity in excess of about $10^9$ ohm·cm. The carrier liquid may have a dielectric constant below about 5, in some examples below about 3. The carrier liquid can include, but is not limited to, hydrocarbons. The hydrocarbon can include, but is not limited to, an aliphatic hydrocarbon, an isomerized aliphatic hydrocarbon, branched chain aliphatic hydrocarbons, aromatic hydrocarbons, and combinations thereof. Examples of the carrier liquids include, but are not limited to, aliphatic hydrocarbons, isoparaffinic compounds, paraffinic compounds, dearomatized hydrocarbon compounds, and the like.

In some examples, the carrier liquid may be a hydrocarbon. In some examples, the carrier liquid may be a branched chain hydrocarbon. In some examples, the branched chain hydrocarbon may comprise 5 to 15 carbon atoms, for example, 10 to 15 carbon atoms, or 11 to 12 carbon atoms. In some examples, the carrier liquid may be selected from liquids comprising a mixture of branched chain hydrocarbons having 5 to 15 carbon atoms, for example, 10 to 15 carbon atoms or 11 to 12 carbon atoms.

In particular, the liquid carriers can include, but are not limited to, Isopar-G™, Isopar-H™, Isopar-L™, Isopar-M™, Isopar-K™, Isopar-V™, Norpar 12™, Norpar 13™, Norpar 15™, Exxol D40™, Exxol D80™, Exxol D100™, Exxol D130™, and Exxol D140™ (each sold by EXXON CORPORATION); Teclen N-16™, Teclen N-20™, Teclen N-22™, Nisseki Naphthesol L™, Nisseki Naphthesol M™, Nisseki Naphthesol H™, #0 Solvent L™, #0 Solvent M™, #0 Solvent H™, Nisseki Isosol 300™, Nisseki Isosol 400™, AF-4™, AF-5™, AF-6™ and AF-7™ (each sold by NIPPON OIL CORPORATION); IP Solvent 1620™ and IP Solvent 2028™ (each sold by IDEMITSU PETROCHEMICAL CO., LTD.); Amsco OMS™ and Amsco 460™ (each sold by AMERICAN MINERAL SPIRITS CORP.); and Electron, Positron, New II, Purogen HF (100% synthetic terpenes) (sold by ECOLINK™).

Before liquid electrophotographic printing, the carrier liquid can constitute about 20% to 99.5% by weight of the electrically conductive liquid electrostatic ink composition, in some examples 50% to 99.5% by weight of the electrically conductive liquid electrostatic ink composition. Before printing, the carrier liquid may constitute about 40% to 90% by weight of the electrically conductive liquid electrostatic ink composition. Before printing, the carrier liquid may constitute about 60% to 80% by weight of the electrically conductive liquid electrostatic ink composition. Before printing, the liquid carrier may constitute about 90% to 99.5% by weight of the electrically conductive liquid electrostatic ink composition, in some examples 95% to 99% by weight of the electrically conductive liquid electrostatic ink composition.

The electrically conductive liquid electrostatic ink composition, once electrostatically printed on the substrate, may be substantially free from liquid carrier. In an electrostatic printing process and/or afterwards, the liquid carrier may be removed, for example, by an electrophoresis processes during printing and/or evaporation, such that substantially just solids are transferred to the substrate. Substantially free from liquid carrier may indicate that electrically conductive liquid electrostatically printed ink (i.e., the liquid electrophotographically printed cathode) contains less than 5 wt. % liquid carrier, in some examples, less than 2 wt. % liquid carrier, in some examples less than 1 wt. % liquid carrier, in some examples less than 0.5 wt. % liquid carrier. In some examples, electrically conductive liquid electrostatically printed ink is free from liquid carrier.

Particles Comprising a Thermoplastic Resin and Electrically Conductive Metal Particles The electrically conductive LEP ink composition may comprise particles comprising a thermoplastic resin and electrically conductive metal particles. The electrically conducive LEP ink composition may comprise a thermoplastic resin and electrically conductive metal particles. In some examples, the thermoplastic resin of the electrically conductive LEP ink composition may be referred to herein as the EC thermoplastic resin.

In some examples, the electrically conductive metal particles may constitute at least about 75 wt. % of the solids of the electrically conductive LEP ink composition, for example, at least about 80 wt. %, at least about 81 wt. %, at least about 82 wt. %, at least about 83 wt. %, at least about 84 wt. %, at least about 85 wt. %, at least about 86 wt. %, at least about 87 wt. %, at least about 88 wt. %, at least about 89 wt. %, at least about 90 wt. %, at least about 91 wt. %, at least about 92 wt. %, at least about 93 wt. %, at least about 94 wt. %, at least about 95 wt. %, at least about 96 wt. %, or at least about 97 wt. % of the solids of the electrically conductive LEP ink composition. In some examples, the electrically conductive metal particles may constitute up to about 97 wt. % of the solids of the electrically conductive LEP ink composition, for example, up to about 96 wt. %, up to about 95 wt. %, up to about 94 wt. %, up to about 93 wt. %, up to about 92 wt. %, up to about 91 wt. %, or up to about 90 wt. % up to about 96 wt. %, up to about 95 wt. %, up to about 94 wt. %, up to about 93 wt. %, up to about 92 wt. %, up to about 91 wt. %, or up to about 90 wt. % up to about 89 wt. %, up to about 88 wt. %, up to about 87 wt. %, up to about 86 wt. %, up to about 85 wt. %, up to about 84 wt. %, up to about 83 wt. %, up to about 82 wt. %, up to about 81 wt. %, up to about 80 wt. %, or up to about 75 wt. % of the solids of the electrically conductive LEP ink composition. In some examples, the electrically conductive metal particles may constitute from about 75 wt. % to about 97 wt. % of the solids of the electrically conductive LEP ink composition, for example, from about 80 wt. % to about 96 wt. %, from about 81 wt. % to about 95 wt. %, from about 82 wt. % to about 94 wt. %, from about 83 wt. % to about 93 wt. %, from about 84 wt. % to about 92 wt. %, from about 85 wt. % to about 91 wt. %, from about 86 wt. % to about 90 wt. %, from about 87 wt. % to about 89 wt. %, or from about 87 wt. % to about 88 wt. % of the solids of the electrically conductive LEP ink composition.

In some examples, the EC thermoplastic resin constitutes up to about 25 wt. % of the electrically conductive LEP ink composition, for example, up to about 20 wt. %, up to about 21 wt. %, up to about 20 wt. %, up to about 19 wt. %, up to about 18 wt. %, up to about 17 wt. %, up to about 16 wt. %, up to about 15 wt. %, up to about 14 wt. %, up to about 13 wt. %, up to about 12 wt. %, up to about 11 wt. %, up to about 10 wt. %, up to about 9 wt. %, up to about 8 wt. %, up to about 7 wt. %, up to about 6 wt. %, up to about 5 wt. %, up to about 4 wt. %, or up to about 3 wt. % of the solids of the electrically conductive LEP ink composition. In some examples, the EC thermoplastic resin constitutes at least about 3 wt. % of the solids of the electrically conductive LEP ink composition, for example, at least about 4 wt. %, at least about 5 wt. %, at least about 6 wt. %, at least about 7 wt. %, at least about 8 wt. %, at least about 9 wt. %, at least about 10 wt. %, at least about 11 wt. %, at least about 12 wt. %, at least about 13 wt. %, at least about 14 wt. %, at least about 15 wt. %, at least about 16 wt. %, at least about 17 wt. %, at least about 18 wt. %, at least about 19 wt. %, at least about 20 wt. %, or at least about 25 wt. %. In some examples, the EC thermoplastic resin constitutes from about 3 wt. % to about 25 wt. % of the solids of the electrically conductive LEP ink composition, for example, from about 4 wt. % to about 20 wt. %, from about 5 wt. % to about 19 wt. %, from about 6 wt. % to about 18 wt. %, from about 7 wt. % to about 17 wt. %, from about 8 wt. % to about 16 wt. %, from about 9 wt. % to about 15 wt. %, from about 10 wt. % to about 14 wt. %, from about 11 wt. % to about 13 wt. %, or from about 11 wt. % to about 12 wt. % of the solids of the electrically conductive LEP ink composition. In an example, the EC thermoplastic resin constitutes about 5 to 90%, in some examples about 5 to 80% by weight of the total solids of the electrostatic ink composition. In another example, the resin constitutes about 10 to 60% by weight of the total solids of the electrostatic ink composition. In another example, the resin constitutes about 15 to 40% by weight of the total solids of the electrostatic ink composition. In another example, the resin constitutes about 60 to 95% by weight, in some examples, from 65 to 90% by weight, from 65 to 80% by weight of the total solids of the electrostatic ink composition.

Electrically Conductive Metal Particles

In some examples, the electrically conductive metal particles may comprise any metal. In some examples, the electrically conductive metal particles may comprise a metal selected from copper, titanium, chromium, iron, manganese, nickel, silver, gold, platinum, rhodium, iridium, and combinations thereof.

In some examples, the electrically conductive metal particles comprise a first metal and a second metal, wherein the first metal is different from the second metal. In some examples, the electrically conductive metal particles comprise a core comprising a first metal and a shell comprising a second metal; wherein the shell at least partially encloses the core and wherein the first metal is different from the second metal.

In some examples, the shell may substantially completely enclose the core. In some examples, the shell may completely encloses the core. In some examples, the shell can enclose at least about 90% of the core surface area, for example, at about least 91% of the core surface area, at least about 92% of the core surface area, at least about 93% of the core surface area, at least about 94% of the core surface area, at least about 95% of the core surface area, at least about 96% of the core surface area, at least about 97% of the core surface area, at least about 98% of the core surface area, at least about 99% of the core surface area, about 100% of the core surface area. In some examples, the proportion of the core surface area enclosed by the shell may be measured using standard procedures known in the art, such as energy dispersive spectroscopy, for example, by using the procedure described in ASTM E1508-12a(2019).

In some examples, the shell thickness can be from about 0.01 μm to about 10 μm, for example, from about 0.1 μm to about 3 μm, from about 0.2 μm to about 2 μm, from about 0.3 μm to about 1 μm, from about 0.4 μm to about 0.9 μm, from about 0.5 μm to about 0.8 μm, from about 0.6 μm to about 0.7 μm, or the shell thickness can be from about 0.01 μm to about 0.1 μm. In some examples, the shell thickness can be less than about 2 μm, for example, less than about 1 μm, less than about 0.1 μm. The shell thickness may be measured by SEM imaging. In some examples, the shell thickness may be measured by scanning electron microscopy, for example, by using the procedure described in ASTM E2142-08(2015)

In some examples, the metal particles can have a diameter of from about 1 μm to about 20 μm, for example, from about 1 μm to about 10 μm, from about 1 μm to about 9 μm, from about 1 μm to about 8 μm, from about 1 μm to about 7 μm, about 1 μm to about 6 μm, about 1 μm to about 5 μm. In some examples, the metal particles can have a diameter of less than about 20 μm, for example, less than about 15 μm, less than about 12 μm, less than about 10 μm, less than about 9 μm, less than about 8 μm, less than about 7 μm, less than about 6 μm, or less than about 5 μm. In some examples, the diameter of the metal particles may be determined by scanning electron microscopy, for example, by using the procedure described in ASTM E2142-08(2015).

In some examples, the metal particles have a particle size distribution such that the D50 is 4 μm or less, for example, 3.9 μm or less, 3.8 μm or less, 3.7 μm or less, 3.6 μm or less, 3.5 μm or less, 3.4 μm or less, 3.3 μm or less, 3.2 μm or less, 3.1 μm or less, 3 μm or less, 2.9 μm or less, 2.8 μm or less, 2.7 μm or less, 2.6 μm or less, 2.5 μm or less, 2.4 μm or less, 2.3 μm or less, 2.2 μm or less, 2.1 μm or less, 2 μm or less, 1.9 μm or less, 1.8 μm or less, 1.7 μm or less, 1.6 μm or less, 1.5 μm or less, 1.4 μm or less, 1.3 μm or less, 1.2 μm or less, 1.1 μm or less, or 1 μm or less. In some examples, the metal particles have a particle size distribution such that the D50 is 1 μm or more, for example, 1.1 μm or more, 1.2 μm or more, 1.3 μm or more, 1.4 μm or more, 1.5 μm or more, 1.6 μm or more, 1.7 μm or more, 1.8 μm or more, 1.9 μm or more, 2 μm or more, 2.1 μm or more, 2.2 μm or more, 2.3 μm or more, 2.4 μm or more, 2.5 μm or more, 2.6 μm or more, 2.7 μm or more, 2.8 μm or more, 2.9 μm or more, 3 μm or more, 3.1 μm or more, 3.2 μm or more, 3.3 μm or more, 3.4 μm or more, 3.5 μm or more, 3.6 μm or more, 3.7 μm or more, 3.8 μm or more, 3.9 μm or more, or 4 μm or more. In some examples, the metal particles have a particle size distribution such that the D50 is from 1 μm to 4 μm, for example, 1.1 μm to 4 μm, 1.2 μm to 3.9 μm, 1.3 μm to 3.8 μm, 1.4 μm to 3.7 μm, 1.5 μm to 3.6 μm, 1.6 μm to 3.5 μm, 1.7 μm to 3.4 μm, 1.8 μm to 3.3 μm, 1.9 μm to 3.2 μm, 2 μm to 3.1 μm, 2.1 μm to 3 μm, 2.2 μm to 2.9 μm, 2.3 μm to 2.8 μm, 2.4 μm to 2.7 μm, or 2.5 μm to 2.6 μm.

In some examples, the metal particles have a particle size distribution such that the D90 is 7 μm or less, for example, 6.9 μm or less, 6.8 μm or less, 6.7 μm or less, 6.6 μm or less, 6.5 μm or less, 6.4 μm or less, 6.3 μm or less, 6.2 μm or less, 6.1 μm or less, 6 μm or less, 5.9 μm or less, 5.8 μm or less, 5.7 μm or less, 5.6 μm or less, 5.5 μm or less, 5.4 μm or less, 5.3 μm or less, 5.2 μm or less, 5.1 μm or less, 5 μm or less, 4.9 μm or less, 4.8 μm or less, 4.7 μm or less, or 4.6 μm or less, or 4.5 μm or less. In some examples, the metal particles have a particle size distribution such that the D90 is 4.5 μm or more, for example, 4.6 μm or more, 4.7 μm or more, 4.8 μm or more, 4.9 μm or more, 5 μm or more, 5.1 μm or more, 5.2 μm or more, 5.3 μm or more, 5.4 μm or more, 5.5 μm or more, 5.6 μm or more, 5.7 μm or more, 5.8 μm or more, 5.9 μm or more, 6 μm or more, 6.1 μm or more, 6.2 μm or more, 6.3 μm or more, 6.4 μm or more, 6.5 μm or more, 6.6 μm or more, 6.7 μm or more, 6.8 μm or more, or 6.9 μm or more, or 7 μm or more. In some examples, the metal particles have a particle size distribution such that the D90 is 4.5 μm to 7 μm, for example, 4.6 μm to 7 μm, 4.7 μm to 6.9 μm, 4.8 μm to 6.8 μm, 4.9 μm to 6.7 μm, 5 μm to 6.6 μm, 5.1 μm to 6.5 μm, 5.2 μm to 6.4 μm, 5.3 μm to 6.3 μm, 5.4 μm to 6.2 μm, 5.5 μm to 6.1 μm, 5.6 μm to 6 μm, 5.7 μm to 5.9 μm, or 5.8 μm to 5.9 μm.

In some examples, the metal particles have a particle size distribution such that the D10 is 2.5 μm or less, for example, 2.4 μm or less, 2.3 μm or less, 2.2 μm or less, 2.1 μm or less, 2 μm or less, 1.9 μm or less, 1.8 μm or less, 1.7 μm or less, 1.6 μm or less, 1.5 μm or less, 1.4 μm or less, 1.3 μm or less, 1.2 μm or less, 1.1 μm or less, 1 μm or less, 0.9 μm or less, 0.8 μm or less, 0.7 μm or less, or 0.6 μm or less, or 0.5 μm or less. In some examples, the metal particles have a particle size distribution such that the D10 is 0.5 μm or more, 0.6 μm or more, 0.7 μm or more, 0.8 μm or more, 0.9 μm or more, 1 μm or more, 1.1 μm or more, 1.2 μm or more, 1.3 μm or more, 1.4 μm or more, 1.5 μm or more, 1.6 μm or more, 1.7 μm or more, 1.8 μm or more, 1.9 μm or more, 2 μm or more, 2.1 μm or more, 2.2 μm or more, 2.3 μm or more, or 2.4 μm or more. In some examples, the metal particles have a particle size distribution such that the D10 is from 0.5 μm to 2.5 μm, for example, 0.6 μm to 2.5 μm, 0.7 μm to 2.4 μm, 0.8 μm to 2.3 μm, 0.9 μm to 2.2 μm, 1 μm to 2.1 μm, 1.1 μm to 2 μm, 1.2 μm to 1.9 μm, 1.3 μm to 1.8 μm, 1.4 μm to 1.7 μm, or 1.5 μm to 1.6 μm.

In some examples, the particle size distribution is measured by laser diffraction, for example, by using a Honeywell X100 particle size analyser. In some examples, the particle size distribution is a volume based average particle size distribution.

In some examples, the first metal comprises a metal that oxidises in air (which may reduce the electrical conductivity of the first metal) and the second metal comprises a metal that does not oxidise in air. In some examples, the second metal comprises a metal that oxidises more slowly in air than the first metal.

In some examples, the first metal is selected from copper, titanium, chromium, iron, manganese, nickel, and combinations thereof. In some examples, the second metal is selected from silver, gold, platinum, rhodium, iridium, and combinations thereof. In some examples, the first metal is selected from copper, titanium, chromium, iron, manganese, nickel, and combinations thereof; and/or the second metal is selected from silver, gold, platinum, rhodium, iridium, and combinations thereof. In some examples, the first metal is copper and the second metal is silver or platinum. In some examples, the first metal is copper and the second metal is silver. In some examples, the metal particles are silver coated copper particles.

In some examples, the second metal constitutes at least about 10 wt. % of the total weight of the metal particles, for example, at least about 15 wt. %, at least about 20 wt. %, at least about 30 wt. %, at least about 35 wt. %, at least about 40 wt. % of the total weight of the metal particles; and optionally, the first metal constitutes the remaining weight of the metal particles. In some examples, the second metal constitutes up to about 50 wt. % of the total weight of the metal particles, for example, up to about 40 wt. % up to about 35 wt. %, up to about 30 wt. %, up to about 25 wt. %, up to about 20 wt. %, up to about 15 wt. %, up to about 10 wt. % of the total weight of the metal particles, and optionally, the first metal constitutes the remaining weight of the metal particles. In some examples, t second metal constitutes from about 10 wt. % to about 40 wt. % of the total weight of the metal particles, for example, 15 wt. % to about 35 wt. %, about 20 wt. % to about 30 wt. %, or about 15 wt. % to about 25 wt. % of the total weight of the metal particles; and optionally, the first metal constitutes the remaining weight of the metal particles.

In some examples, the metal particles may be commercially available, for example, AZS-315 or AGCu0204-12, available from Ames Goldsmith Corp.

EC Thermoplastic Resin

In some examples, the thermoplastic resin of the electrically conductive LEP ink composition (i.e., the EC thermoplastic resin) may comprise a thermoplastic polymer. The EC thermoplastic resin may be referred to herein as a resin. In some examples, the EC thermoplastic resin may comprise a polymer selected from ethylene acrylic acid copolymers; ethylene methacrylic acid copolymers; ethylene vinyl acetate copolymers; copolymers of ethylene (e.g. 80 wt. % to 99.9 wt. %), and alkyl (e.g. C1 to C5) ester of methacrylic or acrylic acid (e.g. 0.1 wt. % to 20 wt. %); copolymers of ethylene (e.g. 80 wt. % to 99.9 wt. %), acrylic or methacrylic acid (e.g. 0.1 wt. % to 20 wt. %) and alkyl (e.g. C1 to C5) ester of methacrylic or acrylic acid (e.g. 0.1 wt. % to 20 wt. %); polyethylene; polystyrene; isotactic polypropylene (crystalline); ethylene ethyl acrylate; polyesters; polyvinyl toluene; polyamides; styrene/butadiene copolymers; epoxy resins; acrylic resins (e.g. copolymer of acrylic or methacrylic acid and at least one alkyl ester of acrylic or methacrylic acid wherein alkyl is, in some examples, from 1 to about 20 carbon atoms, such as methyl methacrylate (e.g. 50 wt. % to 90 wt. %)/methacrylic acid (e.g. 0 wt. % to 20 wt. %)/ethylhexylacrylate (e.g. 10 wt. % to 50 wt. %)); ethylene-acrylate terpolymers: ethylene-acrylic esters-maleic anhydride (MAH) or glycidyl methacrylate (GMA) terpolymers; ethylene-acrylic acid ionomers and combinations thereof.

The EC thermoplastic resin may comprise a polymer having acidic side groups. The polymer having acidic side groups may have an acidity of 50 mg KOH/g or more, in some examples an acidity of 60 mg KOH/g or more, in some examples an acidity of 70 mg KOH/g or more, in some examples an acidity of 80 mg KOH/g or more, in some examples an acidity of 90 mg KOH/g or more, in some examples an acidity of 100 mg KOH/g or more, in some examples an acidity of 105 mg KOH/g or more, in some examples 110 mg KOH/g or more, in some examples 115 mg KOH/g or more. The polymer having acidic side groups may have an acidity of 200 mg KOH/g or less, in some examples 190 mg or less, in some examples 180 mg or less, in some examples 130 mg KOH/g or less, in some examples 120 mg KOH/g or less. Acidity of a polymer, as measured in mg KOH/g, can be measured using standard procedures known in the art, for example, using the procedure described in ASTM D1386.

The EC thermoplastic resin may comprise a polymer having acidic side groups that has a melt flow rate of less than about 60 g/10 minutes, in some examples about 50 g/10 minutes or less, in some examples about 40 g/10 minutes or less, in some examples 30 g/10 minutes or less, in some examples 20 g/10 minutes or less, in some examples 10 g/10 minutes or less. In some examples, all polymers having acidic side groups and/or ester groups in the particles each individually have a melt flow rate of less than 90 g/10 minutes, 80 g/10 minutes or less, in some examples 70 g/10 minutes or less, in some examples 60 g/10 minutes or less.

The polymer having acidic side groups can have a melt flow rate of about 10 g/10 minutes to about 120 g/10 minutes, in some examples about 10 g/10 minutes to about 70 g/10 minutes, in some examples about 10 g/10 minutes to 40 g/10 minutes, in some examples 20 g/10 minutes to 30 g/10 minutes. The polymer having acidic side groups can have a melt flow rate of in some examples about 50 g/10 minutes to about 120 g/10 minutes, in some examples 60 g/10 minutes to about 100 g/10 minutes. The melt flow rate can be measured using standard procedures known in the art, for example, as described in ASTM D1238.

The EC thermoplastic resin may comprise a copolymer of an alkylene monomer and a monomer having acidic side groups. In some examples, the alkylene monomer may be selected from ethylene and propylene. In some examples, the monomer having acidic side groups may be selected from methacrylic acid and acrylic acid. In some examples, the EC thermoplastic resin may comprise a copolymer of an alkylene monomer and a monomer selected from methacrylic acid and acrylic acid. In some examples, the EC thermoplastic resin may comprise a copolymer of ethylene and a monomer selected from methacrylic acid and acrylic acid.

In some examples, the polymer having acidic side groups is a copolymer of an alkylene monomer and a monomer selected from acrylic acid and methacrylic acid. In some examples, the EC thermoplastic resin may comprise a copolymer of an alkylene monomer and a monomer selected from acrylic acid and methacrylic acid.

The acidic side groups may be in free acid form or may be in the form of an anion and associated with one or more counterions, typically metal counterions, e.g. a metal selected from the alkali metals, such as lithium, sodium and potassium, alkali earth metals, such as magnesium or calcium, and transition metals, such as zinc. The polymer having acidic side groups can be selected from resins such as copolymers of ethylene and an ethylenically unsaturated acid of either acrylic acid or methacrylic acid; and ionomers thereof, such as methacrylic acid and ethylene-acrylic or methacrylic acid copolymers which are at least partially neutralized with metal ions (e.g. Zn, Na, Li) such as SURLYN® ionomers. The polymer comprising acidic side groups can be a copolymer of ethylene and an ethylenically unsaturated acid of either acrylic or methacrylic acid, where the ethylenically unsaturated acid of either acrylic or methacrylic acid constitute from 5 wt. % to about 25 wt. % of the copolymer, in some examples from 10 wt. % to about 20 wt. % of the copolymer.

The EC thermoplastic resin may comprise two different polymers having acidic side groups. The two polymers having acidic side groups may have different acidities, which may fall within the ranges mentioned above. The EC thermoplastic resin may comprise a first polymer having acidic side groups that has an acidity of from 50 mg KOH/g to 110 mg KOH/g and a second polymer having acidic side groups that has an acidity of 110 mg KOH/g to 130 mg KOH/g.

The resin may comprise two different polymers having acidic side groups: a first polymer having acidic side groups that has a melt flow rate of about 10 g/10 minutes to about 50 g/10 minutes and an acidity of from 50 mg KOH/g to 110 mg KOH/g, and a second polymer having acidic side groups that has a melt flow rate of about 50 g/10 minutes to about 120 g/10 minutes and an acidity of 110 mg KOH/g to 130 mg KOH/g. The first and second polymers may be absent of ester groups.

The resin may comprise a copolymer of ethylene and acrylic acid and a copolymer of ethylene and methacrylic acid.

The resin may comprise two different polymers having acidic side groups: a first polymer that is a copolymer of ethylene (e.g. 92 to 85 wt. %, in some examples about 89 wt. %) and acrylic or methacrylic acid (e.g. 8 to 15 wt. %, in some examples about 11 wt. %) having a melt flow rate of 80 to 110 g/10 minutes and a second polymer that is a copolymer of ethylene (e.g. about 80 to 92 wt. %, in some examples about 85 wt. %) and acrylic acid (e.g. about 18 to 12 wt. %, in some examples about 15 wt. %), having a melt viscosity lower than that of the first polymer, the second polymer for example having a melt viscosity of 15000 poise or less, in some examples a melt viscosity of 10000 poise or less, in some examples 1000 poise or less, in some examples 100 poise or less, in some examples 50 poise or less, in some examples 10 poise or less. Melt viscosity can be measured using standard techniques. The melt viscosity can be measured using a rheometer, e.g. a commercially available AR-2000 Rheometer from Thermal Analysis Instruments, using the geometry of: 25 mm steel plate-standard steel parallel plate, and finding the plate over plate rheometry isotherm at 120° C., 0.01 Hz shear rate.

In any of the resins mentioned above, the ratio of the first polymer having acidic side groups to the second polymer having acidic side groups can be from about 10:1 to about 2:1. In another example, the ratio can be from about 6:1 to about 3:1, in some examples about 4:1.

The resin may comprise a polymer having a melt viscosity of 15000 poise or less, in some examples a melt viscosity of 10000 poise or less, in some examples 1000 poise or less, in some examples 100 poise or less, in some examples 50 poise or less, in some examples 10 poise or less; said polymer may be a polymer having acidic side groups as described herein. The resin may comprise a first polymer having a melt viscosity of 15000 poise or more, in some examples 20000 poise or more, in some examples 50000 poise or more, in some examples 70000 poise or more; and in some examples, the resin may comprise a second polymer having a melt viscosity less than the first polymer, in some examples a melt viscosity of 15000 poise or less, in some examples a melt viscosity of 10000 poise or less, in some examples 1000 poise or less, in some examples 100 poise or less, in some examples 50 poise or less, in some examples 10 poise or less. The resin may comprise a first polymer having a melt viscosity of more than 60000 poise, in some examples from 60000 poise to 100000 poise, in some examples from 65000 poise to 85000 poise; a second polymer having a melt viscosity of from 15000 poise to 40000 poise, in some examples 20000 poise to 30000 poise, and a third polymer having a melt viscosity of 15000 poise or less, in some examples a melt viscosity of 10000 poise or less, in some examples 1000 poise or less, in some examples 100 poise or less, in some examples 50 poise or less, in some examples 10 poise or less; an example of the first polymer is Nucrel 960 (from DuPont), an example of the second polymer is Nucrel 699 (from DuPont), and an example of the third polymer is AC-5120 (from Honeywell). In some examples, the resin may comprise a first polymer having a melt viscosity of from 15000 poise to 40000 poise, in some examples 20000 poise to 30000 poise, and a second polymer having a melt viscosity of 15000 poise or less, in some examples a melt viscosity of 10000 poise or less, in some examples 1000 poise or less, in some examples 100 poise or less, in some examples 50 poise or less, in some examples 10 poise or less; an example of the first polymer is Nucrel 699 (from DuPont), and an example of the second polymer is AC-5120 (from Honeywell). The first, second and third polymers may be polymers having acidic side groups as described herein. The melt viscosity can be measured using a rheometer, e.g. a commercially available AR-2000 Rheometer from Thermal Analysis Instruments, using the geometry of: 25 mm steel plate-standard steel parallel plate, and finding the plate over plate rheometry isotherm at 120° C., 0.01 Hz shear rate.

If the resin comprises a single type of resin polymer, the resin polymer (excluding any other components of the electrostatic ink composition) may have a melt viscosity of 6000 poise or more, in some examples a melt viscosity of 8000 poise or more, in some examples a melt viscosity of 10000 poise or more, in some examples a melt viscosity of 12000 poise or more. If the resin comprises a plurality of polymers all the polymers of the resin may together form a mixture (excluding any other components of the electrostatic ink composition) that has a melt viscosity of 6000 poise or more, in some examples a melt viscosity of 8000 poise or more, in some examples a melt viscosity of 10000 poise or more, in some examples a melt viscosity of 12000 poise or more. Melt viscosity can be measured using standard techniques. The melt viscosity can be measured using a rheometer, e.g. a commercially available AR-2000 Rheometer from Thermal Analysis Instruments, using the geometry of: 25 mm steel plate-standard steel parallel plate, and finding the plate over plate rheometry isotherm at 120° C., 0.01 Hz shear rate.

The resin may comprise two different polymers having acidic side groups that are selected from copolymers of ethylene and an ethylenically unsaturated acid of either methacrylic acid or acrylic acid; and ionomers thereof, such as methacrylic acid and ethylene-acrylic or methacrylic acid copolymers which are at least partially neutralized with metal ions (e.g. Zn, Na, Li) such as SURLYN® ionomers.

The resin may comprise (i) a first polymer that is a copolymer of ethylene and an ethylenically unsaturated acid of either acrylic acid and methacrylic acid, wherein the ethylenically unsaturated acid of either acrylic or methacrylic acid constitutes from 8 wt. % to about 16 wt. % of the copolymer, in some examples 10 wt. % to 16 wt. % of the copolymer; and (ii) a second polymer that is a copolymer of ethylene and an ethylenically unsaturated acid of either acrylic acid and methacrylic acid, wherein the ethylenically unsaturated acid of either acrylic or methacrylic acid constitutes from 12 wt. % to about 30 wt. % of the copolymer, in some examples from 14 wt. % to about 20 wt. % of the copolymer, in some examples from 16 wt. % to about 20 wt. % of the copolymer in some examples from 17 wt. % to 19 wt. % of the copolymer.

The resin may comprise a polymer having acidic side groups, as described above (which may be free of ester side groups), and a polymer having ester side groups. The polymer having ester side groups is, in some examples, a thermoplastic polymer. The polymer having ester side groups may further comprise acidic side groups. The polymer having ester side groups may be a copolymer of a monomer having ester side groups and a monomer having acidic side groups. The polymer may be a copolymer of a monomer having ester side groups, a monomer having acidic side groups, and a monomer absent of any acidic and ester side groups. The monomer having ester side groups may be a monomer selected from esterified acrylic acid or esterified methacrylic acid. The monomer having acidic side groups may be a monomer selected from acrylic or methacrylic acid. The monomer absent of any acidic and ester side groups may be an alkylene monomer, including, but not limited to, ethylene or propylene. The esterified acrylic acid or esterified methacrylic acid may, respectively, be an alkyl ester of acrylic acid or an alkyl ester of methacrylic acid. The alkyl group in the alkyl ester of acrylic or methacrylic acid may be an alkyl group having 1 to 30 carbons, in some examples 1 to 20 carbons, in some examples 1 to 10 carbons; in some examples selected from methyl, ethyl, iso-propyl, n-propyl, t-butyl, iso-butyl, n-butyl and pentyl.

The polymer having ester side groups may be a copolymer of a first monomer having ester side groups, a second monomer having acidic side groups and a third monomer which is an alkylene monomer absent of any acidic and ester side groups. The polymer having ester side groups may be a copolymer of (i) a first monomer having ester side groups selected from esterified acrylic acid or esterified methacrylic acid, in some examples an alkyl ester of acrylic or methacrylic acid, (ii) a second monomer having acidic side groups selected from acrylic or methacrylic acid and (iii) a third monomer which is an alkylene monomer selected from ethylene and propylene. The first monomer may constitute 1 to 50% by weight of the copolymer, in some examples 5 to 40% by weight, in some examples 5 to 20% by weight of the copolymer, in some examples 5 to 15% by weight of the copolymer. The second monomer may constitute 1 to 50% by weight of the copolymer, in some examples 5 to 40% by weight of the copolymer, in some examples 5 to 20% by weight of the copolymer, in some examples 5 to 15% by weight of the copolymer. In an example, the first monomer constitutes 5 to 40% by weight of the copolymer, the second monomer constitutes 5 to 40% by weight of the copolymer, and with the third monomer constituting the remaining weight of the copolymer. In an example, the first monomer constitutes 5 to 15% by weight of the copolymer, the second monomer constitutes 5 to 15% by weight of the copolymer, with the third monomer constituting the remaining weight of the copolymer. In an example, the first monomer constitutes 8 to 12% by weight of the copolymer, the second monomer constitutes 8 to 12% by weight of the copolymer, with the third monomer constituting the remaining weight of the copolymer. In an example, the first monomer constitutes about 10% by weight of the copolymer, the second monomer constitutes about 10% by weight of the copolymer, and with the third monomer constituting the remaining weight of the copolymer. The polymer having ester side groups may be selected from the Bynel® class of monomer, including Bynel 2022 and Bynel 2002, which are available from DuPont®.

The polymer having ester side groups may constitute 1% or more by weight of the total amount of the resin polymers in the resin, e.g. the total amount of the polymer or polymers having acidic side groups and polymer having ester side groups. The polymer having ester side groups may constitute 5% or more by weight of the total amount of the resin polymers in the resin, in some examples 8% or more by weight of the total amount of the resin polymers in the resin, in some examples 10% or more by weight of the total amount of the resin polymers in the resin, in some examples 15% or more by weight of the total amount of the resin polymers in the resin, in some examples 20% or more by weight of the total amount of the resin polymers in the resin, in some examples 25% or more by weight of the total amount of the resin polymers in the resin, in some examples 30% or more by weight of the total amount of the resin polymers in the resin, in some examples 35% or more by weight of the total amount of the resin polymers in the resin. The polymer having ester side groups may constitute from 5% to 50% by weight of the total amount of the resin polymers in the resin, in some examples 10% to 40% by weight of the total amount of the resin polymers in the resin, in some examples 15% to 30% by weight of the total amount of the polymers in the resin.

The polymer having ester side groups may have an acidity of 50 mg KOH/g or more, in some examples an acidity of 60 mg KOH/g or more, in some examples an acidity of 70 mg KOH/g or more, in some examples an acidity of 80 mg KOH/g or more. The polymer having ester side groups may have an acidity of 100 mg KOH/g or less, in some examples 90 mg KOH/g or less. The polymer having ester side groups may have an acidity of 60 mg KOH/g to 90 mg KOH/g, in some examples 70 mg KOH/g to 80 mg KOH/g.

The polymer having ester side groups may have a melt flow rate of about 10 g/10 minutes to about 120 g/10 minutes, in some examples about 10 g/10 minutes to about 50 g/10 minutes, in some examples about 20 g/10 minutes to about 40 g/10 minutes, in some examples about 25 g/10 minutes to about 35 g/10 minutes.

In an example, the polymer or polymers of the resin can be selected from the Nucrel family of toners (e.g. Nucrel 403·, Nucrel 407™, Nucrel 609HS™, Nucrel 908HS™, Nucrel 1202HC™, Nucrel 30707™, Nucrel 1214™, Nucrel 903™, Nucrel 3990™, Nucrel 910™, Nucrel 925™, Nucrel 699™, Nucrel 599™, Nucrel 960™, Nucrel RX 76™, Nucrel 2806™, Bynell 2002, Bynell 2014, and Bynell 2020 (sold by E. I. du PONT)), the Aclyn family of toners (e.g. Aclyn 201, Aclyn 246, Aclyn 285, and Aclyn 295), AC-5120 and AC 580 (sold by Honeywell), and the Lotader family of toners (e.g. Lotader 2210, Lotader, 3430, and Lotader 8200 (sold by Arkema)).

Charge Director

In some examples, the electrically conductive LEP ink composition further includes a charge director. The charge director may be added in order to impart and/or maintain sufficient electrostatic charge on the ink particles, which may be particles comprising the EC thermoplastic resin and the electrically conductive metal particles. In some examples, the charge director may comprise ionic compounds, particularly metal salts of fatty acids, metal salts of sulfo-succinates, metal salts of oxyphosphates, metal salts of alkyl-benzenesulfonic acid, metal salts of aromatic carboxylic acids or sulfonic acids, as well as zwitterionic and non-ionic compounds, such as polyoxyethylated alkylamines, lecithin, polyvinylpyrrolidone, organic acid esters of polyvalent alcohols, etc. The charge director can be selected from, but is not limited to, oil-soluble petroleum sulfonates (e.g. neutral Calcium Petronate™, neutral Barium Petronate™, and basic Barium Petronate™), polybutylene succinimides (e.g. OLOA™ 1200 and Amoco 575), and glyceride salts (e.g. sodium salts of phosphated mono- and diglycerides with unsaturated and saturated acid substituents), sulfonic acid salts including, but not limited to, barium, sodium, calcium, and aluminum salts of sulfonic acid. The sulfonic acids may include, but are not limited to, alkyl sulfonic acids, aryl sulfonic acids, and sulfonic acids of alkyl succinates. The charge director can impart a negative charge or a positive charge on the resin-containing particles of a LEP ink composition.

In some examples, the liquid electrostatic ink composition comprises a charge director comprising a simple salt. The ions constructing the simple salts are all hydrophilic. The simple salt may include a cation selected from the group consisting of Mg, Ca, Ba, $NH_4$, tert-butyl ammonium, $Li^+$, and $Al^{3+}$, or from any sub-group thereof. The simple salt may include an anion selected from the group consisting of $SO_4^{2-}$, $PO_3^-$, $NO_3^-$, $HPO_4^{2-}$, $CO_3^{2-}$, acetate, trifluoroacetate (TFA), $Cl^-$, $BF_4^-F^-$, $ClO_4^-$, and $TiO_3^{4-}$ or from any sub-group thereof. The simple salt may be selected from $CaCO_3$, $Ba_2TiO_3$, $Al_2(SO_4)$, $Al(NO_3)_3$, $Ca_3(PO_4)_2$, $BaSO_4$, $BaHPO_4$, $Ba_2(PO_4)_3$, $CaSO_4$, $(NH_4)_2CO_3$, $(NH_4)_2SO_4$, $NH_4OAc$, tert-butyl ammonium bromide, $NH_4NO_3$, LiTFA, $Al_2(SO_4)_3$, $LiClO_4$ and $LiBF_4$, or any sub-group thereof.

In some examples, the electrostatic ink composition comprises a charge director comprising a sulfosuccinate salt of the general formula $MA_n$, wherein M is a metal, n is the valence of M, and A is an ion of the general formula (I): $[R^1—O—C(O)CH_2CH(SO_3-)—C(O)—O—R^2]$, wherein each of $R^1$ and $R^2$ is an alkyl group. In some examples each of $R^1$ and $R^2$ is an aliphatic alkyl group. In some examples, each of $R^1$ and $R^2$ independently is a C6-25 alkyl. In some examples, said aliphatic alkyl group is linear. In some examples, said aliphatic alkyl group is branched. In some examples, said aliphatic alkyl group includes a linear chain of more than 6 carbon atoms. In some examples, $R^1$ and $R^2$ are the same. In some examples, at least one of $R^1$ and $R^2$ is $C_{13}H_{27}$. In some examples, M is Na, K, Cs, Ca, or Ba.

In some examples, the charge director comprises at least one micelle forming salt and nanoparticles of a simple salt as described above. The simple salts are salts that do not form micelles by themselves, although they may form a core for micelles with a micelle forming salt. The sulfosuccinate salt of the general formula $MA_n$ is an example of a micelle forming salt. The charge director may be substantially free of an acid of the general formula HA, where A is as described above. The charge director may include micelles of said sulfosuccinate salt enclosing at least some of the nanoparticles of the simple salt. The charge director may include at least some nanoparticles of the simple salt having a size of 200 nm or less, and/or in some examples 2 nm or more.

The charge director may include one of, some of or all of (i) soya lecithin, (ii) a barium sulfonate salt, such as basic barium petronate (BBP), and (iii) an isopropyl amine sulfonate salt. Basic barium petronate is a barium sulfonate salt of a 21-26 carbon atom hydrocarbon alkyl, and can be obtained, for example, from Chemtura. An example isopropyl amine sulphonate salt is dodecyl benzene sulfonic acid isopropyl amine, which is available from Croda.

In some examples, the charge director constitutes about 0.001% to 20% by weight, in some examples 0.01% to 20% by weight, in some examples 0.01% to 10% by weight, in some examples 0.01% to 5% by weight of the total solids of a liquid electrostatic ink composition. In some examples, the charge director constitutes about 1% to 4% by weight of the total solids of the liquid electrostatic ink composition, in some examples 2% to 4% by weight of the total solids of the electrostatic ink composition.

In some examples, the charge director is present in an amount sufficient to achieve a particle conductivity of 500 pmho/cm or less, in some examples, 450 pmho/cm or less, in some examples, 400 pmho/cm or less, in some examples, 350 pmho/cm or less, in some examples, 300 pmho/cm or less, in some examples, 250 pmho/cm or less, in some examples, 200 pmho/cm or less, in some examples, 190 pmho/cm or less, in some examples, 180 pmho/cm or less, in some examples, 170 pmho/cm or less, in some examples, 160 pmho/cm or less, in some examples, 150 pmho/cm or less, in some examples, 140 pmho/cm or less, in some examples, 130 pmho/cm or less, in some examples, 120 pmho/cm or less, in some examples, 110 pmho/cm or less, in some examples, about 100 pmho/cm. In some examples, the charge director is present in an amount sufficient to achieve a particle conductivity of 50 pmho/cm or more, in some examples, 60 pmho/cm or more, in some examples, 70 pmho/cm or more, in some examples, 80 pmho/cm or more, in some examples, 90 pmho/cm or more, in some examples, about 100 pmho/cm, in some examples, 150 pmho/cm or more, in some examples, 200 pmho/cm or more, in some examples, 250 pmho/cm or more, in some examples, 300 pmho/cm or more, in some examples, 350 pmho/cm or more, in some examples, 400 pmho/cm or more, in some examples, 450 pmho/cm or more, in some examples, 500 pmho/cm or more. In some examples, the charge director is present in an amount sufficient to achieve a particle conductivity of 50 pmho/cm to 500 pmho/cm, in some examples, 60 pmho/cm to 450 pmho/cm, in some examples, 70 pmho/cm to 400 pmho/cm, in some examples, 80 pmho/cm to 350 pmho/cm, in some examples, 90 pmho/cm to 300 pmho/cm, in some examples, 100 pmho/cm to 250 pmho/cm, in some examples, 110 pmho/cm to 200 pmho/cm, in some examples, 120 pmho/cm to 500 pmho/cm, in some examples, 130 pmho/cm to 450 pmho/cm, in some examples, 140 pmho/cm to 400 pmho/cm, in some examples, 150 pmho/cm to 350 pmho/cm, in some examples, 160 pmho/cm to 300 pmho/cm.

In some examples, the charge director is present in an amount of from 3 mg/g to 50 mg/g, in some examples from 3 mg/g to 45 mg/g, in some examples from 10 mg/g to 40 mg/g, in some examples from 5 mg/g to 35 mg/g, in some examples, 20 mg/g to 35 mg/g, in some examples, 22 mg/g to 34 mg/g (where mg/g indicates mg per gram of solids of the liquid electrostatic ink composition).

Charge Adjuvant

In some examples, the electrically conductive LEP ink composition further includes a charge adjuvant. A charge adjuvant may promote charging of the particles when a charge director is present. The method as described herein may involve adding a charge adjuvant at any stage. The charge adjuvant can include, for example, barium petronate, calcium petronate, Co salts of naphthenic acid, Ca salts of naphthenic acid, Cu salts of naphthenic acid, Mn salts of naphthenic acid, Ni salts of naphthenic acid, Zn salts of naphthenic acid, Fe salts of naphthenic acid, Ba salts of stearic acid, Co salts of stearic acid, Pb salts of stearic acid, Zn salts of stearic acid, Al salts of stearic acid, Zn salts of stearic acid, Cu salts of stearic acid, Pb salts of stearic acid, Fe salts of stearic acid, metal carboxylates (e.g., Al tristearate, Al octanoate, Li heptanoate, Fe stearate, Fe distearate, Ba stearate, Cr stearate, Mg octanoate, Ca stearate, Fe naphthenate, Zn naphthenate, Mn heptanoate, Zn heptanoate, Ba octanoate, Al octanoate, Co octanoate, Mn octanoate, and Zn octanoate), Co lineolates, Mn lineolates, Pb lineolates, Zn lineolates, Ca oleates, Co oleates, Zn palmirate, Ca resinates, Co resinates, Mn resinates, Pb resinates, Zn resinates, AB diblock copolymers of 2-ethylhexyl methacrylate-co-methacrylic acid calcium and ammonium salts, copolymers of an alkyl acrylamidoglycolate alkyl ether (e.g., methyl acrylamide-glycolate methyl ether-co-vinyl acetate), or hydroxy bis(3,5-di-tert-butyl salicylic) aluminate monohydrate. In an example, the charge adjuvant is or includes aluminum di- or tristearate. In some examples, the charge adjuvant is VCA (aluminium stearate and aluminium palmitate, available from Sigma Aldrich).

The charge adjuvant may be present in an amount of about 0.001% to 5% by weight, in some examples about 0.1% to 1% by weight, in some examples about 0.3% to 0.8% by weight of the total solids of the liquid electrostatic ink composition, in some examples, about 1 wt. % to 5 wt. % of the total solids of the liquid electrostatic ink, in some examples about 1 wt. % to 3 wt. % of the total solids of the liquid electrostatic ink composition, in some examples about 1.5 wt. % to 2.5 wt. % of the total solids of the liquid electrostatic ink composition.

The charge adjuvant may be present in an amount of less than 5% by weight of total solids of the liquid electrostatic ink composition, in some examples in an amount of less than 4.5% by weight, in some examples in an amount of less than 4% by weight, in some examples in an amount of less than 3.5% by weight, in some examples in an amount of less than 3% by weight, in some examples in an amount of less than 2.5% by weight, in some examples, in an amount of less than 2% by weight of the total solids of the liquid electrostatic ink composition.

In some examples, the liquid electrostatic ink composition further includes, e.g. as a charge adjuvant, a salt of multivalent cation and a fatty acid anion. The salt of multivalent cation and a fatty acid anion can act as a charge adjuvant. The multivalent cation may, in some examples, be a divalent or a trivalent cation. In some examples, the multivalent cation is selected from Group 2, transition metals and Group 3 and Group 4 in the Periodic Table. In some examples, the multivalent cation includes a metal selected from Ca, Sc, Ti, V, Cr, Mn, Fe, Co, Ni, Cu, Zn, Al and Pb. In some examples, the multivalent cation is $Al^{3+}$. The fatty acid anion may be selected from a saturated or unsaturated fatty acid anion. The fatty acid anion may be selected from a C8 to C26 fatty acid anion, in some examples a C14 to C22 fatty acid anion, in some examples a C16 to C20 fatty acid anion, in some examples a C17, C18 or C19 fatty acid anion. In some examples, the fatty acid anion is selected from a caprylic acid anion, capric acid anion, lauric acid anion, myristic acid anion, palmitic acid anion, stearic acid anion, arachidic acid anion, behenic acid anion and cerotic acid anion.

In some examples, the charge adjuvant comprises, consists essentially of or consists of an aluminium stearate (e.g., aluminium tristearate), aluminium palmitate and combinations thereof. In some examples, the charge adjuvant comprises, consists essentially of or consists of aluminium tristearate and aluminium palmitate.

The charge adjuvant, which may, for example, be or include a salt of a multivalent cation and a fatty acid anion, may be present in an amount of 0.1 wt. % to 5 wt. % of the total solids of the liquid electrostatic ink composition, in some examples in an amount of 0.1 wt. % to 3 wt. % of the total solids of the liquid electrostatic ink composition, in some examples about 1 wt. % to 3 wt. % of the total solids of the liquid electrostatic ink composition, in some examples about 1.5 wt. % to 2.5 wt. % of the total solids of the liquid electrostatic ink composition.

Other Additives

The electrically conductive LEP ink composition may further include another additives or a plurality of other additives. The other additive or plurality of other additives may be added at any stage of the method. The other additive or plurality of other additives may be selected from a wax, a surfactant, viscosity modifiers, and compatibility additives. The wax may be an incompatible wax. As used herein, "incompatible wax" may refer to a wax that is incompatible with the resin. Specifically, the wax phase separates from the resin phase upon the cooling of the resin fused mixture on a substrate during and after the transfer of the ink film to the print substrate, e.g. from an intermediate transfer member, which may be a heated blanket. In some examples, the LEP ink composition comprises silica, which may be added, for example, to improve the durability of images produced using the LEP ink. The other additives may constitute 10 wt. % or less of the total solids of the electrostatic ink composition, in some examples, 5 wt. % or less of the total solids of the electrostatic ink composition, in some examples, 3 wt. % or less of the total solids of the electrostatic ink composition.

Liquid Electrophotographic Photovoltaic Ink Composition

The liquid electrophotographic photovoltaic ink composition may comprise a dispersion of a material with a perovskite structure and a thermoplastic resin in a carrier liquid. In some examples, the LEP photovoltaic ink composition further comprises conductive particles. The liquid electrophotographic photovoltaic ink composition may comprise a dispersion of a material with a perovskite structure, a thermoplastic resin and conductive particles in a carrier liquid. In some examples, the liquid electrophotographic photovoltaic ink composition comprises a dispersion of a material with a perovskite structure, a thermoplastic resin, and optionally, conductive particles, in a carrier liquid; wherein the material with a perovskite structure has a chemical formula selected from $ABX_3$ and $A_2BX_6$; wherein A is a cation, B is a cation and X is an anion; and wherein the thermoplastic resin comprises a copolymer of an alkylene monomer and a monomer having acidic side groups; and/or a copolymer of an alkylene monomer and an ethylenically unsaturated monomer comprising an epoxide; and/or a copolymer of an alkylene monomer, an ethylenically unsaturated monomer comprising an epoxide, and a monomer selected from a monomer having acidic side groups, a monomer having ester side groups and a mixture thereof. In some examples, the liquid electrophotographic photovoltaic ink composition comprises a dispersion of a material with a perovskite structure, a thermoplastic resin, and optionally, conductive particles, in a carrier liquid; wherein the material with a perovskite structure has a chemical formula selected from $ABX_3$ and $A_2BX_6$; wherein A is a cation, B is a cation and X is an anion; and wherein the thermoplastic resin comprises a copolymer of an alkylene monomer and an ethylenically unsaturated monomer comprising an epoxide.

In some examples, the liquid electrophotographic photovoltaic ink composition comprising a dispersion of a material with a perovskite structure, a thermoplastic resin, and optionally, conductive particles, in a carrier liquid may comprise a carrier liquid and chargeable particles comprising a material with a perovskite structure and a thermoplastic resin, and optionally, conductive particles.

In some examples, the liquid electrophotographic photovoltaic ink composition comprising a dispersion of a material with a perovskite structure and a thermoplastic resin in a carrier liquid may be producible by combining a liquid electrophotographic ink composition comprising a dispersion of a salt AX and a thermoplastic resin in a carrier liquid with a liquid electrophotographic ink composition comprising a dispersion of a salt $BX_2$ or a salt $BX_4$ and a thermoplastic resin in a carrier liquid. In some examples, the liquid electrophotographic photovoltaic ink composition comprising a dispersion of a material with a perovskite structure, a thermoplastic resin and conductive particles in a carrier liquid may be producible by combining a liquid electrophotographic ink composition comprising a dispersion of a salt AX and a thermoplastic resin in a carrier liquid with conductive particles and with a liquid electrophotographic ink composition comprising a dispersion of a salt $BX_2$ or a salt $BX_4$ and a thermoplastic resin in a carrier liquid. In some examples, the liquid electrophotographic photovoltaic ink composition comprising a dispersion of a material with a perovskite structure, a thermoplastic resin and conductive particles in a carrier liquid may be producible by combining a liquid electrophotographic ink composition comprising a dispersion of a salt AX, a thermoplastic resin and conductive particles in a carrier liquid with a liquid electrophotographic ink composition comprising a dispersion of a salt $BX_2$ or a salt $BX_4$ and a thermoplastic resin in a carrier liquid. In some examples, the liquid electrophotographic photovoltaic ink composition comprising a dispersion of a material with a perovskite structure, a thermoplastic resin and conductive particles in a carrier liquid may be producible by combining a liquid electrophotographic ink composition comprising a dispersion of a salt AX and a thermoplastic resin in a carrier liquid with a liquid electrophotographic ink composition comprising a dispersion of a salt $BX_2$ or a salt $BX_4$, a thermoplastic resin and conductive particles in a carrier liquid.

In some examples, the liquid electrophotographic photovoltaic ink composition comprising a dispersion of a material with a perovskite structure, a thermoplastic resin and optionally conductive particles in a carrier liquid may be producible by combining a salt AX, a salt selected from $BX_2$ and $BX_4$, a thermoplastic resin, a carrier liquid, and, if present, conductive particles. In some examples, the liquid electrophotographic photovoltaic ink composition comprising a dispersion of a material with a perovskite structure, a thermoplastic resin and optionally conductive particles in a carrier liquid, wherein the material with a perovskite structure has the chemical formula $ABX_3$, may be producible by combining a salt AX, a salt $BX_2$, a thermoplastic resin, a carrier liquid, and, if present, conductive particles. In some examples, the liquid electrophotographic photovoltaic ink composition comprising a dispersion of a material with a perovskite structure, a thermoplastic resin and optionally conductive particles in a carrier liquid, wherein the material with a perovskite structure has the chemical formula $A_2BX_6$, may be producible by combining a salt AX, a salt $BX_4$, a thermoplastic resin, a carrier liquid, and, if present, conductive particles.

In some examples, the liquid electrophotographic photovoltaic ink composition comprising a dispersion of a material with a perovskite structure and a thermoplastic resin in a carrier liquid may further comprise a charge adjuvant. In some examples, the liquid electrophotographic photovoltaic ink composition comprising a dispersion of a material with a perovskite structure, a thermoplastic resin and conductive particles in a carrier liquid may further comprise a charge adjuvant.

In some examples, the liquid electrophotographic photovoltaic ink composition comprising a dispersion of a material with a perovskite structure and a thermoplastic resin in a carrier liquid may further comprise a charge director. In some examples, the liquid electrophotographic photovoltaic ink composition comprising a dispersion of a material with a perovskite structure and a thermoplastic resin in a carrier liquid may further comprise a charge adjuvant and a charge director. In some examples, the liquid electrophotographic photovoltaic ink composition comprising a dispersion of a material with a perovskite structure, a thermoplastic resin and conductive particles in a carrier liquid may further comprise a charge director. In some examples, the liquid electrophotographic photovoltaic ink composition comprising a dispersion of a material with a perovskite structure, a thermoplastic resin and conductive particles in a carrier liquid may further comprise a charge adjuvant and a charge director.

In some examples, the liquid electrophotographic photovoltaic ink composition comprising a dispersion of a material with a perovskite structure and a thermoplastic resin in a carrier liquid may further comprise additives. In some examples, the liquid electrophotographic photovoltaic ink composition comprising a dispersion of a material with a perovskite structure, a thermoplastic resin and conductive particles in a carrier liquid may further comprise additives.

The thermoplastic resin of the LEP photovoltaic ink composition may be referred to herein as the PV thermoplastic resin. The conductive particles of the LEP photovoltaic ink composition may be referred to herein as PV conductive particles to distinguish them from the electrically conductive metal particles of the electrically conductive LEP ink composition.

In some examples, the PV thermoplastic resin may constitute 5 wt. % or more of the total non-volatile solids of the liquid electrophotographic photovoltaic ink composition comprising a dispersion of a material with a perovskite structure and a thermoplastic resin in a carrier liquid, for example, 10 wt. % or more, 15 wt. % or more, 20 wt. % or more, 25 wt. % or more, 30 wt. % or more, 35 wt. % or more, 40 wt. % or more, 45 wt. % or more, 50 wt. % or more, 55 wt. % or more, or 60 wt. % or more of the total non-volatile solids of the liquid electrophotographic photovoltaic ink composition comprising a dispersion of a material with a perovskite structure and a thermoplastic resin in a carrier liquid. In some examples, the PV thermoplastic resin may constitute 60 wt. % or less of the total solids of the liquid electrophotographic photovoltaic ink composition comprising a dispersion of a material with a perovskite structure and a thermoplastic resin in a carrier liquid, for example, 55 wt. % or less, 40 wt. % or less, 45 wt. % or less, 40 wt. % or less, 35 wt. % or less, 30 wt. % or less, 25 wt. % or less, 20 wt. % or less, 15 wt. % or less, 10 wt. % or less, or 5 wt. % or less of the total solids of the liquid electrophotographic photovoltaic ink composition comprising a dispersion of a material with a perovskite structure and a thermoplastic resin in a carrier liquid. In some examples, the PV thermoplastic resin may constitute 5 wt. % to 60 wt. % of the total non-volatile solids of the liquid electrophotographic photovoltaic ink composition comprising a dispersion of a material with a perovskite structure and a thermoplastic resin in a carrier liquid, for example, 10 wt. % to 55 wt. %, 15 wt. % to 50 wt. %, 20 wt. % to 45 wt. %, 25 wt. % to 45 wt. %, 30 wt. % to 60 wt. %, 35 wt. % to 55 wt. %, or 40 wt. % to 45 wt. % of the total non-volatile solids of the liquid electrophotographic photovoltaic ink composition comprising a dispersion of a material with a perovskite structure and a thermoplastic resin in a carrier liquid. In some examples, the PV thermoplastic resin may comprise about 44 wt. % of the total non-volatile solids of the liquid electrophotographic photovoltaic ink composition comprising a dispersion of a material with a perovskite structure and a thermoplastic resin in a carrier liquid. In some examples, the PV thermoplastic resin may comprise about 54 wt. % of the total non-volatile solids of the liquid electrophotographic photovoltaic ink composition comprising a dispersion of a material with a perovskite structure and a thermoplastic resin in a carrier liquid. In some examples, the PV thermoplastic resin may comprise about 19.4 wt. % of the total non-volatile solids of the liquid electrophotographic photovoltaic ink composition comprising a dispersion of a material with a perovskite structure and a thermoplastic resin in a carrier liquid.

In some examples, the material with a perovskite structure may constitute 20 wt. % or more of the total solids of the liquid electrophotographic photovoltaic ink composition comprising a dispersion of a material with a perovskite structure and a thermoplastic resin in a carrier liquid, for example, 20 wt. % or more, 25 wt. % or more, 30 wt. % or more, 35 wt. % or more, 40 wt. % or more, 45 wt. % or more, 50 wt. % or more, 55 wt. % or more, 60 wt. % or more, 65 wt. % or more, 70 wt. % or more, 75 wt. % or more, 80 wt. % or more, 85 wt. % or more, 90 wt. % or more, or 95 wt. % or more of the total solids of the liquid electrophotographic photovoltaic ink composition comprising a dispersion of a material with a perovskite structure and a thermoplastic resin in a carrier liquid. In some examples, the material with a perovskite structure may constitute 95 wt. % or less of the total solids of the liquid electrophotographic photovoltaic ink composition comprising a dispersion of a material with a perovskite structure and a thermoplastic resin in a carrier liquid, for example, 90 wt. % or less, 85 wt. % or less, 80 wt. % or less, 75 wt. % or less, 70 wt. % or less, 65 wt. % or less, 60 wt. % or less, 55 wt. % or less, 50 wt. % or less, 45 wt. % or less, or 40 wt. % or less of the total solids of the liquid electrophotographic photovoltaic ink composition comprising a dispersion of a material with a perovskite structure and a thermoplastic resin in a carrier liquid. In some examples, the material with a perovskite structure may constitute 40 wt. % to 95 wt. % of the total solids of the liquid electrophotographic photovoltaic ink composition comprising a dispersion of a material with a perovskite structure and a thermoplastic resin in a carrier liquid, for example, 45 wt. % to 90 wt. %, 50 wt. % to 85 wt. %, 45 wt. % to 80 wt. %, 50 wt. % to 75 wt. %, 45 wt. % to 70 wt. %, 50 wt. % to 65 wt. %, or 40 wt. % to 60 wt.

% of the total solids of the liquid electrophotographic photovoltaic ink composition comprising a dispersion of a material with a perovskite structure and a thermoplastic resin in a carrier liquid. In some examples, the material with a perovskite structure may comprise about 52 wt. % of the total non-volatile solids of the liquid electrophotographic photovoltaic ink composition comprising a dispersion of a material with a perovskite structure and a thermoplastic resin in a carrier liquid.

In some examples, the conductive particles (the PV conductive particles) may be present in the solids of the LEP photovoltaic ink composition in an amount below the percolation threshold. In these examples, the printed photovoltaic layer (produced by printing the LEP photovoltaic ink composition) comprises the conductive particles (the PV conductive particles) in an amount below the percolation threshold.

As used herein, the term "percolation threshold" may refer to the threshold amount (e.g., volume percentage) of conductive particles above which long-range connectivity between the conductive particles occurs in the printed photovoltaic layer and/or in the solids of the LEP photovoltaic ink composition.

In some examples, the PV conductive particles may be present in an amount of up to about 50 vol. % of the solids of the LEP photovoltaic ink composition, for example, up to about 40 vol. %, up to about 30 vol. %, up to about 20 vol. %, up to about 15 vol. %, up to about 10 vol. %, up to about 9 vol. %, up to about 8 vol. %, up to about 7 vol. %, up to about 6 vol. %, up to about 5 vol. %, up to about 4 vol. %, up to about 3 vol. %, up to about 2 vol. %, up to about 1 vol. %, up to about 0.9 vol. %, up to about 0.8 vol. %, up to about 0.7 vol. %, up to about 0.6 vol. %, up to about 0.5 vol. %, up to about 0.4 vol. %, up to about 0.3 vol. %, up to about 0.2 vol. %, or up to about 0.1 vol. % of the solids of the LEP photovoltaic ink composition. In some examples, the PV conductive particles may be present in an amount of at least about 0.01 vol. % of the solids of the LEP photovoltaic ink composition, for example, at least about 0.1 vol. %, at least about 0.2 vol. %, at least about 0.3 vol. %, at least about 0.4 vol. %, at least about 0.5 vol. %, at least about 0.6 vol. %, at least about 0.7 vol. %, at least about 0.8 vol. %, at least about 0.9 vol. %, at least about 1 vol. %, at least about 2 vol. %, at least about 3 vol. %, at least about 4 vol. %, at least about 5 vol. %, at least about 6 vol. %, at least about 7 vol. %, at least about 8 vol. %, at least about 9 vol. %, at least about 10 vol. %, at least about 15 vol. %, at least about 20 vol. %, at least about 30 vol. %, at least about 40 vol. %, or at least about 50 vol. % of the solids of the LEP photovoltaic ink composition. In some examples, the PV conductive particles may be present in an amount of from about 0.01 vol. % to about 50 vol. % of the solids of the LEP photovoltaic ink composition, for example, about 0.1 vol. % to about 40 vol. %, about 0.2 vol. % to about 30 vol. %, about 0.3 vol. % to about 20 vol. %, about 0.4 vol. % to about 15 vol. %, about 0.5 vol. % to about 10 vol. %, about 0.6 vol. % to about 9 vol. %, about 0.7 vol. % to about 8 vol. %, about 0.8 vol. % to about 7 vol. %, about 0.9 vol. % to about 6 vol. %, about 1 vol. % to about 5 vol. %, about 2 vol. % to about 4 vol. %, or about 0.01 vol. % to 3 vol. % of the solids of the LEP photovoltaic ink composition.

In some examples, the PV conductive particles may be present in an amount of up to about 50 wt. % of the solids of the LEP photovoltaic ink composition, for example, up to about 40 wt. %, up to about 30 wt. %, up to about 20 wt. %, up to about 15 wt. %, up to about 10 wt. %, up to about 9 wt. %, up to about 8 wt. %, up to about 7 wt. %, up to about 6 wt. %, up to about 5 wt. %, up to about 4 wt. %, up to about 3 wt. %, up to about 2 wt. %, up to about 1 wt. %, up to about 0.9 wt. %, up to about 0.8 wt. %, up to about 0.7 wt. %, up to about 0.6 wt. %, up to about 0.5 wt. %, up to about 0.4 wt. %, up to about 0.3 wt. %, up to about 0.2 wt. %, or up to about 0.1 wt. % of the solids of the LEP photovoltaic ink composition. In some examples, the PV conductive particles may be present in an amount of at least about 0.01 wt. % of the solids of the LEP photovoltaic ink composition, for example, at least about 0.1 wt. %, at least about 0.2 wt. %, at least about 0.3 wt. %, at least about 0.4 wt. %, at least about 0.5 wt. %, at least about 0.6 wt. %, at least about 0.7 wt. %, at least about 0.8 wt. %, at least about 0.9 wt. %, at least about 1 wt. %, at least about 2 wt. %, at least about 3 wt. %, at least about 4 wt. %, at least about 5 wt. %, at least about 6 wt. %, at least about 7 wt. %, at least about 8 wt. %, at least about 9 wt. %, at least about 10 wt. %, at least about 15 wt. %, at least about 20 wt. %, at least about 30 wt. %, at least about 40 wt. %, or at least about 50 wt. % of the solids of the LEP photovoltaic ink composition. In some examples, the PV conductive particles may be present in an amount of from about 0.01 wt. % to about 50 wt. % of the solids of the LEP photovoltaic ink composition, for example, about 0.1 wt. % to about 40 wt. %, about 0.2 wt. % to about 30 wt. %, about 0.3 wt. % to about 20 wt. %, about 0.4 wt. % to about 15 wt. %, about 0.5 wt. % to about 10 wt. %, about 0.6 wt. % to about 9 wt. %, about 0.7 wt. % to about 8 wt. %, about 0.8 wt. % to about 7 wt. %, about 0.9 wt. % to about 6 wt. %, about 1 wt. % to about 5 wt. %, about 2 wt. % to about 4 wt. %, or about 0.01 wt. % to 3 wt. % of the solids of the LEP photovoltaic ink composition. In some examples, the weight percentage of conductive particles present in the LEP photovoltaic ink composition may be comparable to the volume percentage. However, if the conductive particles comprise, for example, metal particles, the high density of the conductive particles may result in a significant difference between these measurements and the volume percentage may be more suitable for determining the amount to use.

In some examples, the conductive particles may be or comprise elongate particles (e.g., elongate carbon particles, such as carbon nanotubes) and the elongate particles may be present in any amount mentioned herein, with a maximum amount of up to about 1 vol. %. In some examples, the conductive particles may be or comprise elongate particles (e.g., elongate carbon particles, such as carbon nanotubes) and the elongate particles may be present in any amount mentioned herein, with a maximum amount of up to about 1 wt. %. In some examples, the conductive particles may be or comprise spherical particles and the spherical particles may be present in any amount mentioned herein, with a maximum amount of up to about 50 vol. %. In some examples, the conductive particles may be or comprise spherical particles and the spherical particles may be present in any amount mentioned herein, with a maximum amount of up to about 50 wt. %.

Salt AX

In some examples, the salt AX may be a salt of a cation and an anion. In some examples, the salt AX may be a salt of a monovalent cation and a monovalent anion. In some examples, the salt AX may be a salt of a divalent cation and a divalent anion. In some examples, the salt AX may be a mixture of salts comprising monovalent cations and monovalent anions. In some examples, A is a monovalent cation or a mixture of monovalent cations. In some examples, X is a monovalent anion or a mixture of monovalent anions.

In some examples, A is selected from a metal cation, an organic cation or a mixture thereof. In some examples, A is selected from a monovalent metal cation, a monovalent organic cation, or a mixture thereof. In some examples, A is a monovalent metal cation or a mixture thereof. In some examples, A is a monovalent organic cation or a mixture thereof. In some examples, A is a mixture of a monovalent metal cation and a monovalent organic cation.

In some examples, A is an organic cation selected from primary aliphatic ammonium cations and primary aromatic ammonium cations. In some examples, A is a primary aliphatic ammonium cation. In some examples, A is selected from methylammonium (MA), formamidinium (FA), rubidium (Rb), caesium (Cs), and mixtures thereof. In some examples, A is caesium (Cs). In some examples, A is methylammonium (MA).

In some examples, X is a monovalent anion or a mixture of monovalent anions. In some examples, X is a halide ion. In some examples, X is selected from iodide, bromide, chloride and mixtures thereof. In some examples, X is selected from iodide, bromide and chloride. In some examples, X is bromide. In some examples, X is iodide.

In some examples, AX may be selected from methylammonium iodide (MAI), methylammonium bromide (MABr), methylammonium chloride (MACl), formamidinium iodide (FAI), formamidinium bromide (FABr), formamidinium chloride (FABr), caesium iodide (CsI), caesium bromide (CsBr), caesium chloride (CsCl) rubidium iodide (RbI), rubidium bromide (RbBr), rubidium chloride (RbCl) or mixtures thereof. In some examples, AX may be selected from methylammonium iodide (MAI), methylammonium bromide (MABr), formamidinium iodide (FAI), formamidinium bromide (FABr), caesium iodide (CsI), caesium bromide (CsBr), or mixtures thereof. In some examples, AX may be selected from methylammonium iodide (MAI), methylammonium bromide (MABr), formamidinium iodide (FAI), formamidinium bromide (FABr), caesium iodide (CsI) and caesium bromide (CsBr). In some examples, AX may be selected from CsI and CsBr. In some examples, AX may be CsBr. In some examples, AX is selected from methylammonium iodide, methylammonium bromide and methylammonium chloride. In some examples, AX is methylammonium iodide.

Salt $BX_2$

In some examples, the salt $BX_2$ may be a salt of a cation and an anion. In some examples, the salt $BX_2$ may be a salt of a divalent cation and a monovalent anion. In some examples, the salt $BX_2$ may be a salt of a tetravalent cation and a divalent anion. In some examples, the salt $BX_2$ may be a mixture of salts comprising divalent cations and monovalent anions. In some examples, B is a divalent cation or a mixture of divalent cations. In some examples, X is a monovalent anion or a mixture of monovalent anions. In some examples, X in $BX_2$ may be different from X in AX. In some examples, X in $BX_2$ may be the same as X in AX.

In some examples, B is a divalent metal cation or a mixture of divalent metal cations. In some examples, B is a divalent metal cation.

In some examples, B is selected from lead (Pb), germanium (Ge), tin (Sn), antimony (Sb), bismuth (Bi), copper (Cu), manganese ($Mn^{2+}$), cobalt ($Co^{2+}$) and mixtures thereof. In some examples, B is selected from lead (Pb), germanium (Ge), tin (Sn), antimony (Sb), bismuth (Bi), Copper (Cu) and mixtures thereof. In some examples, B is lead.

In some examples, X is as described above for AX.

In some examples, $BX_2$ may be selected from $SnI_2$, $SnBr_2$, $SnCl_2$, $PbI_2$, $PbBr_2$, $PbCl_2$ and combinations thereof. In some examples, $BX_2$ may be selected from $SnI_2$, $SnBr_2$, $PbI_2$, $PbBr_2$ and combinations thereof. In some examples, $BX_2$ may be selected from $SnI_2$, $SnBr_2$, $PbI_2$ and $PbBr_2$. In some examples, $BX_2$ may be selected from $SnI_2$ and $SnBr_2$. In some examples, $BX_2$ may be $SnBr_2$. In some examples, $BX_2$ is $PbI_2$.

Salt $BX_4$

In some examples, the salt $BX_4$ may be a salt of a cation and an anion. In some examples, the salt $BX_4$ may be a salt of a tetravalent cation and a monovalent anion. In some examples, the salt $BX_4$ may be a mixture of salts comprising tetravalent cations and monovalent anions. In some examples, B is a tetravalent cation or a mixture of tetravalent cations. In some examples, X is a monovalent anion or a mixture of monovalent anions. In some examples, X in $BX_4$ may be the same as X in AX.

In some examples, B is a tetravalent metal cation or a mixture of tetravalent metal cations. In some examples, B is a tetravalent metal cation. In some examples, B is $Sn^{4+}$.

In some examples, $BX_4$ is selected from $SnI_4$, $SnBr_4$, $SnCl_4$ and combinations thereof.

Material with a Perovskite Structure

In some examples, the material with a perovskite structure may be a perovskite wherein A is a cation or a mixture of cations, B is a cation or a mixture of cations and X is an anion or a mixture of anions. In some examples, the material with a perovskite structure may have the chemical formula $ABX_3$ wherein A is a monovalent cation or a mixture of monovalent cations, B is a divalent cation or a mixture of divalent cations and X is a monovalent anion or a mixture of monovalent anions. In some examples, the material with a perovskite structure may have the chemical formula $ABX_3$ wherein A is a divalent cation or a mixture of divalent cations, B is a tetravalent cation or a mixture of tetravalent cations and X is a divalent anion or a mixture of divalent anions. In some examples, the material with a perovskite structure may have the chemical formula $A_2BX_6$ wherein A is a monovalent cation or a mixture of monovalent cations, B is a tetravalent cation or mixture of tetravalent cations and X is a monovalent anion or a mixture of monovalent anions. In some examples, the material with a perovskite structure may have the chemical formula $ABX_3$ wherein A is a monovalent cation, B is a divalent cation and X is a monovalent anion or a mixture of monovalent anions. In some examples, the material with a perovskite structure may have the chemical formula $ABX_3$ wherein A is a monovalent cation, B is a divalent cation and X is a monovalent anion.

In some examples, A is as described above for AX. In some examples, B is as described above for $BX_2$ or as described above for $BX_4$. In some examples, X is as described above for AX or $BX_2$ or $BX_4$.

As used herein, the term perovskite does not specifically refer to the perovskite mineral, $CaTiO_3$ but instead refers to any material that has the same type of crystal structure as calcium titanium oxide. As used herein, the term perovskite structure indicates that the material has the perovskite type crystal structure.

In some examples, the material with a perovskite structure may be selected from $MAPbI_3$, $CsSnBr_3$, $Cs_2SnBr_6$, $Rb_z[Cs_y(MA_xFA_{1-x})_{1-y}]_{1-z}Pb_lM_{1-l}(I_{1-n-m}Br_mCl_n)_3$ (wherein $0 \leq x \leq 1$, $0 \leq y \leq 1$, $0 \leq z \leq 1$, $0 \leq l \leq 1$, $0 \leq m \leq 1$, $0 \leq n \leq 1$; M=Sn or In), and $Rb_z[Cs_y(MA_xFA_{1-x})_{1-y}]_{1-z}B(I_{1-n-m}Br_mCl_n)_3$ (wherein $0 \leq x \leq 1$, $0 \leq y \leq 1$, $0 \leq z \leq 1$, $0 \leq m \leq 1$, $0 \leq n \leq 1$; B=Ge, Sn, Sb, Bi or Cu). In some examples, the material with a perovskite structure may be $CsSnBr_3$. In some examples, the material with a perovskite structure may be $MAPbI_3$.

The material with a perovskite structure may have a chemical formula selected from $ABX_3$ and $A_2BX_6$; wherein A is a cation, B is a cation and X is an anion. In some examples, the material with a perovskite structure has the chemical formula $ABX_3$. In some examples, the material with a perovskite structure has the chemical formula $A_2BX_6$.

In some examples, A is selected from a monovalent metal cation, a monovalent organic cation, or a mixture thereof; and/or B is a divalent metal cation or a tetravalent metal cation; and/or X is a halide ion. In some examples, X is a halide ion, for example, selected from iodide, bromide, chloride and mixtures thereof; and/or A is selected from methylammonium (MA), formamidinium (FA), rubidium (Rb), caesium (Cs), and mixtures thereof; and/or B is selected from lead (Pb), germanium (Ge), tin (Sn), antimony (Sb), bismuth (Bi), copper (Cu), manganese (Mn), cobalt (Co) and mixtures thereof; and/or the liquid carrier is a hydrocarbon.

Conductive Particles

The LEP photovoltaic ink composition may comprise conductive particles. The conductive particles may be present in an amount below the percolation threshold of the printed photovoltaic layer.

In some examples, the conductive particles may have any shape. In some examples, the shape of the conductive particles may be defined by the relative dimensions of the long, intermediate and short axes of the particles (where the three axes may be perpendicular to each other). In some examples, all three of the relative dimensions may be the same or different or any two of the relative dimensions may be the same and the third dimension may be different. In some examples, the conductive particles may comprise or consist of oblate particles, prolate particles, bladed particles, equant particles, or combinations thereof. In some examples, the conductive particles may comprise or consist of spherical particles, approximately spherical particles, elliptical particles, elongate particles, flat particles, flakes, prismatic particles, scalenohedral particles, dendrimers, amorphous particles, or combinations thereof.

In some examples, the conductive particles comprise or consist of elongate particles, spherical particles, approximately spherical particles (i.e., particles with a geometry that is close to spherical), or combinations thereof. In some examples, the conductive particles comprise or consist of elongate particles. The elongate particles may be elongate conductive carbon particles (e.g., carbon nanotubes).

Elongate particles may be particles having a first dimension that is longer than each of a second dimension and a third dimension, wherein the first, second and third dimensions are perpendicular to one another. In some examples, the second dimension and the third dimension may be the same or different. In some examples, the elongate particles are rod-shaped. In some examples, the elongate particles (e.g., carbon nanotubes) may have an aspect ratio between 2 and 10,000. As described herein, the aspect ratio may be defined as the ratio of the length of the longest dimension of an elongate conductive species (e.g., the first dimension described above) to the length of the next-to-longest dimension (e.g., the second or third dimension described above), wherein the dimensions are perpendicular to one another. The elongate particles (e.g., carbon nanotubes) may have an aspect ratio of at least about 2, for example, at least about 3, at least about 4, at least about 5, at least about 6, at least about 7, at least about 8, at least about 9, at least about 10, at least about 11, at least about 12, at least about 13, at least about 14, at least about 15, at least about 16, at least about 17, at least about 18, at least about 19, at least about 20, at least about 25, at least about 30, at least about 40, at least about 50, at least about 60, at least about 70, at least about 80, at least about 90, at least about 100, at least about 150, at least about 200, at least about 300, at least about 400, at least about 500, at least about 1000, at least about 1500, at least about 2000, at least about 2500, at least about 3000, at least about 3500, at least about 4000, at least about 4500, at least about 5000, at least about 5500, at least about 6000, at least about 6500, at least about 7000, at least about 7500, at least about 8000, at least about 8500, at least about 9000, at least about 9500, at least about 10,000.

In some examples, the elongate particles (e.g., carbon nanotubes) may have an aspect ratio of up to about 50,000, for example, up to about 40000, up to about 35000, up to about 30000, up to about 25000, up to about 20000, up to about 10000, up to about 9500, up to about 9000, up to about 8500, up to about 8000, up to about 7500, up to about 7000, up to about 6500, up to about 6000, up to about 5500, up to about 5000, up to about 4500, up to about 4000, up to about 3500, up to about 3000, up to about 2500, up to about 2000, up to about 1500, up to about 1000, up to about 500, up to about 100, up to about 50, up to about 10.

In some examples, the elongate particles (e.g., carbon nanotubes) may have an aspect ratio of from about 2 to about 50,000, for example, 50 to 35000, 100 to 30000, 500 to 25000, 1000 to 20000, 2500 to 24000, 5000 to 20000, or 7000 to 10000.

In some examples, the conductive particles comprise or consist of metal particles, inorganic conductive particles, inorganic semiconductive particles, conductive carbon particles, conductive polymers or combinations thereof.

In some examples, the metal particles comprise or consist of elemental metal particles, metal alloy particles, metallic dendrimers, or a mixture thereof. In some examples, the metal particles may comprise or consist of a metal selected from copper, aluminium, silver, gold or a combination thereof. In some examples, the inorganic semiconductive particles may comprise or consist of nickel oxide (NiO), copper oxide (CuO) or a combination thereof. In some examples, the conductive carbon particles may comprise or consist of carbon nanotubes (e.g., single-walled carbon nanotubes, multi-walled carbon nanotubes or a mixture thereof), carbon black, or a combination thereof. In some examples, the conductive carbon particles comprise or consist of carbon nanotubes, for example, single-walled carbon nanotubes. In some examples, the conductive polymer may comprise or consist of polypyrrole, conductive polyaniline, polyfluorene, a polyphenylene (e.g., polyphenylene or a substituted polyphenylene), a polypyrene (e.g., polypyrene or a substituted polypyrene), a polyazulene (e.g., polyazulene or a substituted polyazulene), a polynaphthalene (e.g., polynaphthalene or a substituted polynaphthalene), a poly (acetylene) (PAC) (e.g., poly(acetylene) or a substituted polyacetylene), poly(p-phenylene vinylene) (PPV), a polycarbazole (e.g., polycarbazole or a substituted polycarbazole), a polyindole (e.g., polyindole or a substituted polyindole), a polyazepine (e.g., polyazepine or a substituted polyazepine), a poly(thiophene) (PT) (e.g., polythiophene or a substituted polythiophene), poly(3,4-ethylenedioxythiophene) (PEDOT), poly(p-phenylene sulfide) (PPS), or a combination thereof. In some examples, the conductive polyaniline may be sulfuric acid doped polyaniline, polyaniline emeraldine base or a combination thereof.

In some examples, the conductive particles may be or comprise carbon nanotubes. The carbon nanotubes may be straight walled or bent nanotubes. In some examples, the carbon nanotubes may be selected from straight or bent multi-walled carbon nanotubes (MWCNTs), straight or bent double-walled carbon nanotubes (DWCNTs), straight or bent single-walled carbon nanotubes (SWCNTs), or combinations of these carbon nanotube forms and may comprise common by-products contained in carbon nanotube preparations.

In some examples, the elongate particles, for example, the carbon nanotubes (e.g., single-walled carbon nanotubes) may have an outer diameter of up to 4 nm, for example, up to 3.5 nm, up to 3.25 nm, up to 3 nm. In some examples, the elongate particles, for example, the carbon nanotubes (e.g., single-walled carbon nanotubes) may have an outer diameter of 0.5 nm to 2.5 nm, for example, 0.5 nm to 2 nm, 0.5 nm to 1.5 nm, or 0.5 nm to 1 nm.

In some examples, such as in multi-walled carbon nanotubes, the carbon nanotubes have an outer diameter of at least 2 nm, for example, at least 3 nm, at least 5 nm, at least 10 nm, or at least 15 nm. In some examples, such as in multi-walled nanotubes, the carbon nanotubes have an outer diameter of 2 nm to 50 nm.

In some examples, the carbon nanotubes comprise single walled carbon-based SWNT-containing material. SWNTs can be formed by a number of techniques, such as laser ablation of a carbon target, decomposing a hydrocarbon, and setting up an arc between two graphite electrodes.

Liquid Carrier

The LEP photovoltaic ink composition may comprise a liquid carrier, which may also be termed a carrier liquid. The LEP photovoltaic ink composition may comprise the same or a different liquid carrier as the electrically conductive LEP ink composition. The LEP photovoltaic ink composition may comprise the same liquid carrier as the electrically conductive LEP ink composition.

In some examples, the liquid carrier of the LEP photovoltaic ink composition is as described above for the liquid carrier of the electrically conductive LEP ink composition. In some examples, the liquid carrier of the LEP photovoltaic ink composition may comprise a different liquid carrier than the electrically conductive LEP ink composition and the liquid carrier may be as described above for the liquid carrier of the electrically conductive LEP ink composition.

PV Thermoplastic Resin

The LEP photovoltaic ink composition may comprise a thermoplastic resin. The thermoplastic resin of the LEP photovoltaic ink composition may comprise a copolymer of an alkylene monomer and a monomer having acidic side groups; and/or a copolymer of an alkylene monomer and an ethylenically unsaturated monomer comprising an epoxide; and/or a copolymer of an alkylene monomer, an ethylenically unsaturated monomer comprising an epoxide, and a monomer selected from a monomer having acidic side groups, a monomer having ester side groups and a mixture thereof. The thermoplastic resin of the LEP photovoltaic ink composition may comprise a copolymer of an alkylene monomer and an ethylenically unsaturated monomer comprising an epoxide. Once printed, the epoxide may have been subjected to a ring-opening reaction and/or a crosslinking reaction.

The thermoplastic resin of the LEP photovoltaic ink composition (i.e., the PV thermoplastic resin) may comprise a thermoplastic polymer. The PV thermoplastic resin may be referred to herein as a resin. In some examples, the PV thermoplastic resin may comprise a copolymer of an alkylene monomer and a monomer having acidic side groups; and/or a copolymer of an alkylene monomer and an ethylenically unsaturated monomer comprising an epoxide; and/or a copolymer of an alkylene monomer, an ethylenically unsaturated monomer comprising an epoxide, and a monomer selected from a monomer having acidic side groups, a monomer having ester side groups and a mixture thereof. In some examples, the PV thermoplastic resin may comprise a copolymer of an alkylene monomer and an ethylenically unsaturated monomer comprising an epoxide.

In some examples, the thermoplastic resin may comprise a copolymer of an alkylene monomer and a monomer having acidic side groups. In some examples, the copolymer of an alkylene monomer and a monomer having acidic side groups may be any copolymer described herein comprising an alkylene monomer and a monomer having acidic side groups, for example, as described for use in the electrically conductive LEP ink composition (e.g., as an EC thermoplastic resin).

In some examples, the thermoplastic resin may comprise a copolymer of an alkylene monomer and an ethylenically unsaturated monomer comprising an epoxide.

In some examples, the ethylenically unsaturated monomer comprising an epoxide is any monomer comprising a carbon-carbon double bond and an epoxide. As used herein, the term "ethylenically unsaturated monomer" is used to indicate the presence of one carbon-carbon double bond in the monomer, which reacts during the polymerisation reaction to form the copolymer, thus forming a carbon-carbon single bond in the copolymer.

In some examples, the ethylenically unsaturated monomer comprising an epoxide is an ethylenically unsaturated ketone comprising an epoxide, an ethylenically unsaturated amide comprising an epoxide, an ethylenically unsaturated thioester comprising an epoxide, an ethylenically unsaturated ester comprising an epoxide, or a combination thereof. In some examples, the ethylenically unsaturated monomer comprising an epoxide is an ethylenically unsaturated ester comprising an epoxide. In some examples, the ethylenically unsaturated amide comprising an epoxide may be an amide of an ethylenically unsaturated carboxylic acid and an epoxide-containing amine, for example, an epoxide-containing primary amine or an epoxide-containing secondary amine. In some examples, the ethylenically unsaturated thioester comprising an epoxide may be a thioester of an ethylenically unsaturated carboxylic acid and an epoxide-containing thiol. In some examples, the ethylenically unsaturated ester comprising an epoxide may be an ester of an ethylenically unsaturated carboxylic acid and an epoxide-containing alcohol.

In some examples, the ethylenically unsaturated carboxylic acid may be any compound containing a carboxylic acid and a single carbon-carbon double bond. In some examples, the ethylenically unsaturated carboxylic acid comprises an α,β-unsaturated carboxylic acid or an α,β-unsaturated, α-alkyl carboxylic acid. In some examples, the α,β-unsaturated, α-alkyl carboxylic acid may be further substituted.

In some examples, the α,β-unsaturated carboxylic acid comprises a C1 to C10 α,β-unsaturated carboxylic acid, for example, a C1 to C6 α,β-unsaturated carboxylic acid. In some examples, the α,β-unsaturated carboxylic acid is selected from the group consisting of pent-2-enoic acid, butan-2-enoic acid and prop-2-enoic acid. In some examples, the α,β-unsaturated carboxylic acid is prop-2-enoic acid.

In some examples, the α,β-unsaturated, α-alkyl carboxylic acid comprises an α-alkyl substituted C1 to C10 α,β- unsaturated carboxylic acid, for example, an α-alkyl substituted C1 to C6 α,β-unsaturated carboxylic acid. In some examples, the α,β-unsaturated, α-alkyl carboxylic acid is selected from the group consisting of a 2-alkylpent-2-enoic acid, 2-alkylbutan-2-enoic acid and a 2-alkylprop-2-enoic acid. In some examples, the α,β-unsaturated, α-alkyl carboxylic acid is a 2-alkylprop-2-enoic acid.

In some examples, the α-alkyl group of the α,β-unsaturated, α-alkyl carboxylic acid is a substituted or unsubstituted alkyl group. In some examples, the α-alkyl substituent of the α,β-unsaturated, α-alkyl carboxylic acid (for example, the 2-alkyl substituent of 2-alkylprop-2-enoic acid) is a C1 to C10 alkyl group, for example, a C1 to C6 alkyl, such as methyl, ethyl, propyl (e.g., n-propyl or iso-propyl), or butyl (e.g., n-butyl, sec-butyl, isobutyl or tert-butyl). In some examples, the α-alkyl substituent of the α,β-unsaturated, α-alkyl carboxylic acid (for example, the 2-alkyl substituent of 2-alkylprop-2-enoic acid) is selected from the group consisting of methyl, ethyl and propyl. In some examples, the α-alkyl substituent of the α,β-unsaturated, α-alkyl carboxylic acid is methyl.

In some examples, the ethylenically unsaturated carboxylic acid is selected from 2-propylprop-2-enoic acid, 2-ethylprop-2-enoic acid and 2-methylprop-2-enoic acid. In some examples, the ethylenically unsaturated carboxylic acid is 2-methylprop-2-enoic acid, which is also known as methacrylic acid.

In some examples, the epoxide-containing alcohol may be any compound containing an epoxide group and an alcohol group. In some examples, the epoxide-containing alcohol may be any alkane containing an epoxide group and an alcohol.

In some examples, the epoxide-containing alcohol comprises a primary alcohol, a secondary alcohol or a tertiary alcohol. In some examples, the epoxide-containing alcohol comprises a primary alcohol.

In some examples, the epoxide-containing alcohol may comprise a mono-substituted epoxide (also referred to herein as a terminal epoxide), a di-substituted epoxide, a tri-substituted epoxide or a tetra-substituted epoxide. In some examples, the epoxide-containing alcohol may comprise a mono-substituted or a di-substituted epoxide. In some examples, the epoxide-containing alcohol may comprise a terminal epoxide. In some examples, the di-substituted epoxide may have the formula —CR(O)CH$_2$. A terminal epoxide is an epoxide having the formula —CH(O)CH$_2$.

In some examples, the epoxide-containing alcohol may comprise a primary alcohol and a terminal epoxide.

In some examples, the epoxide-containing alcohol may be any epoxide-containing alcohol. In some examples, the epoxide-containing alcohol may comprise 2 to 30 carbon atoms, for example, 3 to 25 carbon atoms, 3 to 20 carbon atoms, 3 to 15 carbon atoms, 3 to 10 carbon atoms, 3 to 5 carbon atoms, 3 to 4 carbon atoms. In some examples, the epoxide-containing alcohol may be selected from glycidol (i.e., 2,3-epoxy-1-propanol), epoxybutanol (e.g., 3,4-epoxy-1-butanol), and epoxypentanol (e.g., 4,5-epoxy-1-pentanol). In some examples, the epoxide-containing alcohol may be glycidol.

In some examples, the ethylenically unsaturated ester comprising an epoxide may be selected from glycidyl methacrylate, glycidyl 2-ethylprop-2-enoate, glycidyl 2-propylprop-2-enoate, epoxybutanyl methacrylate, epoxybutanyl 2-ethylprop-2-enoate, epoxybutanyl 2-propylprop-2-enoate, epoxypentanyl methacrylate, epoxypentanyl 2-ethylprop-2-enoate, epoxypentanyl 2-propylprop-2-enoate. In some examples, the ethylenically unsaturated ester comprising an epoxide is glycidyl methacrylate.

In some examples, the copolymer of an alkylene monomer and an ethylenically unsaturated monomer comprising an epoxide may be a copolymer of ethylene and an ethylenically unsaturated ester comprising an epoxide, such as glycidyl methacrylate.

In some examples, the ethylenically unsaturated monomer comprising an epoxide constitutes at least 1 wt. % of the copolymer of an alkylene monomer and an ethylenically unsaturated monomer comprising an epoxide, for example, at least 1.5 wt. %, at least 2 wt. %, at least 2.5 wt. %, at least 3 wt. %, at least 3.5 wt. %, at least 4 wt. %, at least 4.5 wt. %, at least 5 wt. %, at least 5.5 wt. %, at least 6 wt. %, at least 6.5 wt. % of the copolymer of an alkylene monomer and an ethylenically unsaturated monomer comprising an epoxide.

In some examples, the ethylenically unsaturated monomer comprising an epoxide constitutes 50 wt. % or less of the copolymer of an alkylene monomer and an ethylenically unsaturated monomer comprising an epoxide, for example, 25 wt. % or less, 20 wt. % or less, 15 wt. % or less, 14 wt. % or less, 13 wt. % or less, 12 wt. % or less, 11 wt. % or less, 10.5 wt. % or less, 10 wt. % or less, 9.5 wt. % or less, 9 wt. % or less of the copolymer of an alkylene monomer and an ethylenically unsaturated monomer comprising an epoxide.

In some examples, the ethylenically unsaturated monomer comprising an epoxide constitutes from about 1 wt. % to about 50 wt. % of the copolymer of an alkylene monomer and an ethylenically unsaturated monomer comprising an epoxide, for example, from about 1.5 wt. % to about 25 wt. %, from about 2 wt. % to about 20 wt. %, from about 2.5 wt. % to about 15 wt. %, from about 3 wt. % to about 14 wt. %, from about 3.5 wt. % to about 13 wt. %, from about 4 wt. % to about 12 wt. %, from about 4.5 wt. % to about 11 wt. %, from about 5 wt. % to about 10.5 wt. %, from about 5.5 wt. % to about 10 wt. %, from about 6 wt. % to about 9.5 wt. %, from about 6.5 wt. % to about 9 wt. % of the copolymer of an alkylene monomer and an ethylenically unsaturated monomer comprising an epoxide. In some examples, the alkylene monomer may constitute the remaining weight percent of the copolymer of an alkylene monomer and an ethylenically unsaturated monomer comprising an epoxide.

In some examples, the thermoplastic resin may comprise a copolymer of an alkylene monomer, an ethylenically unsaturated monomer comprising an epoxide, and a monomer selected from a monomer having acidic side groups, a monomer having ester side groups and a mixture thereof. In some examples, the thermoplastic resin may comprise a copolymer of an alkylene monomer, an ethylenically unsaturated monomer comprising an epoxide, and a monomer having acidic side groups. In some examples, the thermoplastic resin may comprise a copolymer of an alkylene monomer, an ethylenically unsaturated monomer comprising an epoxide, and a monomer having ester side groups. In some examples, the thermoplastic resin may comprise a copolymer of an alkylene monomer, an ethylenically unsaturated monomer comprising an epoxide, a monomer having acidic side groups and a monomer having ester side groups. In some examples, the alkylene monomer may be any alkylene monomer described herein. In some examples, the ethylenically unsaturated monomer comprising an epoxide may be any ethylenically unsaturated monomer comprising an epoxide described herein. In some examples, the monomer having acidic side groups may be any monomer having acidic side groups described herein.

In some examples, the monomer having ester side groups may be any monomer having ester side groups. In some examples, the monomer having ester side groups may be an ethylenically unsaturated ester, for example, an ester of an ethylenically unsaturated carboxylic acid and an alcohol or an ester of a carboxylic acid and an ethylenically unsaturated alcohol.

In some examples, the monomer having ester side groups may be an ester of an ethylenically unsaturated carboxylic acid and an alcohol. In some examples, the ethylenically unsaturated carboxylic acid may be an α,β-unsaturated carboxylic acid. In some examples, the α,β-unsaturated carboxylic acid may be an α,β-unsaturated, α-alkyl carboxylic acid. In some examples, the α,β-unsaturated carboxylic acid may be selected from propen-2-oic acid or an α,β-unsaturated, α-alkyl carboxylic acid described herein. In some examples, the α,β-unsaturated carboxylic acid may be propen-2-oic acid (also known as acrylic acid) or 2-methylprop-2-enoic acid (also known as methacrylic acid). In some examples, the alcohol may be a C1 to C10 alcohol, for example, methanol, ethanol, propanol, butanol, pentanol, or hexanol.

In some examples, the monomer having ester side groups may be an ester of a carboxylic acid and an ethylenically unsaturated alcohol. In some examples, the carboxylic acid may be methanoic acid, ethanoic acid, propanoic acid, butanoic acid, pentanoic acid or hexanoic acid. In some examples, the ethylenically unsaturated alcohol may be vinyl alcohol, hydroxypropene, hydroxybutene, hydroxypentene, or hydroxyhexene. In some examples, the ethylenically unsaturated alcohol may be vinyl alcohol.

In some example, the monomer having ester side groups may be methyl acrylate, methyl methacrylate, ethyl acrylate, ethyl methacrylate, propyl acrylate, propyl methacrylate, butyl acrylate, butyl methacrylate, pentyl acrylate, pentyl methacrylate, or vinyl acetate.

In some examples, the copolymer of an alkylene monomer, an ethylenically unsaturated monomer comprising an epoxide and a monomer having ester side groups may be a copolymer of ethylene, a monomer selected from glycidyl acrylate and glycidyl methacrylate, and a monomer selected from methyl acrylate, butyl acrylate and vinyl acetate. In some examples, the copolymer of an alkylene monomer, an ethylenically unsaturated monomer comprising an epoxide and a monomer having ester side groups may be a copolymer of ethylene, glycidyl methacrylate, and a monomer selected from methyl acrylate, butyl acrylate and vinyl acetate.

In some examples, the monomer comprising an epoxide may constitute about 1 wt. % to about 20 wt. % of the copolymer of an alkylene monomer, an ethylenically unsaturated monomer comprising an epoxide, and a monomer selected from a monomer having acidic side groups, a monomer having ester side groups and a mixture thereof, for example, about 2 wt. % to about 15 wt. %, about 3 wt. % to about 12 wt. %, about 4 wt. % to about 11 wt. %, about 5 wt. % to about 10 wt. %, about 6 wt. % to about 9 wt. %, about 7 wt. % to about 8 wt. % of the copolymer of an alkylene monomer, an ethylenically unsaturated monomer comprising an epoxide, and a monomer selected from a monomer having acidic side groups, a monomer having ester side groups and a mixture thereof. In some examples, the monomer comprising an epoxide may constitute at least about 1 wt. % of the copolymer of an alkylene monomer, an ethylenically unsaturated monomer comprising an epoxide, and a monomer selected from a monomer having acidic side groups, a monomer having ester side groups and a mixture thereof, for example, at least about 2 wt. %, at least about 3 wt. %, at least about 4 wt. %, at least about 5 wt. %, at least about 6 wt. %, at least about 7 wt. %, at least about 8 wt. %, at least about 9 wt. %, at least about 10 wt. %, at least about 11 wt. %, at least about 12 wt. %, at least about 13 wt. %, at least about 14 wt. %, at least about 15 wt. %. In some examples, the monomer comprising an epoxide may constitute up to about 20 wt. % of the copolymer of an alkylene monomer, an ethylenically unsaturated monomer comprising an epoxide, and a monomer selected from a monomer having acidic side groups, a monomer having ester side groups and a mixture thereof, for example, up to about 15 wt. %, up to about 14 wt. %, up to about 13 wt. %, up to about 12 wt. %, up to about 11 wt. %, up to about 10 wt. %, up to about 9 wt. %, up to about 8 wt. %, up to about 7 wt. %, up to about 6 wt. %, up to about 5 wt. %, up to about 4 wt. %, up to about 3 wt. %, up to about 2 wt. %, up to about 1 wt. % of the copolymer of an alkylene monomer, an ethylenically unsaturated monomer comprising an epoxide, and a monomer selected from a monomer having acidic side groups, a monomer having ester side groups and a mixture thereof. In some examples, the remaining weight percentage may constitute the alkylene monomer and the monomer selected from a monomer having acidic side groups, a monomer having ester side groups and a mixture thereof.

In some examples, the monomer selected from a monomer having acidic side groups monomer, a monomer having ester side groups and mixture thereof may constitute about 1 wt. % to about 35 wt. % of the copolymer of an alkylene monomer, an ethylenically unsaturated monomer comprising an epoxide, and a monomer selected from a monomer having acidic side groups, a monomer having ester side groups and a mixture thereof, for example, about 5 wt. % to about 30 wt. %, about 10 wt. % to about 28 wt. %, about 15 wt. % to about 27 wt. %, about 20 wt. % to 25 wt. %, about 23 wt. % to about 24 wt. % of the copolymer of an alkylene monomer, an ethylenically unsaturated monomer comprising an epoxide, and a monomer selected from a monomer having acidic side groups, a monomer having ester side groups and a mixture thereof. In some examples, the remaining weight percentage may constitute the alkylene monomer and the ethylenically unsaturated monomer comprising an epoxide.

In some examples, the copolymer of an alkylene monomer, an ethylenically unsaturated monomer comprising an epoxide, and a monomer selected from a monomer having acidic side groups, a monomer having ester side groups and a mixture thereof may comprise about 1 wt. % to about 20 wt. % of the ethylenically unsaturated monomer comprising an epoxide (for example, about 2 wt. % to about 15 wt. %, about 3 wt. % to about 12 wt. %, about 4 wt. % to about 11 wt. %, about 5 wt. % to about 10 wt. %, about 6 wt. % to about 9 wt. %, about 7 wt. % to about 8 wt. %); about 1 wt. % to about 35 wt. % of the monomer selected from a monomer having acidic side groups, a monomer having ester side groups and a mixture thereof (for example, about 5 wt. % to about 30 wt. %, about 10 wt. % to about 28 wt. %, about 15 wt. % to about 27 wt. %, about 20 wt. % to 25 wt. %, about 23 wt. % to about 24 wt. %); and the remaining weight percentage may be alkylene monomer.

The polymer or polymers of the PV thermoplastic resin may be selected from poly(ethylene-co-glycidyl methacrylate) (sold by Merck), poly(ethylene-co-methyl acrylate-co-glycidyl methacrylate) (sold by Merck), Lotader AX8840, Lotader AX8820, Lotader™ AX8900, Lotader AX8930, Lotader™ AX8750, Lotader AX8670T, Igetabond™

CG5001, Igetabond™ BF-2C, Igetabond™ BR-E, Igetabond™ BF-2B, Igetabond™ BF-7B, Igetabond™ BR-7L and Igetabond™ BF-7M.

Charge Director

The LEP photovoltaic ink composition may further comprise a charge director. The LEP photovoltaic ink composition may comprise the same or a different charge director as the electrically conductive LEP ink composition.

In some examples, the charge director of the LEP photovoltaic ink composition is as described above for the charge director of the electrically conductive LEP ink composition. In some examples, the charge director of the LEP photovoltaic ink composition may comprise a different charge director than the electrically conductive LEP ink composition and the charge director may be as described above for the charge director of the electrically conductive LEP ink composition.

Charge Adjuvant

The LEP photovoltaic ink composition may further comprise a charge adjuvant. The LEP photovoltaic ink composition may comprise the same or a different charge adjuvant as the electrically conductive LEP ink composition.

In some examples, the charge adjuvant of the LEP photovoltaic ink composition is as described for the charge adjuvant of the electrically conductive LEP ink composition. In some examples, the charge adjuvant of the LEP photovoltaic ink composition may comprise a different charge adjuvant than the electrically conductive LEP ink composition and the charge adjuvant may be as described above for the charge adjuvant of the electrically conductive LEP ink composition.

Other Additives

The LEP photovoltaic ink composition may further comprise an additive or a plurality of additives. The LEP photovoltaic ink composition may comprise the same or different additive(s) as the electrically conductive LEP ink composition.

In some examples, the additive(s) of the LEP photovoltaic ink composition is as described for the additive(s) of the electrically conductive LEP ink composition. In some examples, the additive(s) of the LEP photovoltaic ink composition may comprise a different additive or additives than the electrically conductive LEP ink composition and the additive(s) may be as described above for the additive(s) of the electrically conductive LEP ink composition.

Printed Photovoltaic Cell

In an aspect, there is provided a printed photovoltaic cell. The printed photovoltaic cell may comprise an anode; a cathode; and a liquid electrophotographically printed photovoltaic layer disposed between the anode and the cathode. In some examples, the cathode may be a liquid electrophotographically printed cathode.

The printed photovoltaic cell may comprise an anode; a liquid electrophotographically printed cathode; and a liquid electrophotographically printed photovoltaic layer disposed between the anode and the cathode. The printed photovoltaic cell may comprise: an anode; a liquid electrophotographically printed cathode; and a liquid electrophotographically printed photovoltaic layer disposed between the anode and the cathode; wherein the photovoltaic layer comprises a thermoplastic resin, a material with a perovskite structure and optionally conductive particles; wherein the material with a perovskite structure has a chemical formula selected from $ABX_3$ and $A_2BX_6$; wherein A is a cation, B is a cation and X is an anion; and wherein the thermoplastic resin comprises a copolymer of an alkylene monomer and a monomer having acidic side groups; and/or a copolymer of an alkylene monomer and an ethylenically unsaturated monomer comprising an epoxide; and/or a copolymer of an alkylene monomer, an ethylenically unsaturated monomer comprising an epoxide, and a monomer selected from a monomer having acidic side groups, a monomer having ester side groups and a mixture thereof; and wherein the printed cathode comprises: a thermoplastic resin; and electrically conductive metal particles. The printed photovoltaic cell may comprise: an anode; a liquid electrophotographically printed cathode; and a liquid electrophotographically printed photovoltaic layer disposed between the anode and the cathode; wherein the photovoltaic layer comprises a thermoplastic resin, a material with a perovskite structure, and optionally conductive particles; wherein the material with a perovskite structure has a chemical formula selected from $ABX_3$ and $A_2BX_6$; wherein A is a cation, B is a cation and X is an anion; and wherein the thermoplastic resin comprises a copolymer of an alkylene monomer and an ethylenically unsaturated monomer comprising an epoxide; and wherein the printed cathode comprises: a thermoplastic resin; and electrically conductive metal particles.

In some examples, the printed photovoltaic cell may further comprise an electron transport layer (ETL). The electron transport layer may be disposed between the anode and the LEP printed photovoltaic layer. The electron transport layer may comprise a metal oxide.

In some examples, the printed photovoltaic cell may further comprise a hole transport layer (HTL). In some examples, the hole transport layer may be disposed between the LEP printed photovoltaic layer and the LEP printed cathode. In some examples, the printed photovoltaic cell may comprise an electron transport layer and a hole transport layer.

In some examples, the printed photovoltaic cell may be a hole transport layer free photovoltaic cell (i.e., the printed photovoltaic cell may not comprise a hole transport layer). In some examples, the printed photovoltaic cell may be a hole transport layer free photovoltaic cell and the LEP printed photovoltaic layer may be in contact with the LEP printed cathode.

In some examples, the printed photovoltaic cell may further comprise a supporting material on which the anode is disposed.

Figure 1:
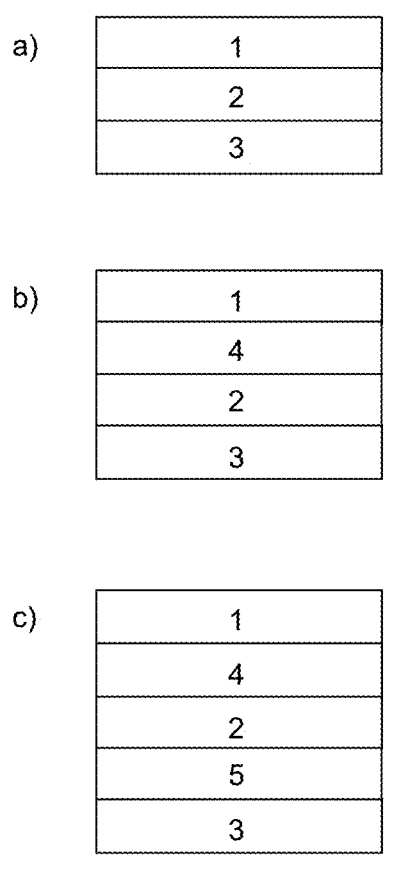

FIG. 1 shows schematic illustrations of example printed photovoltaic cells. FIG. 1a shows, schematically, a printed photovoltaic cell comprising an anode (1); a liquid electrophotographically printed cathode (3); and a liquid electrophotographically printed photovoltaic layer (2) disposed between the anode (1) and the cathode (3). In some examples, the anode (1) may be disposed on a supporting material (not shown).

FIG. 1b shows, schematically, a printed photovoltaic cell further comprising an electron transport layer (4) disposed between the anode (1) and the liquid electro-photographically printed photovoltaic layer (2). Thus, FIG. 1b shows, schematically, a printed photovoltaic cell comprising an anode (1); an electron transport layer (4) disposed on the anode (1); a liquid electrophotographically printed photovoltaic layer (2) disposed on the electron transport layer (4); and a liquid electrophotographically printed cathode (3) disposed on the liquid electrophotographically printed photovoltaic layer (2). In some examples, the anode (1) may be disposed on a supporting material (not shown).

FIG. 1c shows, schematically, a printed photovoltaic cell further comprising an electron transport layer (4) and a hole transport layer (5). As shown in FIG. 1c, the electron transport layer (4) may be disposed between the anode (1) and the liquid electrophotographically printed photovoltaic layer (2) and the hole transport layer (5) may be disposed between the liquid electrophotographically printed photovoltaic layer (2) and the liquid electrophotographically printed cathode (3). Thus, FIG. 1c shows, schematically, a printed photovoltaic cell comprising an anode (1); an electron transport layer (4) disposed on the anode (1); a liquid electrophotographically printed photovoltaic layer (2) disposed on the electron transport layer (4); a hole transport layer (5) disposed on the liquid electrophotographically printed photovoltaic layer (2); and a liquid electrophotographically printed cathode (3) disposed on the hole transport layer (5). In some examples, the anode (1) may be disposed on a supporting material (not shown).

Anode

The printed photovoltaic cell may comprise an anode. In some examples, the anode may be disposed on a supporting material. In some examples, the printed photovoltaic cell may comprise a substrate comprising an anode. In some examples, the printed photovoltaic cell may comprise a substrate comprising or consisting of an anode. In some examples, the substrate comprising an anode may comprise a supporting material and an anode, wherein the anode may be disposed on the supporting material.

In some examples, the printed photovoltaic cell may comprise any suitable anode, for example, any suitable transparent anode.

In some examples, the anode may be transparent. In some examples, the substrate comprising the anode may be transparent. In some examples, the anode may be the layer through which light passes before contacting the LEP printed photovoltaic layer. In some examples, substantially all or all light of a suitable wavelength to interact with the LEP printed photovoltaic layer passes through the anode or the substrate comprising an anode. In some examples, substantially all light of the suitable wavelength may mean at least 95%, for examples, at least 99% of the light of the suitable wavelength. In some examples, the suitable wavelength may be the wavelength or wavelength range that interacts with the material with a perovskite structure.

In some examples, the anode may be flexible. In some examples, the substrate comprising an anode may be flexible. In some examples, the substrate may be flexible.

In some examples, the anode may comprise or consist of indium tin oxide (ITO), fluorine doped tin oxide (FTO), silver nanowires, poly(3,4-ethylenedioxythiophene) (PEDOT), metal mesh, graphene or carbon nanotubes. In some examples, the anode may comprise or consist of indium tin oxide (ITO). In some examples, the substrate comprising an anode may comprise a supporting material and an anode comprising or consisting of indium tin oxide or fluorine doped tin oxide, silver nanowires, poly(3,4-ethylenedioxythiophene) (PEDOT), metal mesh, graphene or carbon nanotubes. In some examples, the substrate comprising an anode may comprise a supporting material and an anode comprising or consisting of indium tin oxide.

In some examples, the supporting material may be glass or plastic. In some examples, the plastic may be polyethylene terephthalate.

In some examples, the photovoltaic cell may comprise indium tin oxide coated polyethylene terephthalate (PET-ITO), wherein the anode comprises or consists of the indium tin oxide.

In some examples, the anode has a thickness of at least about 50 nm, for example, at least about 55 nm, at least about 60 nm, at least about 65 nm, at least about 70 nm, at least about 75 nm, at least about 80 nm, at least about 85 nm, at least about 90 nm, at least about 95 nm, or at least about 100 nm. In some examples, the anode has a thickness of up to about 100 nm, for example, up to about 95 nm, up to about 90 nm, up to about 85 nm, up to about 80 nm, up to about 75 nm, up to about 70 nm, up to about 65 nm, up to about 60 nm, up to about 55 nm, or up to about 50 nm. In some examples, the anode has a thickness of from about 50 nm to about 100 nm, for example, about 55 nm to about 100 nm, about 60 nm to about 95 nm, about 65 nm to about 90 nm, about 70 nm to about 85 nm, or about 75 nm to about 80 nm.

In some examples, the supporting material, on which the anode may be disposed, may have a thickness of at least about 12 µm, for example, at least about 15 µm, at least about 20 µm, at least about 30 µm, at least about 40 µm, at least about 50 µm, at least about 60 µm, at least about 70 µm, at least about 80 µm, at least about 90 µm, at least about 100 µm, at least about 110 µm, at least about 120 µm, at least about 130 µm, at least about 140 µm, at least about 150 µm, at least about 160 µm, at least about 170 µm, at least about 180 µm, at least about 190 µm, or at least about 200 µm. In some examples, the supporting material, on which the anode may be disposed, may have a thickness of up to about 200 µm, for example, up to about 190 µm, up to about 180 µm, up to about 170 µm, up to about 160 µm, up to about 150 µm, up to about 140 µm, up to about 130 µm, up to about 120 µm, up to about 110 µm, up to about 100 µm, up to about 90 µm, up to about 80 µm, up to about 70 µm, up to about 60 µm, up to about 50 µm, up to about 40 µm, up to about 30 µm, up to about 20 µm, up to about 15 µm, or up to about 12 µm. In some examples, the supporting material, on which the anode may be disposed, may have a thickness of from about 12 µm to about 200 µm, for example, about 15 µm to about 195 µm, about 20 µm to about 200 µm, about 30 µm to about 190 µm, about 40 µm to about 180 µm, about 50 µm to about 170 µm, about 60 µm to about 160 µm, about 70 µm to about 150 µm, about 80 µm to about 140 µm, about 90 µm to about 130 µm, about 100 µm to about 120 µm, or about 110 µm to about 120 µm.

Liquid Electrophotographically Printed Photovoltaic Layer

The printed photovoltaic cell may comprise a liquid electrophotographically printed photovoltaic layer. The liquid electrophotographically printed photovoltaic layer may be referred to herein as the photovoltaic layer or the printed photovoltaic layer.

The liquid electrophotographically printed photovoltaic layer may be formed or may have been formed by liquid electrophotographically printing a liquid electrophotographic photovoltaic ink composition. The liquid electrophotographically printed photovoltaic layer may be formed or may have been formed by liquid electrophotographically printing any liquid electrophotographic photovoltaic ink composition described herein. In some examples, during printing, the liquid carrier of the LEP photovoltaic ink composition may have been removed, for example, by an electrophoresis process during printing and/or by evaporation, such that the liquid electrophotographically printed photovoltaic layer comprises just (or substantially just) the solids of the LEP photovoltaic ink composition. The printed photovoltaic layer may be substantially free from, or free from, liquid carrier.

In some examples, the printed photovoltaic cell comprises a liquid electrophotographically printed photovoltaic layer, wherein the liquid electrophotographically printed photovoltaic layer comprises a thermoplastic resin, a material with a perovskite structure, and, in some examples, conductive particles. In some examples, the printed photovoltaic cell comprises a liquid electrophotographically printed photovoltaic layer, wherein the liquid electrophotographically printed photovoltaic layer comprises a thermoplastic resin, a material with a perovskite structure, and optionally conductive particles, wherein the material with a perovskite structure has a chemical formula selected from $ABX_3$ and $A_2BX_6$; wherein A is a cation, B is a cation and X is an anion; and wherein the thermoplastic resin comprises a copolymer of an alkylene monomer and a monomer having acidic side groups; and/or a copolymer of an alkylene monomer and an ethylenically unsaturated monomer comprising an epoxide; and/or a copolymer of an alkylene monomer, an ethylenically unsaturated monomer comprising an epoxide, and a monomer selected from a monomer having acidic side groups, a monomer having ester side groups and a mixture thereof. In some examples, the printed photovoltaic cell comprises a liquid electrophotographically printed photovoltaic layer, wherein the liquid electrophotographically printed photovoltaic layer comprises a thermoplastic resin, a material with a perovskite structure, and optionally conductive particles, wherein the material with a perovskite structure has a chemical formula selected from $ABX_3$ and $A_2BX_6$; wherein A is a cation, B is a cation and X is an anion; and wherein the thermoplastic resin comprises a copolymer of an alkylene monomer and an ethylenically unsaturated monomer comprising an epoxide.

In some examples, A is selected from a monovalent metal cation, a monovalent organic cation, or a mixture thereof; and/or B is a divalent metal cation or a tetravalent metal cation; and/or X is a halide ion. In some examples, X is a halide ion, for example, selected from iodide, bromide, chloride and mixtures thereof; and/or A is selected from methylammonium (MA), formamidinium (FA), rubidium (Rb), caesium (Cs), and mixtures thereof; and/or B is selected from lead (Pb), germanium (Ge), tin (Sn), antimony (Sb), bismuth (Bi), copper (Cu), manganese (Mn), cobalt (Co) and mixtures thereof.

In some examples, during or after printing, the thermoplastic resin of the photovoltaic layer is cured. Thus, the liquid electrophotographically printed photovoltaic layer (i.e., the photovoltaic layer) may comprise a cured thermoplastic resin. In some examples, the thermoplastic resin comprises a copolymer of an alkylene monomer and a monomer comprising an epoxide and/or a copolymer of an alkylene monomer, an ethylenically unsaturated monomer comprising an epoxide, and a monomer selected from a monomer having acidic side groups, a monomer having ester side groups and a mixture thereof; and the thermoplastic resin is cured during or after printing.

In some examples, during curing, the epoxide reacts. In some examples, the epoxide reacts by a ring-opening reaction or a cross-linking reaction. In some examples, the photovoltaic layer may comprise a thermoplastic resin comprising a copolymer of an alkylene monomer and an ethylenically unsaturated monomer comprising an epoxide; and/or a copolymer of an alkylene monomer, an ethylenically unsaturated monomer comprising an epoxide, and a monomer selected from a monomer having acidic side groups, a monomer having ester side groups and a mixture thereof, wherein the thermoplastic resin has been cured. In some examples, the photovoltaic layer may comprise a thermoplastic resin comprising a copolymer of an alkylene monomer and an ethylenically unsaturated monomer comprising an epoxide; wherein the thermoplastic resin has been cured, for example, by a ring-opening reaction of the epoxide and/or a cross-linking reaction of the epoxide and/or a copolymer of an alkylene monomer, an ethylenically unsaturated monomer comprising an epoxide, and a monomer selected from a monomer having acidic side groups, a monomer having ester side groups and a mixture thereof; wherein the thermoplastic resin has been cured, for example, by a ring-opening reaction of the epoxide and/or a cross-linking reaction of the epoxide. In some examples, the photovoltaic layer may comprise a thermoplastic resin comprising a copolymer of an alkylene monomer and an ethylenically unsaturated monomer comprising an epoxide, wherein the thermoplastic resin has been cured, for example, by a ring-opening reaction of the epoxide and/or a cross-linking reaction of the epoxide.

In some examples, the cross-linking reaction of the epoxide may be a reaction between the epoxide of the thermoplastic resin of the LEP photovoltaic ink composition and/or the photovoltaic layer and an acid, for example, a carboxylic acid, of the thermoplastic resin of the electrically conductive LEP ink composition and/or the liquid electrophotographically printed cathode.

In some examples, the printed photovoltaic layer may have a thickness of at least about 0.5 µm, for example, at least about 0.6 µm, at least about 0.7 µm, at least about 0.8 µm, at least about 0.9 µm, at least about 1 µm, at least about 1.1 µm, at least about 1.2 µm, at least about 1.3 µm, at least about 1.4 µm, at least about 1.5 µm, at least about 1.6 µm, at least about 1.7 µm, at least about 1.8 µm, at least about 1.9 µm, or at least about 2 µm. In some examples, the printed photovoltaic layer may have a thickness of up to about 2 µm, for example, up to about 1.9 µm, up to about 1.8 µm, up to about 1.7 µm, up to about 1.6 µm, up to about 1.5 µm, up to about 1.4 µm, up to about 1.3 µm, up to about 1.2 µm, up to about 1.1 µm, up to about 1 µm, up to about 0.9 µm, up to about 0.8 µm, up to about 0.7 µm, or up to about 0.6 µm, or up to about 0.5 µm. In some examples, the printed photovoltaic layer may have a thickness of from about 0.5 µm to about 2 µm, for example, about 0.6 µm to about 1.9 µm, about 0.7 µm to about 1.8 µm, about 0.8 µm to about 1.7 µm, about 0.9 µm to about 1.6 µm, about 1 µm to about 1.6 µm, about 1.1 µm to about 1.5 µm, about 1.2 µm to about 1.4 µm, about 1.3 µm to about 2 µm.

Cathode

The printed photovoltaic cell may comprise a cathode. The cathode may comprise any conductive layer in contact with the liquid electrophotographically printed photovoltaic layer. In some examples, the cathode may comprise any conductive layer deposited onto the LEP printed photovoltaic layer. In some examples, the cathode may comprise or consist of a printed cathode, for example, a liquid electrophotographically printed cathode.

Liquid Electrophotographically Printed Cathode

The printed photovoltaic cell may comprise a liquid electrophotographically printed cathode. The liquid electrophotographically printed cathode may be referred to herein as the cathode or the printed cathode.

The liquid electrophotographically printed cathode may be formed or may have been formed by liquid electrophotographically printing an electrically conductive liquid electrophotographic ink composition. The liquid electrophotographically printed cathode may be formed or may have been formed by liquid electrophotographically printing any electrically conductive liquid electrophotographic ink composition described herein. In some examples, during printing, the liquid carrier of the electrically conductive LEP ink composition may have been removed, for example, by an electrophoresis process during printing and/or by evaporation, such that the liquid electrophotographically printed cathode comprises just (or substantially just) the solids of the electrically conductive LEP ink composition. The printed cathode may be substantially free from or free from liquid carrier.

In some examples, the printed photovoltaic cell comprises a liquid electrophotographically printed cathode, wherein the liquid electrophotographically printed cathode comprises a thermoplastic resin; and electrically conductive metal particles.

In some examples, the printed photovoltaic cell comprises a liquid electrophotographically printed cathode, wherein the liquid electrophotographically printed cathode comprises a thermoplastic resin; and electrically conductive metal particles, wherein the electrically conductive metal particles comprise a core comprising a first metal and a shell comprising a second metal; wherein the shell at least partially encloses the core and wherein the first metal is different from the second metal. In some examples, the first metal is selected from copper, titanium, chromium, iron, manganese, nickel, and combinations thereof; and/or wherein the second metal is selected from silver, gold, platinum, rhodium, iridium, and combinations thereof. The shell may completely encloses the core; and/or the second metal may comprise from about 10 wt. % to about 40 wt. % of the total weight of the metal particles.

In some examples, the printed cathode may have a thickness of at least about 1 µm, for example, at least about 2 µm, at least about 3 µm, at least about 4 µm, at least about 5 µm, at least about 6 µm, at least about 7 µm, at least about 8 µm, at least about 9 µm, at least about 10 µm, at least about 11 µm, at least about 12 µm, at least about 13 µm, at least about 14 µm, at least about 15 µm, at least about 16 µm, at least about 17 µm, at least about 18 µm, at least about 19 µm, or at least about 20 µm. In some examples, the printed cathode may have a thickness of up to about 20 µm, for example, up to about 19 µm, up to about 18 µm, up to about 17 µm, up to about 16 µm, up to about 15 µm, up to about 14 µm, up to about 13 µm, up to about 12 µm, up to about 11 µm, up to about 10 µm, up to about 9 µm, up to about 8 µm, up to about 7 µm, up to about 6 µm, up to about 5 µm, up to about 4 µm, up to about 3 µm, up to about 2 µm, or up to about 1 µm. In some examples, the printed cathode may have a thickness of from about 1 µm to about 20 µm, for example, about 2 µm to about 20 µm, about 3 µm to about 19 µm, about 4 µm to about 18 µm, about 5 µm to about 17 µm, about 6 µm to about 16 µm, about 7 µm to about 15 µm, about 8 µm to about 14 µm, about 9 µm to about 13 µm, about 10 µm to about 12 µm, or about 11 µm to about 12 µm.

Electron Transport Layer

The printed photovoltaic cell may further comprise an electron transport layer. In some examples, the electron transport layer may be disposed between the anode and the liquid electrophotographically printed photovoltaic layer.

The electron transport layer may be any layer capable of functioning as an electrical filter. The electron transport layer may be any layer capable of allowing the transfer of electrons but not holes from the printed photovoltaic layer to the anode. The printed photovoltaic layer creates both electrons and holes when the perovskite crystals are illuminated.

The electron transport layer may comprise or consist of a metal oxide. In some examples, the metal oxide may be selected from alumina ($Al_2O_3$), zinc oxide (ZnO), tin oxide ($SnO_2$), titanium dioxide (i.e., titanium (IV) oxide; $TiO_2$), $WO_3$, $(CH_3)_2Sn(COOH)_2$, $SiO_2$, or $ZrO_2$. In some examples, the electron transport layer may comprise or consist of zinc oxide.

In some examples, the electron transport layer may be formed or may have been formed by a chemical deposition method or a physical deposition method. The chemical deposition method may be selected from chemical vapour deposition (CVD), atomic layer deposition (ALD), and sol-gel processes. The physical deposition method may be selected from sputtering, pulsed laser deposition, and spray pyrolysis.

In some examples, the electron transport layer may be formed or may have been formed by the process described herein, for example, by deposition of a metal oxide from an organic solvent.

In some examples, the electron transport layer, for example, the electron transport layer comprising a metal oxide, has a thickness of at least about 50 nm, for example, at least about 60 nm, at least about 70 nm, at least about 80 nm, at least about 90 nm, or at least about 100 nm. In some examples, the electron transport layer, for example, the electron transport layer comprising a metal oxide, has a thickness of up to about 100 nm, for example, up to about 90 nm, up to about 80 nm, up to about 70 nm, up to about 60 nm, or up to about 50 nm. In some examples, the electron transport layer, for example, the electron transport layer comprising a metal oxide, may have a thickness of from about 50 nm to about 100 nm, for example, from about 60 nm to about 90 nm, or from about 70 nm to about 80 nm. In some examples, the thickness of the electron transport layer may be measured using standard procedures known in the art, for example, scanning electron microscopy with energy dispersive spectroscopy (SEM-EDS).

Hole Transport Layer

The printed photovoltaic cell may further comprise a hole transport layer. In some examples, the hole transport layer may be disposed between the liquid electrophotographically printed photovoltaic layer and the liquid electrophotographically printed cathode.

The hole transport layer may be any layer capable of functioning as a hole filter. The hole transport layer may be any layer capable of allowing the transfer of holes but not electrons from the printed photovoltaic layer.

The hole transport layer may comprise an inorganic hole transport layer material or an organic hole transport layer material. In some examples, the hole transport layer may comprise $N^2,N^2,N^{2'},N^{2'},N^7,N^7,N^{7'},N^{7'}$-octakis(4-methoxyphenyl)-9,9'-spirobi[9H-fluorene]-2,2',7,7'-tetramine (spiro-MeOTAD), poly(3,4-ethylenedioxythiophene) polystyrene sulfonate (PEDOT:PSS), poly[bis(4-phenyl)(2,4,6-trimethylphenyl)amine] (PTAA), $NiO_x$, CuI, CuSCN, CuS, $Cu_xO$. In some examples, the hole transport layer may comprise $N^2,N^2,N^{2'},N^{2'},N^7,N^7,N^{7'},N^{7'}$-octakis(4-methoxyphenyl)-9, 9'-spirobi[9H-fluorene]-2,2',7,7'-tetramine (spiro-MeO-TAD).

In some examples, the hole transport layer may be formed or may have been formed by spin coating, thermal evaporation or chemical vapour deposition.

In some examples, the hole transport layer may have a thickness of at least about 2 nm, for example, at least about 5 nm, at least about 10 nm, at least about 50 nm, at least about 100 nm, at least about 150 nm, at least about 200 nm, at least about 250 nm, or at least about 300 nm. In some examples, the hole transport layer may have a thickness of up to about 300 nm, for example, up to about 250 nm, up to about 200 nm, up to about 150 nm, up to about 100 nm, up to about 50 nm, up to about 10 nm, up to about 5 nm, or up to about 2 nm. In some examples, the hole transport layer may have a thickness of from about 2 nm to about 300 nm, for example, about 5 nm to about 250 nm, 10 nm to about 200 nm, 50 nm to about 150 nm, about 100 nm to about 300 nm.

Method of Producing a Printed Photovoltaic Cell

In another aspect, there is provided a method of producing a printed photovoltaic cell. The method of producing a printed photovoltaic cell may comprise printing a liquid electrophotographic photovoltaic ink composition onto a substrate comprising an anode or a cathode to form a liquid electrophotographically printed photovoltaic layer; and applying a composition to form a cathode or an anode, respectively; wherein the printed photovoltaic layer is disposed between the cathode and the anode. The method of producing a printed photovoltaic cell may comprise printing a liquid electrophotographic photovoltaic ink composition onto a substrate comprising an anode to form a liquid electrophotographically printed photovoltaic layer; and applying a composition to form a cathode; wherein the printed photovoltaic layer is disposed between the cathode and the anode.

The method of producing a printed photovoltaic cell may comprise printing a liquid photographic photovoltaic ink composition onto a substrate comprising an anode to form a liquid electrophotographically printed photovoltaic layer; and printing an electrically conductive composition to form a printed cathode; wherein the printed photovoltaic layer is disposed between the anode and the cathode. The method of producing a printed photovoltaic cell may comprise printing a liquid electrophotographic photovoltaic ink composition onto a substrate comprising an anode to form a liquid electrophotographically printed photovoltaic layer; and printing an electrically conductive liquid electrophotographic ink composition to form a liquid electrophotographically printed cathode; wherein the printed photovoltaic layer is disposed between the anode and the printed cathode.

In some examples, the method of producing a printed photovoltaic cell may comprise printing any LEP photovoltaic ink composition described herein onto a substrate comprising an anode to form a printed photovoltaic layer; and printing any electrically conductive LEP ink composition described herein to form a printed cathode; wherein the printed photovoltaic layer is disposed between the anode and the printed cathode.

In some examples, the method of producing a printed photovoltaic cell may comprise printing a liquid electrophotographic photovoltaic ink composition onto a substrate comprising an anode to form a liquid electrophotographically printed photovoltaic layer; and printing an electrically conductive liquid electrophotographic ink composition to form a liquid electrophotographically printed cathode; wherein the printed photovoltaic layer is disposed between the anode and the printed cathode; wherein the photovoltaic ink composition comprises a dispersion of a material with a perovskite structure, a thermoplastic resin, and optionally, conductive particles, in a carrier liquid; wherein the material with a perovskite structure has a chemical formula selected from $ABX_3$ and $A_2BX_6$; wherein A is a cation, B is a cation and X is an anion; wherein the thermoplastic resin comprises a copolymer of an alkylene monomer and a monomer having acidic side groups; and/or a copolymer of an alkylene monomer and an ethylenically unsaturated monomer comprising an epoxide; and/or a copolymer of an alkylene monomer, an ethylenically unsaturated monomer comprising an epoxide, and a monomer selected from a monomer having acidic side groups, a monomer having ester side groups and a mixture thereof; wherein the electrically conductive ink composition comprises: a liquid carrier; and particles comprising a thermoplastic resin and electrically conductive metal particles. In some examples, the electrically conductive metal particles comprise a core comprising a first metal and a shell comprising a second metal; wherein the shell at least partially encloses the core and wherein the first metal is different from the second metal. In some examples, the thermoplastic resin of the photovoltaic ink composition comprises a copolymer of an alkylene monomer and an ethylenically unsaturated monomer comprising an epoxide.

In some examples, the substrate comprises an anode and a supporting material, wherein the anode may be disposed on the supporting material. In some examples, the method further comprises depositing an electrically conductive material on a supporting material to form the substrate comprising an anode disposed on a supporting material.

In some examples, the printed photovoltaic cell further comprises an electron transport layer, wherein the electron transport layer is disposed between the anode and the printed photovoltaic layer. In some examples, the substrate further comprises an electron transport layer disposed on the anode. In some examples, the substrate comprising an electron transport layer disposed on the anode is produced by depositing an electron transport composition on the anode. In some examples, the method of producing a photovoltaic cell further comprises producing an electron transport layer disposed on the anode. In some examples, the electron transport layer may be produced by depositing an electron transport composition on the anode to produce a substrate comprising an anode and an electron transport layer.

In some examples, the electron transport composition may be deposited on the anode by a chemical deposition method or a physical deposition method. In some examples, the chemical deposition method may be selected from chemical vapour deposition (CVD), atomic layer deposition (ALD), and sol-gel processes. In some examples, the physical deposition method may be selected from sputtering, pulsed layer deposition, and spray pyrolysis.

In some examples, the electron transport composition may be deposited on the anode by deposition of a metal oxide from an organic solvent, for example, by an analogue printing technique. In some examples, the organic solvent may be a diol. In some examples, the diol may be selected from ethylene glycol, propylene glycol, butanediol, pentanediol and hexanediol. In some examples, the electron transport composition may be deposited on the anode by the method of producing an electron transport layer described below.

In some examples, the method of producing a printed photovoltaic cell comprises depositing an electron transport composition on an anode to form a substrate comprising an anode and an electron transport layer disposed on the anode; printing an LEP photovoltaic ink composition onto the substrate to form a liquid electrophotographically printed photovoltaic layer, which may be disposed on the electron transport layer of the substrate; and applying a composition to form a cathode (for example, printing an electrically conductive LEP ink composition to form a liquid electrophotographically printed cathode); wherein the printed photovoltaic layer is disposed between the substrate and the cathode (for example, the printed cathode).

In some examples, printing an LEP photovoltaic ink composition onto the substrate to form the photovoltaic layer comprises contacting the LEP photovoltaic ink composition with a latent electrostatic image on a surface to create a developed image and transferring the developed image to the substrate, in some examples, via an intermediate transfer member.

In some examples, printing an electrically conductive LEP ink composition to form the printed cathode comprises contacting the electrically conductive LEP ink composition with a latent electrostatic image on a surface to create a developed image and transferring the developed image to a substrate, in some examples, via an intermediate transfer member.

In some examples, the surface on which the (latent) electrostatic image(s) is(are) formed or developed may be a rotating member, for example, in the form of a cylinder. The surface on which the (latent) electrostatic image(s) is(are) formed or developed may form a part of a photo imaging plate (PIP). The method may involve passing the ink composition (e.g., the LEP photovoltaic ink composition or the electrically conductive LEP ink composition) between a stationary electrode and a rotating member, which may be a member having the surface having the (latent) electrostatic image thereon or a member in contact with the surface having the (latent) electrostatic image thereon. A voltage is applied between the stationary electrode and the rotating member, such that particles adhere to the surface of the rotating member. The intermediate transfer member, if present, may be a rotating flexible member, which may be heated, for example, to a temperature of from 80 to 160° C.

In some examples, printing (i.e., liquid electrophotographically printing) a composition onto the substrate comprises contacting the composition with a latent electrostatic image on a surface to create a developed image and transferring the developed image to the substrate, in some examples, via an intermediate transfer member and then curing the developed image on the substrate. In some examples, curing the developed image may comprise heating the developed image. In some examples, curing of the photovoltaic layer may be performed after the electrically conductive LEP ink composition has been printed. In some examples, the method of producing a printed photovoltaic cell further comprises curing the thermoplastic resin of the printed photovoltaic layer, for example, by heating at least the printed photovoltaic layer.

In some examples, the printed photovoltaic layer may be cured by heating at a temperature of at least about 110° C., for example, at least about 115° C., at least about 120° C., at least about 125° C., at least about 130° C., at least about 135° C., at least about 140° C., at least about 145° C., or at least about 150° C. In some examples, the printed photovoltaic layer may be cured by heating at a temperature of up to about 150° C., for example, up to about 145° C., up to about 140° C., up to about 135° C., up to about 130° C., up to about 125° C., up to about 120° C., up to about 115° C., up to about 110° C., up to about 105° C., or up to about 100° C. In some examples, the printed photovoltaic layer may be cured by heating at a temperature of from about 100° C. to about 150° C., for example, about 115° C. to about 150° C., about 120° C. to about 145° C., about 125° C. to about 140° C., or about 130° C. to about 135° C.

In some examples, the method of producing a printed photovoltaic cell comprises printing (i.e., liquid electrophotographically printing) an LEP photovoltaic ink composition onto a substrate comprising an anode to form a liquid electrophotographically printed photovoltaic layer; and printing (i.e., liquid electrophotographically printing) an electrically conductive LEP ink composition onto the printed photovoltaic layer to form a liquid electrophotographically printed cathode disposed on the printed photovoltaic layer.

In some examples, the method further comprises depositing a hole transport composition onto the printed photovoltaic layer to form a hole transport layer before printing the electrically conductive LEP ink composition, which may then be printed onto the hole transport layer to form the printed cathode.

In some examples, the method of producing a printed photovoltaic cell comprises: (1) optionally, depositing an anode onto a supporting material to form a substrate comprising an anode; (2) optionally, depositing an electron transport composition on the anode to form a substrate comprising an anode and an electron transport layer disposed on the anode; (3) printing an LEP photovoltaic ink composition onto a substrate comprising an anode (and optionally comprising an electron transport layer disposed on the anode) to form a liquid electrophotographically printed photovoltaic layer disposed on the substrate; (4) optionally, depositing a hole transport composition onto the printed photovoltaic layer to form a hole transport layer; and (5) applying a composition onto the printed photovoltaic layer (or, if present, onto the hole transport layer). In some examples, the method of producing a printed photovoltaic cell comprises: (1) optionally, depositing an anode onto a supporting material to form a substrate comprising an anode; (2) optionally, depositing an electron transport composition on the anode to form a substrate comprising an anode and an electron transport layer disposed on the anode; (3) printing an LEP photovoltaic ink composition onto a substrate comprising an anode (and optionally comprising an electron transport layer disposed on the anode) to form a liquid electrophotographically printed photovoltaic layer disposed on the substrate; (4) optionally, depositing a hole transport composition onto the printed photovoltaic layer to form a hole transport layer; and (5) printing an electrically conductive LEP ink composition onto the printed photovoltaic layer (or, if present, onto the hole transport layer).

In some examples, the method of producing a photovoltaic cell further comprises curing the thermoplastic resin of the printed photovoltaic layer (which may be referred to as the PV resin). In some examples, the PV thermoplastic resin is cured by heat treatment. In some examples, curing of the PV thermoplastic resin comprises causing the epoxide to react, for example, by initiating a ring-opening reaction and/or a cross-linking reaction of the epoxide.

In some examples, curing the PV thermoplastic resin by heat treatment comprises raising the temperature to a temperature of at least about 100° C., for example, at least about 110° C., at least about 120° C., at least about 130° C., at least about 140° C., or at least about 150° C. In some examples, curing the PV thermoplastic resin by heat treatment comprises raising the temperature to a temperature of up to about 150° C., for example, up to about 140° C., up to about 130° C., up to about 120° C., up to about 110° C., or up to about 100° C. In some examples, curing the PV thermoplastic resin by heat treatment comprises raising the temperature to a temperature of from about 100° C. to about 150° C., for example, from about 100° C. to about 140° C., from about 110° C. to about 130° C., or from about 120° C. to about 150° C. In some examples, curing the PV thermoplastic resin by heat treatment may reduce the thickness of the photovoltaic layer. In some examples, the thickness of the LEP printed photovoltaic layer comprising a cured thermoplastic resin (e.g., comprising a cured epoxide) may be about % the thickness of an LEP printed photovoltaic layer comprising a thermoplastic resin comprising a copolymer of an alkylene monomer and a monomer having acidic side groups.

In some examples, before printing the LEP photovoltaic ink composition, the method further comprises producing the LEP photovoltaic ink composition. In some examples, LEP photovoltaic ink composition was formed by combining a liquid electrophotographic ink composition comprising a dispersion of a salt AX and a thermoplastic resin in a carrier liquid with a liquid electrophotographic ink composition comprising a dispersion of a salt selected from $BX_2$ and $BX_4$ and a thermoplastic resin in a carrier liquid; or dispersing a salt AX, a salt selected from $BX_2$ and $BX_4$, and a thermoplastic resin in a carrier liquid. In some examples, the LEP photovoltaic ink composition was formed by dispersing a salt AX, a salt selected from $BX_2$ and $BX_4$, and a thermoplastic resin in a carrier liquid. In some examples, LEP photovoltaic ink composition was formed by combining a liquid electrophotographic ink composition comprising a dispersion of a salt AX, a thermoplastic resin and conductive particles in a carrier liquid with a liquid electrophotographic ink composition comprising a dispersion of a salt selected from $BX_2$ and $BX_4$ and a thermoplastic resin in a carrier liquid; or dispersing a salt AX, a salt selected from $BX_2$ and $BX_4$, a thermoplastic resin and conductive particles in a carrier liquid. In some examples, LEP photovoltaic ink composition was formed by combining a liquid electrophotographic ink composition comprising a dispersion of a salt AX and a thermoplastic resin in a carrier liquid with a liquid electrophotographic ink composition comprising a dispersion of a salt selected from $BX_2$ and $BX_4$, a thermoplastic resin and conductive particles in a carrier liquid; or dispersing a salt AX, a salt selected from $BX_2$ and $BX_4$, a thermoplastic resin and conductive particles in a carrier liquid. In some examples, LEP photovoltaic ink composition was formed by combining conductive particles with a liquid electrophotographic ink composition comprising a dispersion of a salt AX and a thermoplastic resin in a carrier liquid and with a liquid electrophotographic ink composition comprising a dispersion of a salt selected from $BX_2$ and $BX_4$ and a thermoplastic resin in a carrier liquid; or dispersing a salt AX, a salt selected from $BX_2$ and $BX_4$, a thermoplastic resin and conductive particles in a carrier liquid. In some examples, the LEP photovoltaic ink composition was formed by dispersing a salt AX, a salt selected from $BX_2$ and $BX_4$, a thermoplastic resin and conductive particles in a carrier liquid.

In some examples, before printing the electrically conductive LEP ink composition, the method further comprises producing the electrically conductive LEP ink composition.

Method of Producing the Liquid Electrophotographic Ink Composition Comprising AX In some examples, the method of producing a liquid electrophotographic ink composition comprising a dispersion of a salt AX and a thermoplastic resin in a carrier liquid comprises combining the salt AX, the thermoplastic resin and the carrier liquid. In some examples, the method of producing the liquid electrophotographic ink composition comprising a dispersion of a salt AX and a thermoplastic resin in a carrier liquid comprises dispersing a salt AX and a thermoplastic resin in a carrier liquid.

In some examples, the method further comprises adding conductive particles to the dispersion. In some examples, the conductive particles may be added at any stage in the method. For example, the conductive particles may be added to the carrier liquid before or after the salt AX, the thermoplastic resin and the carrier liquid are combined. In some examples, the method of producing a liquid electrophotographic ink composition comprising a dispersion of a salt AX, a thermoplastic resin and conductive particles in a carrier liquid comprises combining the salt AX, the thermoplastic resin, conductive particles and the carrier liquid. In some examples, the method of producing a liquid electrophotographic ink composition comprising a dispersion of a salt AX, a thermoplastic resin and conductive particles in a carrier liquid comprises combining the salt AX, the thermoplastic resin, conductive particles and the carrier liquid and grinding.

In some examples, the method of producing a liquid electrophotographic ink composition comprising a dispersion of a salt AX and a thermoplastic resin in a carrier liquid may comprise combining the thermoplastic resin with the carrier liquid before adding the salt AX to the combined thermoplastic resin and carrier liquid. In some examples, the method of producing a liquid electrophotographic ink composition comprising a dispersion of a salt AX and a thermoplastic resin in a carrier liquid may comprise dispersing the thermoplastic resin in the carrier liquid before adding the salt AX to the dispersion of the thermoplastic resin in the carrier liquid. In some examples, conductive particles may be added to the carrier liquid before, during or after combining the carrier liquid with the thermoplastic resin.

In some examples, combining the salt AX with the thermoplastic resin and the carrier liquid may comprise grinding the salt AX and the thermoplastic resin in the presence of the carrier liquid and optionally the conductive particles.

In some examples, the method of producing a liquid electrophotographic ink composition comprising a dispersion of a salt AX and a thermoplastic resin in a carrier liquid may comprise adding a charge adjuvant to the liquid electrophotographic ink composition. In some examples, the charge adjuvant may be added to the liquid electrophotographic ink composition before, during or after the salt AX, the thermoplastic resin and the carrier liquid are combined. In some examples, the charge adjuvant may be added to the liquid electrophotographic ink composition before, during or after addition of the salt AX to the combined thermoplastic resin and carrier liquid (and, if present, the conductive particles). In some examples, the conductive particles may be added before, during or after the addition of the charge adjuvant. In some examples, the conductive particles are added before the addition of the charge adjuvant.

In some examples, the method of producing a liquid electrophotographic (LEP) ink composition comprising a dispersion of a salt AX and a thermoplastic resin in a carrier liquid may comprise adding a charge director to the liquid electrophotographic ink composition. In some examples, the charge director may be added to the liquid electrophotographic ink composition before, during or after the salt AX, the thermoplastic resin and the carrier liquid are combined. In some examples, the charge director may be added to the liquid electrophotographic ink composition before, during or after addition of the salt AX to the combined thermoplastic resin and carrier liquid. In some examples, the charge director may be added to the liquid electrophotographic ink composition before, during or after the charge adjuvant is added to the liquid electrophotographic ink composition. In some examples, the conductive particles may be added before, during or after the addition of the charge director. In some examples, the conductive particles are added before the addition of the charge director.

In some examples, the method of producing an LEP ink composition may comprise suspending a thermoplastic resin in a carrier liquid before adding the salt AX. In some examples, the method may comprise suspending a first thermoplastic resin and a second thermoplastic resin in a carrier liquid. In some examples, the LEP ink composition comprises chargeable particles comprising a first thermoplastic resin and a second thermoplastic resin. In some examples, the method of producing an LEP ink composition may comprise suspending chargeable particles comprising a first thermoplastic resin and a second thermoplastic resin in a carrier liquid.

In some examples, the method of producing an LEP ink composition may comprise dispersing a first thermoplastic resin and a second thermoplastic resin in a carrier liquid. In some examples, the method of producing an LEP ink composition may comprise dispersing chargeable particles comprising a first thermoplastic resin and a second thermoplastic resin in a carrier liquid.

In some examples, the method of producing an LEP ink composition may comprise combining a thermoplastic resin (for example, the first thermoplastic resin) with the carrier liquid and subsequently adding the other resin (for example, the second resin). In some examples, the method of producing an LEP ink composition comprises combining a resin (for example, the first resin) with the carrier liquid to form a paste and subsequently adding the other resin (for example, the second resin). In some examples, the resin and the carrier liquid are combined and heated to an elevated temperature before adding the other resin, which may have also been heated to an elevated temperature. In some examples, the resin and the carrier liquid are combined and heated to a temperature above the melting point of the resin before adding the other resin, which may have also been heated to a temperature above its melting point. In some examples, the resin and carrier liquid are combined and heated until the resin has melted and/or dissolved in the carrier liquid before adding the other resin. In some examples, adding the other resin to the combined resin and carrier liquid comprises mixing the other resin with the combined resin and carrier liquid.

The melting point of the resin may be determined by differential scanning calorimetry, for example, using ASTM D3418.

In some examples, the resin and the carrier liquid are combined and heated to a temperature of at least 70° C., for example, at least 80° C., for example, at least 90° C., for example, at least 100° C., for example, at least 110° C., for example, at least 120° C., for example, 130° C., for example, to melt the resin. In some examples, the other resin is heated before being added to the combined resin and carrier liquid. In some examples, the other resin is heated to at least 30° C., in some examples, at least 40° C., in some examples, at least 45° C., in some examples, at least 50° C. before being added to the combined resin and carrier liquid. In some examples, the other resin is heated to 100° C. or less, in some examples, 90° C. or less, in some examples, 80° C. or less, in some examples, 75° C. or less, in some examples, 70° C. or less, in some examples, 60° C. or less before being added to the combined resin and carrier liquid. In some examples, the other resin is heated to reduce the viscosity of the other resin before being added to the first resin and the carrier liquid.

In some examples, the method comprises combining the first resin with the carrier liquid to form a first composition; combining the second resin with the carrier liquid to form a second composition; and subsequently combining the first composition and the second composition to form a liquid electrophotographic ink composition. In some examples, the method comprises combining the first resin with the carrier liquid to form a first paste; combining the second resin with the carrier liquid to form a second paste; and subsequently combining the first paste and the second paste to form a liquid electrophotographic ink composition. In some examples, the first resin and the carrier liquid are combined and heated to an elevated temperature to form a first heated composition; the second resin and the carrier liquid are combined and heated to an elevated temperature to form a second heated composition; and subsequently the first heated composition and the second heated composition are combined. In some examples, the first resin and the carrier liquid are combined and heated to a temperature above the melting point of the first resin to form a first heated composition; the second resin and the carrier liquid are combined and heated to a temperature above the melting point of the second resin to form a second heated composition; and subsequently the first heated composition and the second heated composition are combined. In some examples, the first composition and the second composition are heated to the same temperature, which may be a temperature above the melting temperature of all of the resins.

In some examples, the method of producing an LEP ink composition comprises mixing the first resin and the second resin together and then combining the mixture of the resins with the carrier liquid.

In some examples, the first resin and the second resin are combined with the carrier liquid and subsequently heated to an elevated temperature. In some examples, the first resin and the second resin are combined with the carrier liquid and subsequently heated to a temperature above the melting point of at least one, optionally all, of the resins. In some examples, the first resin and the second resin are combined with the carrier liquid and subsequently heated to a temperature of at least 70° C., for example, at least 80° C., for example, at least 90° C., for example, at least 100° C., for example, at least 110° C., for example, at least 120° C., for example, 130° C., for example, to melt at least one, optionally all, of the resins. In some examples, the combined first resin, second resin and carrier liquid are heated until all of the resins have melted and/or dissolved in the carrier liquid.

In some examples, the method of producing a liquid electrophotographic ink composition comprises combining a first resin, a second resin, and a carrier liquid.

In some examples, the chargeable particles comprise the first resin and the second resin.

Melting and/or dissolving a resin (or resins) in the carrier liquid may result in the carrier fluid appearing clear and homogeneous. In some examples, the resin (or resins) and carrier liquid are heated before, during or after mixing.

In some examples, the resin (or resins) and the carrier liquid are mixed at a mixing rate of 500 rpm or less, for example, 400 rpm or less, for example, 300 rpm or less, for example, 200 rpm or less, for example, 100 rpm or less, for example, 75 rpm or less, for example, 50 rpm. In some examples, mixing may continue until melting and/or dissolution of the resin (or resins) in the carrier liquid is complete.

In some examples, after combining and heating the resins and the carrier liquid, the mixture is cooled to a temperature below the melting point of the resins, for example, to room temperature. In some examples, the chargeable particles are removed from the carrier liquid and re-dispersed in a new portion of carrier liquid, which may be the same or a different carrier liquid.

In some examples, the method of producing an LEP ink composition comprises adding a salt AX to the combined first resin, second resin and carrier liquid. In some examples, the method of producing an LEP ink composition comprises adding a salt AX to the combined first resin, second resin and carrier liquid to form chargeable particles comprising the resins and a salt AX. In some examples, the method of producing an LEP ink composition comprises grinding the salt AX and the resins in the presence of the carrier liquid to form a paste. In some examples, the method of producing an LEP ink composition comprises heating and mixing the salt AX and the resins in the presence of the carrier liquid to form a paste.

In some examples, the method of producing an LEP ink composition comprises adding a salt AX and conductive particles to the combined first resin, second resin and carrier liquid. In some examples, the method of producing an LEP ink composition comprises adding a salt AX and conductive particles to the combined first resin, second resin and carrier liquid to form chargeable particles comprising the resins, conductive particles, and a salt AX. In some examples, the method of producing an LEP ink composition comprises grinding the salt AX, conductive particles and the resins in the presence of the carrier liquid to form a paste. In some examples, the method of producing an LEP ink composition comprises heating and mixing the salt AX, conductive particles and the resins in the presence of the carrier liquid to form a paste.

In some examples, the method of producing an LEP ink composition comprises adding a charge adjuvant to the combined first resin, second resin and carrier liquid and optionally grinding. In some examples, the method of producing an LEP ink composition comprises adding a charge adjuvant and a salt AX to the combined first resin, second resin and carrier liquid and optionally grinding. In some examples, the method of producing an LEP ink composition comprises adding a charge adjuvant to the combined first resin, second resin, salt AX and carrier liquid and optionally grinding. In some examples, the method of producing an LEP ink composition comprises adding a charge adjuvant, a salt AX and conductive particles to the combined first resin, second resin and carrier liquid and optionally grinding. In some examples, the method of producing an LEP ink composition comprises adding a charge adjuvant to the combined first resin, second resin, salt AX, conductive particles and carrier liquid and optionally grinding. In some examples, the method of producing an LEP ink composition comprises adding a charge adjuvant and conductive particles to the combined first resin, second resin, salt AX, conductive particles and carrier liquid and optionally grinding.

In some examples, the method of producing an LEP ink composition comprises grinding at a grinding speed of at least 50 rpm. In some examples, the method of producing an LEP ink composition comprises grinding at a grinding speed of up to about 600 rpm. In some examples, the method of producing an LEP ink composition comprises grinding for at least 1 h, in some examples, for at least 2 h. In some examples, the method of producing an LEP ink composition comprises grinding for up to about 12 h. In some examples, the method of producing an LEP ink composition comprises grinding at a temperature of at least about 30° C., for example, at least about 35° C., for example, at least about 40° C., for example, at least about 50° C. In some examples, the method of producing an LEP ink composition comprises grinding at a temperature of at least about 50° C. for a first time period, in some examples, for at least 1 h, in some examples, for at least 1.5 h and then reducing the temperature to a temperature of at least 30° C., in some examples, at least 35° C. and continuing grinding for at least 5 h, in some examples, at least 9 h, in some examples, at least 10 h.

In some examples, the method of producing an LEP ink composition comprises adding a charge director to the combined first resin, second resin and carrier liquid. In some examples, the method of producing an LEP ink composition comprises adding a charge director to the combined first resin, second resin, salt AX and carrier liquid. In some examples, the method of producing an LEP ink composition comprises adding a charge director to the combined first resin, second resin, charge adjuvant and carrier liquid. In some examples, the method of producing an LEP ink composition comprises adding a charge director to the combined first resin, second resin, salt AX, charge adjuvant and carrier liquid. In some examples, the method of producing an LEP ink composition comprises adding a charge director to the combined first resin, second resin, conductive particles and carrier liquid. In some examples, the method of producing an LEP ink composition comprises adding a charge director to the combined first resin, second resin, salt AX, conductive particles and carrier liquid. In some examples, the method of producing an LEP ink composition comprises adding a charge director to the combined first resin, second resin, conductive particles, charge adjuvant and carrier liquid. In some examples, the method of producing an LEP ink composition comprises adding a charge director to the combined first resin, second resin, salt AX, conductive particles, charge adjuvant and carrier liquid.

Method of Producing the Liquid Electrophotographic Ink Composition Comprising $BX_2$ In some examples, the liquid electrophotographic ink composition comprising a dispersion of a salt $BX_2$ and a thermoplastic resin in a carrier liquid may be produced by the method described above for producing the liquid electrophotographic ink composition comprising the salt AX except that the salt $BX_2$ is used instead of the salt AX. In some examples, the liquid electrophotographic ink composition comprising a dispersion of a salt $BX_2$, conductive particles and a thermoplastic resin in a carrier liquid may be produced by the method described above for producing the liquid electrophotographic ink composition comprising the salt AX except that the salt $BX_2$ is used instead of the salt AX.

Method of Producing the Liquid Electrophotographic Ink Composition Comprising $BX_4$ In some examples, the liquid electrophotographic ink composition comprising a dispersion of a salt $BX_4$ and a thermoplastic resin in a carrier liquid may be produced by the method described above for producing the liquid electrophotographic ink composition comprising the salt AX except that the salt $BX_4$ is used instead of the salt AX. In some examples, the liquid electrophotographic ink composition comprising a dispersion of a salt $BX_4$, conductive particles and a thermoplastic resin in a carrier liquid may be produced by the method described above for producing the liquid electrophotographic ink composition comprising the salt AX except that the salt $BX_4$ is used instead of the salt AX.

Method of Producing the Liquid Electrophotographic Ink Composition Comprising a Material with a Perovskite Structure In some examples, the liquid electrophotographic ink composition comprising a dispersion of a material with a perovskite structure (i.e., the LEP photovoltaic ink composition) and a thermoplastic resin in a carrier liquid may be produced by the method described above for producing the liquid electrophotographic ink composition comprising the salt AX except that a combination of the salt AX and a salt selected from $BX_2$ and $BX_4$ is used instead of the salt AX. In some examples, the liquid electrophotographic ink composition comprising a dispersion of a material with a perovskite structure and a thermoplastic resin in a carrier liquid (wherein the material with a perovskite structure has the chemical formula $ABX_3$) may be produced by the method described above for producing the liquid electrophotographic ink composition comprising the salt AX except that the salts AX and $BX_2$ are used in a 1:1 ratio (by number of moles of each salt) instead of the salt AX. In some examples, the liquid electrophotographic ink composition comprising a dispersion of material with a perovskite structure and a thermoplastic resin in a carrier liquid (wherein the material with a perovskite structure has the chemical formula $A_2BX_6$) may be produced by the method described above for producing the liquid electrophotographic ink composition comprising the salt AX except that the salts AX and $BX_4$ are used in a 2:1 ratio (by number of moles of each salt) instead of the salt AX.

In some examples, the liquid electrophotographic ink composition comprising a dispersion of a material with a perovskite structure (i.e., the LEP photovoltaic ink composition), a thermoplastic resin and conductive particles in a carrier liquid may be produced by the method described above for producing the liquid electrophotographic ink composition comprising the salt AX except that a combination of the salt AX and a salt selected from $BX_2$ and $BX_4$ is used instead of the salt AX. In some examples, the liquid electrophotographic ink composition comprising a dispersion of a material with a perovskite structure, a thermoplastic resin and conductive particles in a carrier liquid (wherein the material with a perovskite structure has the chemical formula $ABX_3$) may be produced by the method described above for producing the liquid electrophotographic ink composition comprising the salt AX except that the salts AX and $BX_2$ are used in a 1:1 ratio (by number of moles of each salt) instead of the salt AX. In some examples, the liquid electrophotographic ink composition comprising a dispersion of material with a perovskite structure, a thermoplastic resin and conductive particles in a carrier liquid (wherein the material with a perovskite structure has the chemical formula $A_2BX_6$) may be produced by the method described above for producing the liquid electrophotographic ink composition comprising the salt AX except that the salts AX and $BX_4$ are used in a 2:1 ratio (by number of moles of each salt) instead of the salt AX.

In some examples, the liquid electrophotographic ink composition comprising a dispersion of a material with a perovskite structure and a thermoplastic resin in a carrier liquid may be produced by combining a composition comprising a dispersion of a salt AX and a thermoplastic resin in a carrier liquid with a composition comprising a dispersion of a salt selected from $BX_2$ and $BX_4$ and a thermoplastic resin in a carrier liquid. In some examples, the liquid electrophotographic ink composition comprising a dispersion of a material with a perovskite structure and a thermoplastic resin in a carrier liquid (wherein the material with a perovskite structure has the chemical formula $ABX_3$) may be produced by combining, in a 1:1 ratio (by number of moles of each salt), a composition (for example, a liquid electrophotographic ink composition) comprising a dispersion of a salt AX and a thermoplastic resin in a carrier liquid with a composition (for example, a liquid electrophotographic ink composition) comprising a dispersion of a salt $BX_2$ and a thermoplastic resin in a carrier liquid. In some examples, the liquid electrophotographic ink composition comprising a dispersion of a material with a perovskite structure and a thermoplastic resin in a carrier liquid (wherein the material with a perovskite structure has the chemical formula $A_2BX_6$) may be produced by combining, in a 2:1 ratio (by number of moles of each salt), a composition (for example, a liquid electrophotographic ink composition) comprising a dispersion of a salt AX and a thermoplastic resin in a carrier liquid with a composition (for example, a liquid electrophotographic ink composition) comprising a dispersion of a salt $BX_4$ and a thermoplastic resin in a carrier liquid.

In some examples, the liquid electrophotographic ink composition comprising a dispersion of a material with a perovskite structure, conductive particles and a thermoplastic resin in a carrier liquid may be produced by combining a composition comprising a dispersion of a salt AX, conductive particles and a thermoplastic resin in a carrier liquid with a composition comprising a dispersion of a salt selected from $BX_2$ and $BX_4$ and a thermoplastic resin in a carrier liquid. In some examples, the liquid electrophotographic ink composition comprising a dispersion of a material with a perovskite structure, conductive particles and a thermoplastic resin in a carrier liquid (wherein the material with a perovskite structure has the chemical formula $ABX_3$) may be produced by combining, in a 1:1 ratio (by number of moles of each salt), a composition (for example, a liquid electrophotographic ink composition) comprising a dispersion of a salt AX, conductive particles and a thermoplastic resin in a carrier liquid with a composition (for example, a liquid electrophotographic ink composition) comprising a dispersion of a salt $BX_2$ and a thermoplastic resin in a carrier liquid. In some examples, the liquid electrophotographic ink composition comprising a dispersion of a material with a perovskite structure, conductive particles and a thermoplastic resin in a carrier liquid (wherein the material with a perovskite structure has the chemical formula $A_2BX_6$) may be produced by combining, in a 2:1 ratio (by number of moles of each salt), a composition (for example, a liquid electrophotographic ink composition) comprising a dispersion of a salt AX, conductive particles and a thermoplastic resin in a carrier liquid with a composition (for example, a liquid electrophotographic ink composition) comprising a dispersion of a salt $BX_4$ and a thermoplastic resin in a carrier liquid.

In some examples, the liquid electrophotographic ink composition comprising a dispersion of a material with a perovskite structure, conductive particles and a thermoplastic resin in a carrier liquid may be produced by combining a composition comprising a dispersion of a salt AX and a thermoplastic resin in a carrier liquid with a composition comprising a dispersion of a salt selected from $BX_2$ and $BX_4$, conductive particles and a thermoplastic resin in a carrier liquid. In some examples, the liquid electrophotographic ink composition comprising a dispersion of a material with a perovskite structure, conductive particles and a thermoplastic resin in a carrier liquid (wherein the material with a perovskite structure has the chemical formula $ABX_3$) may be produced by combining, in a 1:1 ratio (by number of moles of each salt), a composition (for example, a liquid electrophotographic ink composition) comprising a dispersion of a salt AX and a thermoplastic resin in a carrier liquid with a composition (for example, a liquid electrophotographic ink composition) comprising a dispersion of a salt $BX_2$, conductive particles and a thermoplastic resin in a carrier liquid. In some examples, the liquid electrophotographic ink composition comprising a dispersion of a material with a perovskite structure, conductive particles and a thermoplastic resin in a carrier liquid (wherein the material with a perovskite structure has the chemical formula $A_2BX_6$) may be produced by combining, in a 2:1 ratio (by number of moles of each salt), a composition (for example, a liquid electrophotographic ink composition) comprising a dispersion of a salt AX and a thermoplastic resin in a carrier liquid with a composition (for example, a liquid electrophotographic ink composition) comprising a dispersion of a salt $BX_4$, conductive particles and a thermoplastic resin in a carrier liquid.

In some examples, the liquid electrophotographic ink composition comprising a dispersion of a material with a perovskite structure, conductive particles and a thermoplastic resin in a carrier liquid may be produced by combining a composition comprising a dispersion of a salt AX, conductive particles and a thermoplastic resin in a carrier liquid with a composition comprising a dispersion of a salt selected from $BX_2$ and $BX_4$, conductive particles and a thermoplastic resin in a carrier liquid. In some examples, the liquid electrophotographic ink composition comprising a dispersion of a material with a perovskite structure, conductive particles and a thermoplastic resin in a carrier liquid (wherein the material with a perovskite structure has the chemical formula $ABX_3$) may be produced by combining, in a 1:1 ratio (by number of moles of each salt), a composition (for example, a liquid electrophotographic ink composition) comprising a dispersion of a salt AX, conductive particles and a thermoplastic resin in a carrier liquid with a composition (for example, a liquid electrophotographic ink composition) comprising a dispersion of a salt $BX_2$, conductive particles and a thermoplastic resin in a carrier liquid. In some examples, the liquid electrophotographic ink composition comprising a dispersion of a material with a perovskite structure, conductive particles and a thermoplastic resin in a carrier liquid (wherein the material with a perovskite structure has the chemical formula $A_2BX_6$) may be produced by combining, in a 2:1 ratio (by number of moles of each salt), a composition (for example, a liquid electrophotographic ink composition) comprising a dispersion of a salt AX, conductive particles and a thermoplastic resin in a carrier liquid with a composition (for example, a liquid electrophotographic ink composition) comprising a dispersion of a salt $BX_4$, conductive particles and a thermoplastic resin in a carrier liquid.

In some examples, the liquid electrophotographic ink composition comprising a dispersion of a material with a perovskite structure, conductive particles and a thermoplastic resin in a carrier liquid may be produced by combining conductive particles with a dispersion of a material with a perovskite structure and a thermoplastic resin in a carrier liquid.

In some examples, the liquid electrophotographic ink composition comprising a dispersion of material with a perovskite structure and a thermoplastic resin in a carrier liquid may be produced by combining, in a stoichiometric ratio, a composition (for example, a liquid electrophotographic ink composition) comprising a dispersion of a salt AX and a thermoplastic resin in a carrier liquid with a composition (for example, a liquid electrophotographic ink composition) comprising a dispersion of a salt selected from $BX_2$ and $BX_4$ and a thermoplastic resin in a carrier liquid. In some examples, conductive particles may be combined with any one of the dispersions, or with each of the dispersions.

In some examples, the composition comprising a dispersion of a salt AX and a thermoplastic resin in a carrier liquid was mixed by high shear mixing prior to being combined with the dispersion of a salt selected from $BX_2$ and $BX_4$ and a thermoplastic resin in a carrier liquid. In some examples, the composition comprising a dispersion of a salt selected from $BX_2$ and $BX_4$ and a thermoplastic resin in a carrier liquid was mixed by high shear mixing prior to being combined with the dispersion of a salt AX and a thermoplastic resin in a carrier liquid. In some examples, the composition comprising a dispersion of a salt AX and a thermoplastic resin in a carrier liquid and the composition comprising a dispersion of a salt selected from $BX_2$ and $BX_4$ and a thermoplastic resin in a carrier liquid were separately mixed by high shear mixing prior to the two compositions being combined. In some examples, high shear mixing comprises mixing at a shear rate of up to 35000 rpm, for example, up to 30000 rpm, or up to 25000 rpm. In some examples, high shear mixing comprises mixing at a shear rate of at least 7000 rpm, for example, at least 10000 rpm, at least 15000 rpm, at least 20000 rpm or at least 25000 rpm. In some examples, high shear mixing comprises mixing at a shear rate of 7000 rpm to 35000 rpm, for example, 10000 rpm to 30000 rpm, or 15000 rpm to 25000 rpm.

In some examples, combining a composition comprising a dispersion of a salt AX and a thermoplastic resin in a carrier liquid with a composition comprising a dispersion of a salt $BX_2$ or a salt $BX_4$ and a thermoplastic resin in a carrier liquid may comprise mixing the two compositions for 10 min or less, for example, 5 min or less, 4 min or less, 3 min or less, 2 min or less, 1 min or less. In some examples, combining a composition comprising a dispersion of a salt AX and a thermoplastic resin in a carrier liquid with a composition comprising a dispersion of a salt $BX_2$ or a salt $BX_4$ and a thermoplastic resin in a carrier liquid may comprise mixing the two compositions for 1 min or more, for example, 2 min or more, 3 min or more, 4 min or more, 5 min or more, 10 min or more. In some example, combining a composition comprising a dispersion of a salt AX and a thermoplastic resin in a carrier liquid with a composition comprising a dispersion of a salt $BX_2$ and a thermoplastic resin in a carrier liquid may comprise mixing the two compositions for 1 min to 10 min, for example, 2 min to 5 min, 3 min to 4 min. In some examples, the mixing may be at room temperature, for example, about 25° C. In some examples, the mixing speed may be 50 rpm or less. In some examples, the mixing may be performed manually over a few minutes. In some examples, the mixture may then be rested for a period of time to form the material with a perovskite structure. In some examples, the period of time may be 1 h or more, for example, 1.5 h or more, 2 h or more, 2.5 h or more, 3 h or more. In some examples, the period of time may be 3 h or less, for example, 2.5 h or less, 2 h or less, 1.5 h or less, or 1 h or less. In some examples, the period of time may be 1 h to 3 h, for example, 1.5 h to 2.5 h or 2 h to 2.5 h.

Method of Producing the Electrically Conductive Liquid Electrophotographic Ink Composition In some examples, the electrically conductive LEP ink composition comprising particles comprising a thermoplastic resin and electrically conductive metal particles in a carrier liquid may be produced by the method described above for producing the liquid electrophotographic ink composition comprising the salt AX except that electrically conductive metal particles are used instead of the salt AX.

Method of Producing an Electron Transport Layer

The method of producing an electron transport layer may comprise applying an electron transport composition to a substrate comprising an anode. The electron transport composition may be applied to the substrate by an analogue printing technique. The term "analogue printing" is used herein to refer to methods of coating a substrate, or coating systems for coating a substrate, using a non-digital technique. For example, coating a surface of the substrate with the electron transport composition may comprise flood coating a surface of the substrate with the electron transport composition, for example, coating part, or all, of a surface of the substrate in a non-selective manner. In some examples, coating a surface of the substrate by using an analogue printing technique may comprise selectively applying the electron transport composition to the substrate. In some examples, the electron transport composition may be applied/has been applied to the substrate by using rod coating, gravure coating, roll coating, flexographic printing, lithography, spray coating, or screen printing. In some examples, the electron transport layer has been formed by applying the electron transport composition to the substrate by gravure coating. In some examples, the electron transport composition is applied to the substrate, for example, a substrate comprising an anode, by gravure coating.

In some examples, the electron transport composition comprises a dispersion of a metal oxide in an organic solvent. The metal oxide may be selected from alumina ($Al_2O_3$), zinc oxide (ZnO), tin oxide ($SnO_2$), titanium dioxide (i.e., titanium (IV) oxide; $TiO_2$), $WO_3$, $SiO_2$, or $ZrO_2$. The metal oxide may be selected from alumina ($Al_2O_3$), zinc oxide (ZnO), tin oxide ($SnO_2$), titanium dioxide (i.e., titanium (IV) oxide; $TiO_2$). In some examples, the metal oxide is zinc oxide. The organic solvent may be a diol In some examples, the diol may be selected from ethylene glycol, propylene glycol, butanediol, pentanediol and hexanediol. In some examples, the organic solvent is propylene glycol. In some examples, the electron transport composition comprises a dispersion of zinc oxide in propylene glycol.

In some examples, the method of producing an electron transport layer may comprise applying an electron transport composition to a substrate and drying. In some examples, drying may comprise removing the organic solvent from the electron transport composition, for example by evaporation. In some examples, the method of producing an electron transport layer may comprise repeatedly applying an electron transport composition to a substrate until an electron transport layer with a suitable thickness is produced. In some examples, drying occurs between each application of the electron transport composition.

In some examples, a suitable thickness of the electron transport layer comprises a thickness of at least about 30 nm, for example, at least about 40 nm, at least about 50 nm, at least about 60 nm, at least about 70 nm, at least about 80 nm, at least about 90 nm, or at least about 100 nm. In some examples, a suitable thickness of the electron transport layer comprises a thickness of up to about 100 nm, for example, up to about 90 nm, up to about 80 nm, up to about 70 nm, up to about 60 nm, up to about 50 nm, up to about 40 nm, or up to about 30 nm. In some examples, a suitable thickness of the electron transport layer comprises a thickness of from about 30 nm to about 100 nm, for example, from about 40 nm to about 90 nm, from about 50 nm to about 80 nm, form about 50 nm to about 70 nm.

In some examples, the method of producing an electron transport layer comprises applying the electron transport composition to the substrate at least twice, for example, at least three times, at least four times or at least five times, optionally with drying the electron transport composition between each application of the electron transport composition. In some examples, the method of producing an electron transport layer comprises applying the electron transport composition to the substrate up to about five times, for example, up to about four times, up to about three times, or up to about twice, optionally with drying the electron transport composition between each application of the electron transport composition. In some examples, the method of producing an electron transport layer comprises applying the electron transport composition to the substrate two to five times, for example, three to four times, optionally with drying of the electron transport composition between each application of the electron transport composition.

In some examples, the electron transport composition comprises at least about 0.5 wt. % non-volatile solids (for example, metal oxide), for example, at least about 1 wt. % NVS, at least about 1.1 wt. % NVS, at least about 1.2 wt. % NVS, at least about 1.3 wt. % NVS, at least about 1.4 wt. % NVS, at least about 1.5 wt. % NVS, at least about 1.6 wt. % NVS, at least about 1.7 wt. % NVS, at least about 1.8 wt. % NVS, at least about 1.9 wt. % NVS, at least about 2 wt. % NVS, at least about 2.1 wt. % NVS, at least about 2.2 wt. % NVS, at least about 2.3 wt. % NVS, at least about 2.4 wt. % NVS, at least about 2.5 wt. % NVS, at least about 2.6 wt. % NVS, at least about 2.7 wt. % NVS, at least about 2.8 wt. % NVS, at least about 2.9 wt. % NVS, at least about 3 wt. % NVS, at least about 3.5 wt. % NVS, or at least about 4 wt. % NVS (for example, metal oxide). In some examples, the electron transport composition comprises up to about 4 wt. % NVS (for example, metal oxide), for example, up to about 3.5 wt. % NVS, up to about 3 wt. % NVS, up to about 2.9 wt. % NVS, up to about 2.8 wt. % NVS, up to about 2.7 wt. % NVS, up to about 2.6 wt. % NVS, up to about 2.5 wt. % NVS, up to about 2.4 wt. % NVS, up to about 2.3 wt. % NVS, up to about 2.2 wt. % NVS, up to about 2.1 wt. % NVS, up to about 2 wt. % NVS, up to about 1.9 wt. % NVS, up to about 1.8 wt. % NVS, up to about 1.7 wt. % NVS, up to about 1.6 wt. % NVS, up to about 1.5 wt. % NVS, up to about 1.4 wt. % NVS, up to about 1.3 wt. % NVS, up to about 1.2 wt. % NVS, up to about 1.1 wt. % NVS, up to about 1 wt. % NVS, or up to about 0.5 wt. % NVS (for example, metal oxide).

In some examples, the method may further comprise producing the electron transport composition comprising a metal oxide dispersed in an organic solvent. In some examples, the electron transport composition may be produced by dispersing a metal oxide in an organic solvent.

In some examples, the electron transport composition may be produced by combining a metal halide with a base in a first organic solvent (for example, an alcohol, such as methanol) to produce a metal oxide; precipitating the metal oxide; and dispersing/re-dispersing the metal oxide in a second organic solvent to form the electron transport composition. In some examples, the electron transport composition may be produced by combining a metal halide with a base in a first organic solvent and heating to produce a metal oxide; precipitating the metal oxide; and dispersing/re-dispersing the metal oxide in a second organic solvent. In some examples, heating to produce a metal oxide comprises heating to a temperature of at least 45° C., for example, at least 50° C., at least 55° C., at least 60° C., at least 65° C., at least 70° C., or at least 75° C. In some examples, heating to produce a metal oxide comprises heating to a temperature of up to 75° C., for example, up to 70° C., up to 65° C., up to 60° C., up to 55° C., up to 50° C., or up to 45° C. In some examples, heating to produce a metal oxide comprises heating to a temperature of from 45° C. to 75° C., for example from 50° C. to 70° C., from 55° C. to 65° C. or from 60° C. to 65° C.

In some examples, the metal halide may be a metal chloride, a metal bromide or a metal iodide, for example, zinc chloride, zinc bromide, zinc iodide, tin chloride, tin bromide or tin iodide. In some examples, the base may be potassium hydroxide (KOH), sodium hydroxide or an ammonia solution. In some examples, the metal halide may be zinc chloride and the base may be potassium hydroxide.

In some examples, the first organic solvent may be selected from methanol, ethanol, glycerol, acetone, or isopropyl alcohol. In some examples, the first organic solvent is methanol. In some examples, the second organic solvent may be a diol, for example, ethylene glycol, propylene glycol, butanediol, pentanediol and hexanediol. In some examples, the second organic solvent is propylene glycol. In some examples, the first organic solvent is methanol and the second organic solvent is propylene glycol.

In some examples, prior to application of the electron transport composition, the substrate may be subjected to corona treatment. In some examples, the corona treatment may improve the surface polarity of the substrate. During the corona treatment, polar groups, such as hydroxyl, ketone and carboxyl groups, may be grafted onto the surface of the substrate. The corona treatment may be performed in a corona chamber at room temperature and atmospheric pressure. In some examples, the corona treatment may be at a power of at least about 500 W, for example, at least about 600 W, at least about 700 W, at least about 800 W, at least about 900 W, at least about 1000 W, at least about 1100 W, at least about 1200 W, at least about 1300 W, at least about 1400 W, at least about 1500 W. In some examples, the corona treatment may be at a power of up to about 1500 W, for example, up to about 1400 W, up to about 1300 W, up to about 1200 W, up to about 1100 W, up to about 1000 W, up to about 900 W, up to about 800 W, up to about 700 W, up to about 600 W, or up to about 500 W. In some examples, the corona treatment may be at a power of from about 500 W to about 1500 W, for example, about 600 W to about 1400 W, about 700 W to about 1300 W, about 800 W to about 1200 W, about 900 W to about 1100 W, or about 1000 W to about 1500 W.

In some examples, the method of producing a photovoltaic cell may comprise applying an electron transport composition to a substrate comprising an anode to form an electron transport layer disposed on the anode, optionally drying the electron transport composition; optionally repeating the application of an electron transport composition to the substrate, for example, two to five times (e.g., three times), optionally with drying of the electron transport composition between each application of the electron transport composition; printing a liquid electrophotographic photovoltaic ink composition onto a substrate comprising an anode and an electron transport layer to form a liquid electrophotographically printed photovoltaic layer disposed on the electron transport layer; and printing an electrically conductive liquid electrophotographic ink composition to form a liquid electrophotographically printed cathode disposed on the photovoltaic layer. The method may further comprise applying a hole transport composition to the photovoltaic layer to form a hole transport layer before printing the electrically conductive LEP ink composition and then printing the electrically conductive LEP ink composition onto the hole transport layer to form the printed cathode.

EXAMPLES

The following illustrates examples of the methods and other aspects described herein. Thus, these Examples should not be considered as limitations of the present disclosure, but are merely in place to teach how to make examples of the present disclosure.

Materials
Resins
Poly(ethylene-co-glycidyl methacrylate): a copolymer of ethylene and glycidyl methacrylate containing 6.5 to 9.0 wt. % glycidyl methacrylate with a melt index of 4.0 to 6.0 g/10 min (190° C./2.16 kg); available as pellets from Sigma-Aldrich™ under product number 430862.

Nucrel 599 (resin D): a copolymer of ethylene and methacrylic acid, made with nominally 10 wt. % methacrylic acid (available from DuPont).

Perovskite Components
Methylammonium Iodide (MAI): >99.0 wt. % (available from Sigma-Aldrich or TCI).
Lead iodide ($PbI_2$): >98.0 wt. % (available from Sigma-Aldrich or TCI).

Electrically Conductive Metal Particles of the Electrically Conductive LEP Ink Composition
AgCu0204-12: a silver coated copper powder pigment with a particle size distribution of 95% less than 7.43 µm, 90% less than 5.99 µm, 50% less than 3.24 µm and 10% less than 1.9 µm, as measured by using a Honeywell X100 Particle Size Analyzer (available from Ames Goldsmith) with about 12 wt. % silver that has a thickness of tens to hundreds of a nm (as shown by SEM imaging).

Conductive Particles of the LEP Photovoltaic Ink Composition
Single-walled carbon nanotubes: 75 wt. % carbon nanotubes (available from OCSiAl).

Carrier Liquid
Isopar L™: an isoparaffinic oil comprising a mixture of C11-C13 isoalkanes (produced by Exxon Mobil™; CAS number 64742-48-9.

Charge Adjuvant
VCA (viscosity control agent): an aluminium stearate (available from Fishcher Scientific).

Charge Director
SCD: a barium bis(sulfosuccinate) salt, namely a barium phosphate and a sulfosuccinate moiety of the general formula [$R^1$—O—C(O)$CH_2$CH($SO_3^-$)C(O)—O—$R^2$], wherein each of $R^1$ and $R^2$ independently is a $C_{6-25}$ alkyl, generally mainly $C_{13}$ alkyl.

Substrate
PET-ITO: a transparent conductive indium tin oxide ($In_2O_3$/$SnO_2$) coated polyethylene terephthalate substrate (available from TDK). The PET has a thickness of 125 µm and the ITO layer has a thickness of about 100 nm.
PET-12: a 12 µm thickness polyethylene terephthalate substrate.

Electron Transport Composition
$ZnCl_2$: 98+ wt. % (available from Aldrich)
Methanol (available from Gadot, AR)
KOH: pellets (available from Sigma-Aldrich)
Propylene glycol (available from Sigma-Aldrich)

Hole Transport Composition
Spiro-MeOTAD: $N^2,N^2,N^{2'},N^{2'},N^7,N^7,N^{7'},N^{7'}$-octakis(4-methoxyphenyl)-9,9'-spirobi[9H-fluorene]-2,2',7,7'-tetramine (99 wt. %, available from Sigma-Aldrich)
Chlorobenzene: 99 wt. % (available form Sigma-Aldrich)
tert-Butylpyridine: (available from Sigma-Aldrich)
LiTFSI: bis(trifluoromethane)sulfonimide lithium salt (available from Sigma-Aldrich)
Acetonitrile: 99.8 wt. % (available form Sigma-Aldrich)
PFDF filter: a 0.22 mm polyvinylidine fluoride filter (Durapore® Membrane filter, available from Merck-Millipore)

LEP Photovoltaic Ink Composition 1
A transparent paste was prepared by mixing (60 rpm) 1000 g of poly(ethylene-co-glycidyl methacrylate) with 2000 g of Isopar L in a ROSS mixer (Model DPM-4) (33.4 wt. % non-volatile solids (NVS)). The mixing temperature was varied as described in the table below and a transparent paste was formed.

| Mixer T [° C.] | Mixing time [min] |
|---|---|
| 130 | 120 |
| 105 | 30 |
| 100 | 30 |
| 90 | 30 |
| 25 | 120 |

An LEP photovoltaic ink composition was prepared by placing 0.32 g of MAI, 0.92 g of PbI$_2$, 0.93 g of the transparent paste (33.4 wt. % NVS) and 28.8 g of Isopar L in a 300 ml glass vessel. Ceramic beads (80 g, Zirmil 0.9 mm) were added and the vessel was tightly closed and placed in a shaker (fast&fluid SK550 1.1) for 8 hours of grinding at 500 rpm to form the LEP photovoltaic ink composition (5 wt. % NVS).

This LEP photovoltaic ink composition comprising a material with a perovskite structure can be stored for at least 1 month without degrading. Without wishing to be bound by theory, it is believed that the inclusion of the hydrophobic copolymer of an alkylene monomer and an ethylenically unsaturated monomer comprising an epoxide and Isopar L stabilizes the perovskite structure. After the LEP photovoltaic ink composition has been printed and heated, it is believed that (without wishing to be bound by theory) the formation of an etheric network by cross-linking of the epoxide groups provides the photovoltaic layer with increased resistance to humidity.

Electrically Conductive LEP Ink Composition 1

A 40 wt. % NVS conductive copper LEP ink was prepared by using the precipitation procedure as described below:

A 2 L glass reactor was filled with 198 g of resin D and 510 g of Isopar L and heated to 120° C. Following resin melting, the reactor was cooled to 90° C. at a rate of 10° C./hour. At this temperature, 1300 g of metallic AgCu0204-12 powder pigment was added to obtain an 87% pigment to total NVS ratio (w/w). Pigment addition was performed at a controlled rate over 40 min using a 5000 rpm high shear mixer to break agglomerates.

After an additional 30 min of high shear mixing and cooling to 85° C. at a rate of 10° C./hour, high shear mixing was stopped, and the reactor was cooled to 75° C. at a rate of 3° C./hour. An additional cooling step was performed to 70° C. at a rate of 10° C./hour and Isopar L was added to dilute the obtained formulation to 63 wt. %.

A final cooling step to 40° C. at 20° C./hour was followed by diluting to 40 wt. % NVS with addition 0.1 wt. % VCA.

A final gentle grinding step was performed on an S1 attritor for 1 hour at 80 rpm.

Example 1

A 20×20 cm$^2$ PET-ITO substrate was coated with an approximately 70 nm layer of ZnO by using 70 synthetic cycles of Atomic layer deposition (ALD) with an Arradiance, GEMStar XT instrument.

A 0.7 wt. % MAPbI$_3$ LEP photovoltaic ink composition was prepared by diluting 1.4 g of LEP photovoltaic ink composition 1 with 8.6 g of Isopar L. This ink composition was charged by using one drop of 0.5 wt. % SCD in Isopar L and deposited on the ZnO-coated PET-ITO substrate by using electroplating (using a Q/M instrument operated at 1500 V). The obtained layer was dried at 60° C. for 15 minutes to form an LEP printed photovoltaic layer disposed on the ZnO layer (an electron transport layer).

Electroplating exploits the same phenomenon as liquid electrophotographic printing and has therefore been used to demonstrate that the ink composition is capable of being liquid electrophotographically printed. In electroplating, two electrodes are placed in the liquid electrophotographic ink composition and a strong electric field is applied between the two electrodes. The substrate is attached to the positively charged electrode. The chargeable particles of the liquid electrophotographic ink composition are attracted to the positively charged electrode, forming a layer of the liquid electrophotographic ink composition on the substrate attached to the positively charged electrode. In liquid electrophotographic printing, a positively charged latent image is formed on the photoimaging plate (PIP) and the chargeable particles are attracted to the positively charged portions of the PIP. Thus, the formation of a layer of liquid electrophotographic ink composition on the substrate during electroplating demonstrates that the composition is capable of being used as a liquid electrophotographic ink composition.

An LEP printed photovoltaic layer comprising a material with a perovskite structure of this type has been found to be stable under ambient conditions (e.g., in the presence of air and humidity) without immediate encapsulation by another layer or requiring storage in a glovebox. In contrast, materials with a perovskite structure produced by other methods (e.g., deposition from a solvent such as DMF or DMSO) degrade quickly due to the sensitivity of the perovskite structure to air and humidity.

Electrically conductive LEP ink composition 1 was then deposited by drop-casting onto the LEP printed photovoltaic layer. Typically, 4-8 round spots (with an area of about 0.25 cm$^2$ were formed on the 3 cm in diameter circles of LEP printed photovoltaic layer. This photovoltaic cell structure was then annealed at 120° C. for 5 minutes. The annealing enables the epoxide in the printed photovoltaic layer to cross-link, providing a hydrophobic network surrounding the perovskite crystals.

LEP printing of electrically conductive LEP ink composition 1 onto a substrate has been successfully performed.

Test Results

FIG. 2 shows a scanning electron microscope—fused ion beam (SEM-FIB) of a cross-section of a photovoltaic cell produced by Example 1 (scale bars 10 μm (left) and 1 μm (right)).

XRD analysis of the LEP printed photovoltaic layer (i.e., before application of electrically conductive LEP ink composition 1) shows that the perovskite crystals include fewer defects than those produced by deposition from a solution in a solvent such as DMF or DMSO (e.g., by precipitation induced by solvent evaporation).

Figure 3:
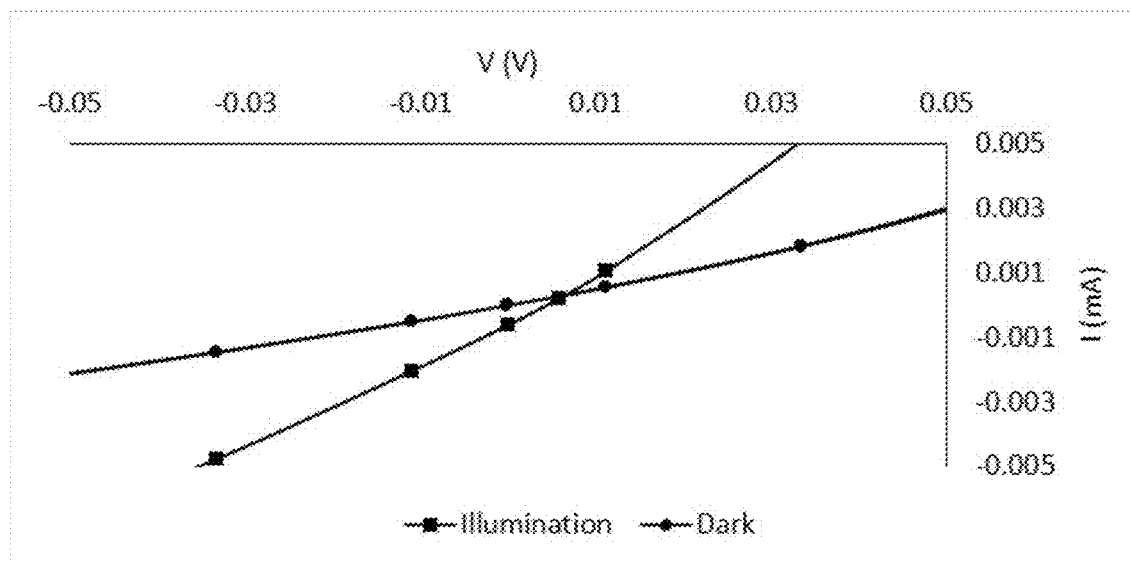
FIG. 3 is an I-V graph showing the photovoltaic behaviour of a photovoltaic cell according to Example 1 one day after deposition.

The photovoltaic cell produced according to Example 1 was analyzed by using a solar simulator with 1 sun illumination. An HCl solution (3 wt. % HCl in water) was used to clean the ZnO layer and reveal the PET-ITO anode contact. Four probes were placed on the tested cell (2 on the PET-ITO anode and 2 on the LEP printed cathode). The photovoltaic performance of the cell was measured with and without illumination and the current produced was recorded at different applied voltages. FIG. 3 shows the current-voltage (1-V) curve obtained when a 0.03 cm$^2$ photovoltaic cell area was illuminated by using 1 sun intensity (100 mW/cm$^2$ power). The "dark" curve represents the photovoltaic activity in the dark and the "illumination" curve represents the photovoltaic activity under illumination. An open circuit voltage ($V_{oc}$) of 5.8 mV and a short circuit current ($I_{sc}$) of 0.75 mA was obtained, resulting in a total cell efficiency of $3.2 \times 10^{-6}$%.

Figure 4:
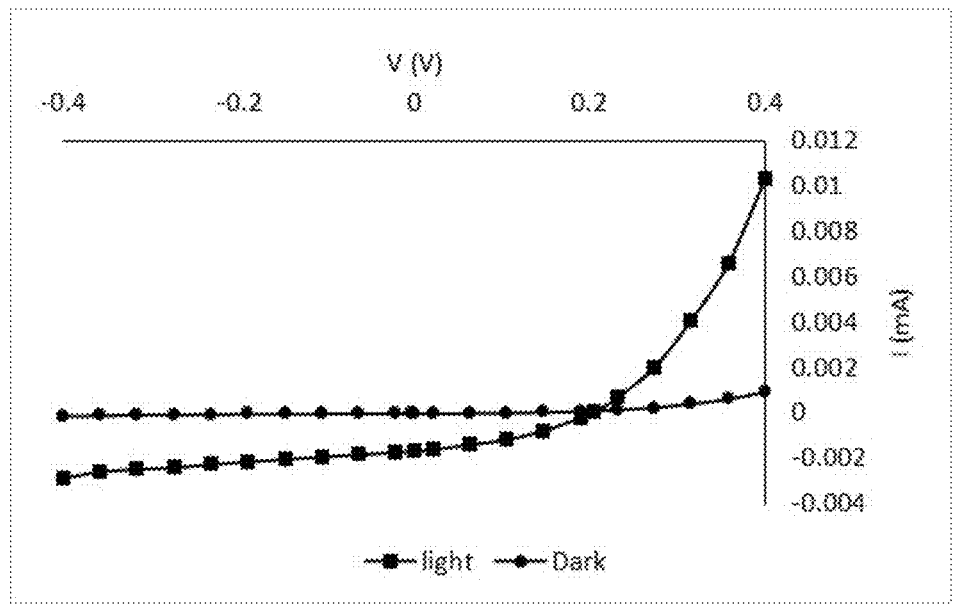
FIG. 4 is an I-V graph showing the photovoltaic behaviour of a photovoltaic cell according to Example 1 after storage under ambient conditions for 1 month.

The photovoltaic cell was stored under ambient conditions and exposed to an atmospheric humidity of about 60% for one month. It was surprisingly found that the photovoltaic performance of the photovoltaic cell not only did not degrade but actually increased. As shown in FIG. 4, after 1 month stored at ambient conditions, a $V_{oc}$ of 205 mV and an $I_{sc}$ of 1.7 mA were obtained, resulting in total cell efficiency of 0.004%.

Current photovoltaic cells generally include a gold or silver cathode layer that is deposited by a sputtering method to produce an approximately 100 nm thick layer that is easily deformed and/or scratched as a result of mechanical impact and displays inelastic properties. In contrast, the LEP printed cathode has elastic properties and a greater thickness (about 10 μm), which result in a less fragile cathode layer that is more resistant to mechanical impact, as well as being more flexible (allowing the production of a flexible photovoltaic cell). Without wishing to be bound by theory, it is believed that the elastic properties of the LEP printed cathode are provided by the presence of a thermoplastic resin in the layer, for example, by the presence of a thermoplastic resin comprising copolymer of ethylene and a monomer selected from acrylic acid and methacrylic acid.

Electron Transport Layer Composition 1

$ZnCl_2$ (24.9 g) were dissolved in 1700 ml of methanol. KOH (17.5 g) was dissolved in 850 ml of methanol to form a KOH methanol solution. The KOH methanol solution was added dropwise to the $ZnCl_2$ methanol solution over 1 hour at room temperature (RT, approximately 20 to 25° C.). The obtained suspension was heated to 65° C. and kept at this temperature overnight. The suspension was then cooled to RT and centrifuged for 15 minutes at 5000 rpm. Finally, the methanol was removed and the precipitated ZnO was re-dispersed in propylene glycol (PG, 2,000 ml) to give a 2 wt. % NVS dispersion of ZnO in propylene glycol.

Hole Transport Layer Composition 1

Spiro-MeOTAD (84 mg) was dissolved in 1 mL of chlorobenzene and 7 mL of tert-butylpyridine were added. LiTFSI (170 mg) was dissolved in 1 mL of acetonitrile and 15 mL of the LiTFSI solution were added to the solution of Spiro-MeOTAD. The obtained mixture was filtered using 0.22 mm PVDF filter.

Example 2

Electron transport layer composition 1 (2 wt. %) was transferred to a Labo-Combi laminator for coating. The Labo-Combi laminator uses roll-to-roll coating to apply a coating to a substrate. An ITO coated PET substrate (PET/ITO) was adhered to a roll of PET-12. The substrate was subjected to corona treatment (1000 W) and then coated with the suspension and dried using three 1 meter dryers at temperatures of 70° C., 90° C. and then 90° C. The coating procedure was repeated twice more to obtain the desired electron transport layer.

Test Results

Figure 5:
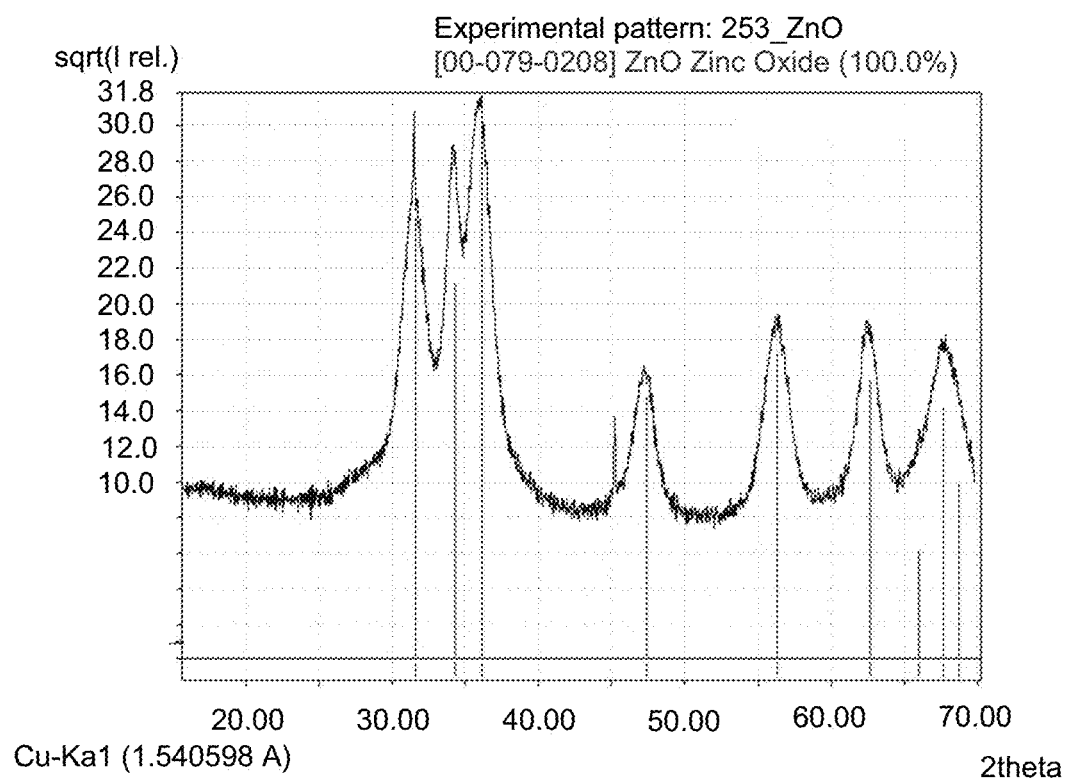
FIG. 5 is an X-ray diffraction (XRD) pattern of a ZnO layer produced by coating hole transport layer composition 1 on a substrate.

The ZnO was removed from the propylene glycol to form a powder and X-Ray diffraction (XRD) was performed on this powder and the XRD pattern is shown in FIG. 5. As can be seen from this spectrum, the precipitation product was ZnO with no significant impurities.

Figure 6:
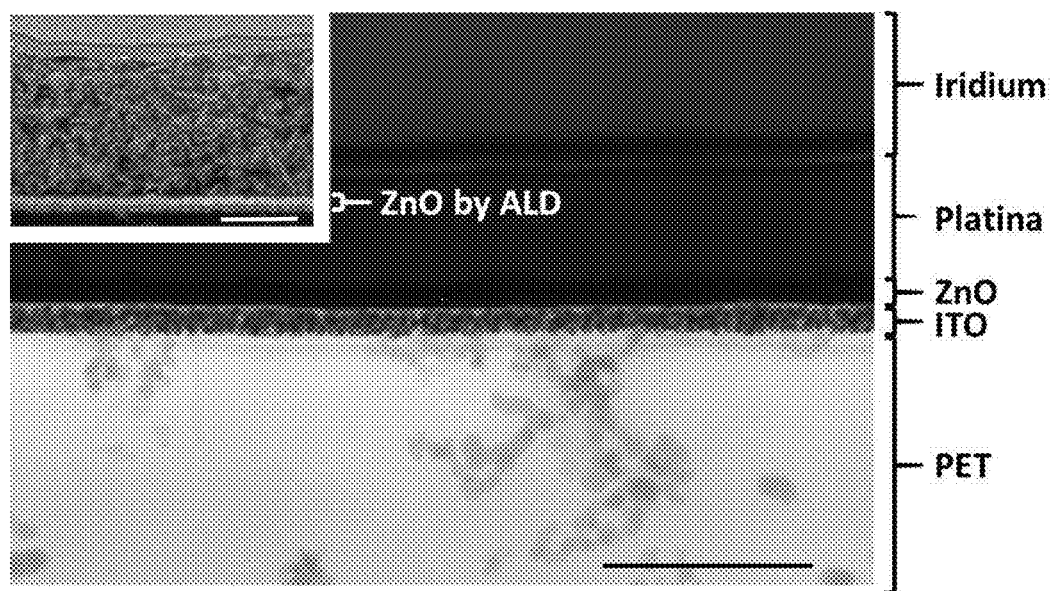
FIG. 6 shows STEM-FIB spectra of a cross-section of a device according to Example 2. The insert shows a cross-section of a similar device in which the ZnO layer was deposited by ALD.

A platina layer and an iridium layer were deposited on the ZnO electron transport layer by sputtering to improve scanning transmission electron microscope (STEM) analysis. FIG. 6 shows a scanning transmission electron microscope—focused ion beam (STEM-FIB) analysis of a cross-section of this substrate (scale bar: 500 nm). The insert shows a ZnO layer obtained by ALD (Scale bar 500 nm) onto which a gold layer has been deposited by sputtering. The STEM-FIB analysis indicates that the ZnO layer produced by the method described in Example 2 is a uniform layer with a thickness of about 100 nm.

To confirm the identity and thickness of the ZnO layer, energy-dispersive X-ray spectroscopy (EDS analysis was also performed on the device produced by Example 2 containing the platina and irridium layers. This test showed that the ZnO layer is a thin and dense layer located solely on top of the PET-ITO flexible substrate.

Although a ZnO layer obtained by ALD is more uniform in thickness, density and morphology than that produced by the roll-to-roll process according to Example 2, the roll-to-roll process also produces a layer of ZnO that functions well as an electron transport layer. Additionally, a roll-to-roll coating process does not require costly and specialist equipment or costly raw materials.

Example 3

Electron transport layer composition 1 (2 wt. %) was transferred to a Labo-Combi laminator for coating. An ITO coated PET substrate (PET/ITO) was adhered to a roll of PET-12. The substrate was subjected to corona treatment (1000 W) and then coated with the ZnO suspension and dried using three 1 meter dryers at temperatures of 70° C., 90° C. and then 90° C. The coating procedure was repeated twice more to obtain the desired electron transport layer.

A 0.7 wt. % $MAPbI_3$ LEP photovoltaic ink composition was prepared by diluting 1.4 g of LEP photovoltaic ink composition 1 with 8.6 g of Isopar L. This ink composition was charged by using one drop of 0.5 wt. % SCD in Isopar L and deposited on the ZnO coated PET-ITO substrate by electroplating (using Q/M instrument operated at 1500 V). The obtained layer was dried at 60° C. for 15 minutes to form an LEP printed photovoltaic layer disposed on the ZnO electron transport layer.

Hole transport layer composition 1 was deposited onto the LEP printed photovoltaic layer by using a spin-coater (a Laurell, H6-23 spin coater) at 1000 rpm and dried at RT to form a hole transport layer.

Gold cathode contacts were deposited onto the hole transport layer by using a sputtering method over an aluminum mask with holes with an area of 0.28 $cm^2$.

Test Results

Figure 7:
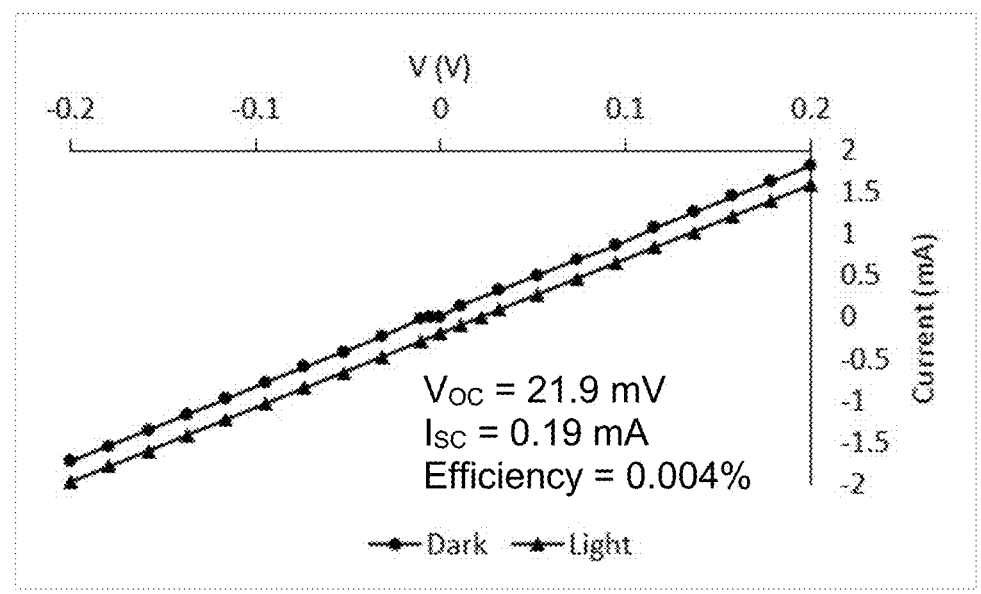
FIG. 7 is an I-V graph showing the photovoltaic behaviour of a photovoltaic cell according to Example 3 one day after deposition.

The performance of the photovoltaic cell produced in Example 3 was analyzed by using a solar simulator with 1 sun illumination. An HCl solution (3 wt. % HCl in water) was used to clean the ZnO layer and reveal the PET-ITO anode contact. Four probes were placed on the tested cell (2 on the PET-ITO anode and 2 on the gold layer cathode). The photovoltaic performance of the cell was measured with and without illumination and the current produced was recorded at different applied voltages. FIG. 7 shows the I-V curve obtained when a 0.28 $cm^2$ photovoltaic cell according to Example 3 was illuminated using 1 sun intensity (100 $mW/cm^2$ power). The black line represents the dark photovoltaic activity and the gray line represents the photovoltaic activity under illumination. A $V_{oc}$ of 21.9 mV and an $I_{sc}$ of 0.19 mA was obtained, resulting in total cell efficiency of 0.004%. This photovoltaic cell was stored under ambient conditions and exposed to an atmospheric humidity of about 60% for 1 month. As for the photovoltaic cell according to Example 1, this photovoltaic cell shoed increased activity after 1 month of storage.

At least some of the higher total cell efficiency achieved for the photovoltaic cell produced in Example 3 in comparison to that produced in Example 1 is believed to result from the inclusion of a hole transport layer.

LEP Photovoltaic Ink Composition 2

A transparent paste was prepared by mixing (60 rpm) 1000 g of poly(ethylene-co-glycidyl methacrylate) resin with 2000 g of Isopar L in a ROSS mixer (Model DPM-4) (33.4 wt. % NVS). The mixing temperature and duration was varied as described in the table below and a transparent paste was formed.

| Mixer T [° C.] | Mixing time [min] |
|---|---|
| 130 | 120 |
| 105 | 30 |
| 100 | 30 |
| 90 | 30 |
| 25 | 120 |

An LEP photovoltaic ink composition was prepared by placing 0.32 g of MAI, 0.92 g of PbI$_2$, 0.93 g of the transparent paste (33.4 wt. % NVS) and 28.8 g of Isopar L in a 300 mL glass vessel. SWCNTs were added in the following quantities:

| CNT wt. %* | CNT g |
|---|---|
| 0.2 | 0.0025 |
| 0.5 | 0.0062 |
| 0.9 | 0.0112 |
| 1.0 | 0.0124 |
| 1.1 | 0.0136 |

*wt. % of the weight of perovskite in the LEP photovoltaic ink composition.

Ceramic beads (80 g, Zirmil, 0.9 mm) were added and the vessel was tightly closed and placed in a shaker (fast&fluid SK550 1.1) for 8 hours of grinding at 500 rpm to form the LEP photovoltaic ink composition (5 wt. % NVS).

Example 4

A 20×20 cm$^2$ PET-ITO substrate was coated with an approximately 70 nm layer of ZnO by using 70 synthetic cycles of Atomic layer deposition (ALD) with an Aradiance GEMStar XT instrument.

An approximately 0.7 wt. % MAPbI$_3$ LEP photovoltaic ink composition was prepared by diluting 1.4 g of LEP photovoltaic ink composition 2 with 8.6 g of Isopar L. This ink composition was charged by using one drop of 0.5 wt. % SCD in Isopar L and deposited on the ZnO-coated PET-ITO substrate by using electroplating (using a Q/M instrument operated at 1500 V). The obtained layer was dried at 60° C. for 15 minutes to form an LEP printed photovoltaic layer disposed on the ZnO layer (an electron transport layer).

Electrically conductive LEP ink composition 1 was then deposited by drop-casting onto the LEP printed photovoltaic layer. Typically, 4-8 round spots with an area of about 0.25 cm$^2$ were formed on the 3 cm in diameter circles of LEP printed photovoltaic layer. This photovoltaic cell structure was then annealed at 120° C. for 5 mins.

Test Results

The photovoltaic cell produced according to Example 4 was analyzed by using a solar simulator with 1 sun illumination. An HCl solution (3 wt. % HCL in water) was used to clean the ZnO layer and reveal the PET-ITO anode contact. Four probes were placed on the tested cell (2 on the PET-ITO anode and 2 on the LEP printed copper cathode). The photovoltaic performance of the cell was measured with and without illumination and the current produced was recorded at different applied voltages.

Figure 8:
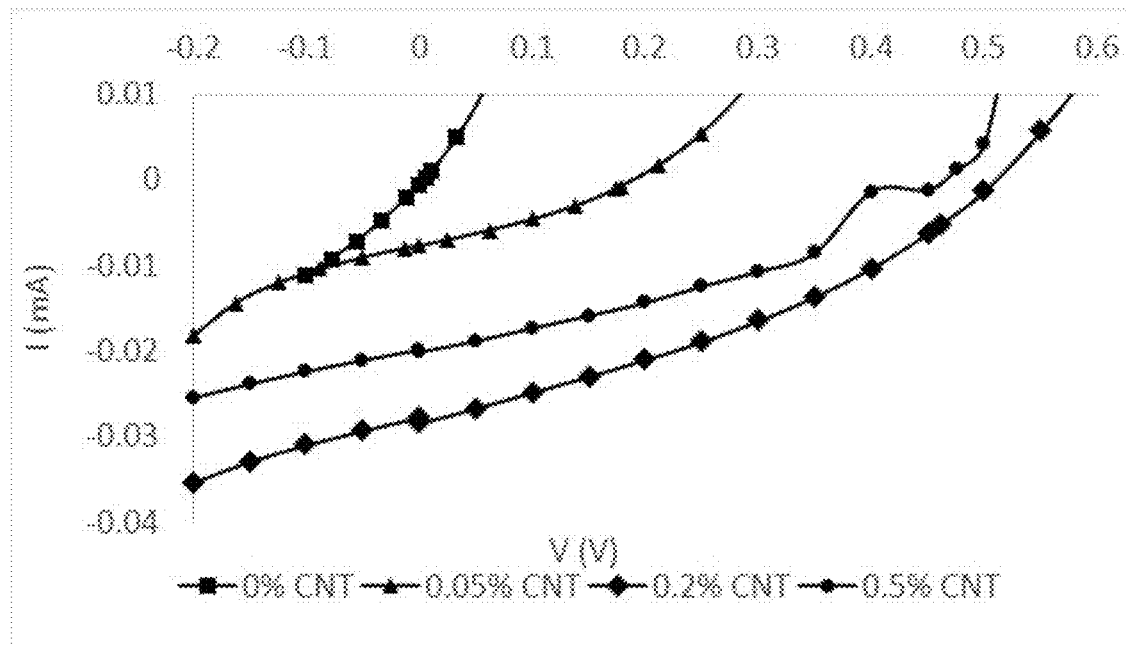
FIG. 8 is an I-V graph showing the photovoltaic behaviour of photovoltaic cells according to Example 4.

FIG. 8 is a I-V graph showing the performance of an LEP printed photovoltaic layer containing MAPbI$_3$ perovskite under one-sun illumination. The 0% CNT (■) curve represents the performance of a printed photovoltaic cell without single-walled carbon nanotubes (Example 1). The remaining curves (▲, ♦, and ●) represent the same solar cell structures in which three different weight percentages of single-walled carbon nanotubes (0.05 wt. %, 0.2 wt. % and 0.5 wt. % by weight of the material with a perovskite structure, respectively) were added to the LEP photovoltaic ink composition. The best performance ($V_{oc}$ and $I_{sc}$ and thus cell efficiency) was obtained for 0.2 wt. % single-walled carbon nanotubes. Without wishing to be bound by theory, it is believed that 0.2 wt. % may be the optimum amount of single-walled carbon nanotubes (SWCNTs) because the SWCNTs efficiently conduct charges regardless of their nature (i.e., both electrons and holes). Thus, increasing the SWCNT concentration results in an increased conductivity, improving solar cell performance but also increasing recombination events at SWCNT junctions, which reduces solar cell efficiency.

Figure 9:
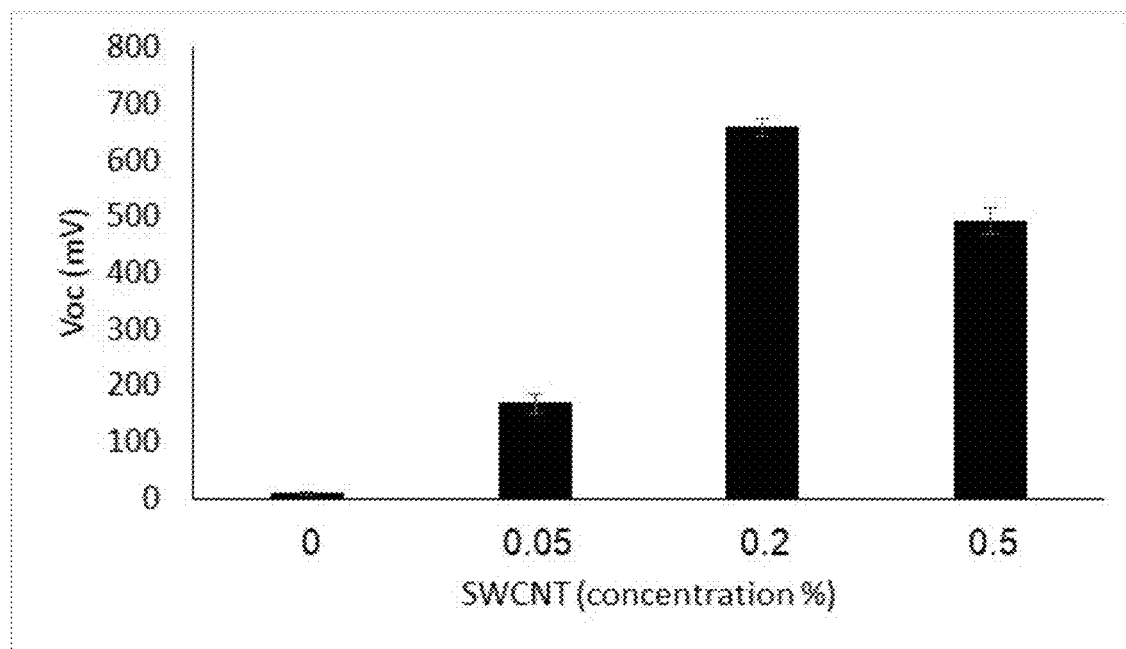
FIG. 9 is a graph showing solar cell $V_{oc}$ values as a function of the weight percent of SWCNT added to the photovoltaic layer.
Figure 10:
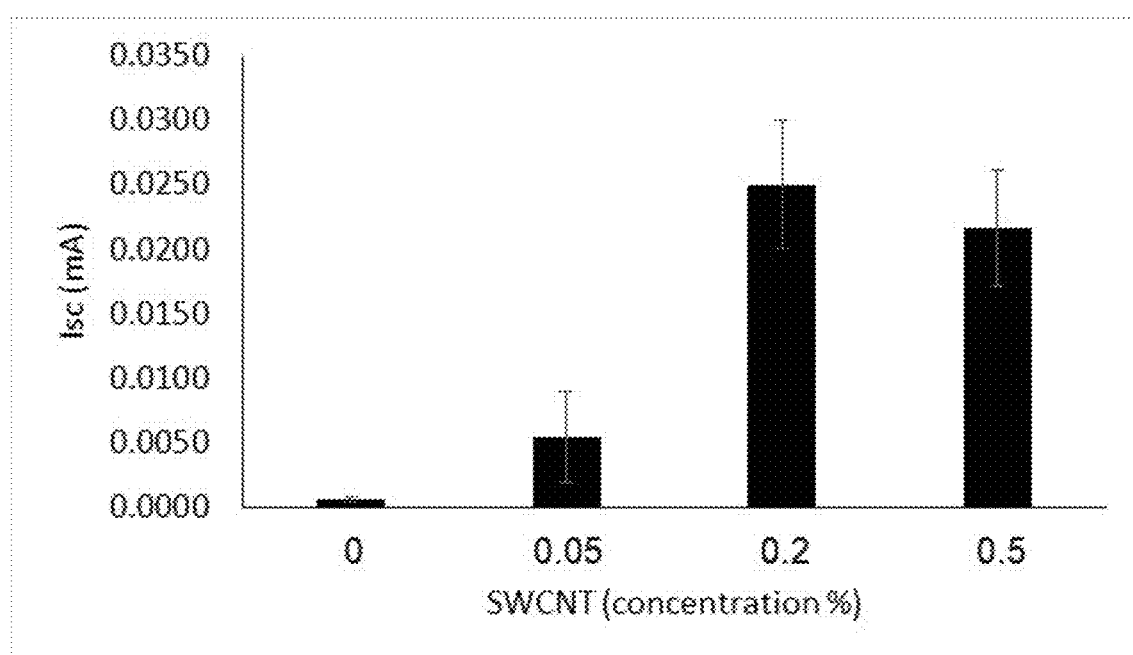
FIG. 10 is a graph showing solar cell $I_{sc}$ values as a function of the weight percent of SWCNT added to the photovoltaic layer.

FIGS. 9 and 10 illustrate the dramatic effect of addition of SWCNTs to the perovskite containing LEP ink composition in LEP printed solar cells. The measured solar cell $V_{oc}$ (open circuit voltage) and $I_{sc}$ (short circuit current) values measured by using the solar simulator increased significantly as a result of the SWCNT addition, with the maximum performance measured for only 0.2 wt. % SWCNT.

Other Example LEP Photovoltaic Ink Compositions

In addition to single-walled carbon nanotubes, LEP photovoltaic ink compositions containing carbon black particles (2.5%, 5%, 7%, 10%, 20% (w/w by weight of perovskite of the LEP photovoltaic ink composition)), conductive polymers [polypyrrole—2.5%, 5%, 7%, 10%, 20% (w/w by weight of perovskite of the LEP photovoltaic ink composition); polyaniline emeraldine base—0.1%, 0.2%, 0.5%, 1% (w/w by weight of perovskite of the LEP photovoltaic ink composition); polyaniline emeraldine base doped with sulfuric acid—0.2% (w/w by weight of perovskite of the LEP photovoltaic ink composition)], and multi-walled carbon nanotubes (0.2%, 0.5%, 1.5% (w/w by weight of perovskite of the LEP photovoltaic ink composition)) have been produced. Solar cells produced using these LEP photovoltaic ink compositions also showed improved efficiencies over those produced with LEP photovoltaic ink compositions that do not contain conductive particles.

While the invention has been described with reference to certain examples, those skilled in the art will appreciate that various modifications, changes, omissions, and substitutions can be made without departing from the spirit of the disclosure. It is intended, therefore, that the invention be limited by the scope of the following claims and their equivalents. Unless otherwise stated, the features of any dependent claim can be combined with the features of any of the other dependent claims and any of the independent claims.

The following numbered paragraphs define particular embodiments of the present disclosure:

1. A printed photovoltaic cell comprising:
   an anode;
   a liquid electrophotographically printed cathode; and
   a liquid electrophotographically printed photovoltaic layer disposed between
   the anode and the cathode;
   wherein the photovoltaic layer comprises a thermoplastic resin and a material with a perovskite structure;
   wherein the material with a perovskite structure has a chemical formula selected from $ABX_3$ and $A_2BX_6$;
   wherein A is a cation, B is a cation and X is an anion; and
   wherein the thermoplastic resin comprises:
      a copolymer of an alkylene monomer and a monomer having acidic side groups; and/or
      a copolymer of an alkylene monomer and an ethylenically unsaturated monomer comprising an epoxide; and/or
      a copolymer of an alkylene monomer, an ethylenically unsaturated monomer comprising an epoxide, and a monomer selected from a monomer having acidic side groups, a monomer having ester side groups and a mixture thereof; and
   wherein the printed cathode comprises:
   a thermoplastic resin; and
   electrically conductive metal particles.
2. The printed photovoltaic cell of paragraph 1, wherein the electrically conductive metal particles comprise a core comprising a first metal and a shell comprising a second metal; wherein the shell at least partially encloses the core and wherein the first metal is different from the second metal.
3. The printed photovoltaic cell of paragraph 1, further comprising an electron transport layer disposed between the anode and the liquid electrophotographically printed photovoltaic layer, and optionally, wherein the electron transport layer comprises a metal oxide.
4. The printed photovoltaic cell of paragraph 1, wherein A is selected from a monovalent metal cation, a monovalent organic cation, or a mixture thereof; and/or wherein B is a divalent metal cation or a tetravalent metal cation; and/or
   wherein X is a halide ion.
5. The printed photovoltaic cell of paragraph 1, wherein X is a halide ion, for example, selected from iodide, bromide, chloride and mixtures thereof; and/or wherein A is selected from methylammonium (MA), formamidinium (FA), rubidium (Rb), caesium (Cs), and mixtures thereof; and/or
   wherein B is selected from lead (Pb), germanium (Ge), tin (Sn), antimony (Sb), bismuth (Bi), copper (Cu), manganese (Mn), cobalt (Co) and mixtures thereof.
6. The printed photovoltaic cell of paragraph 1, wherein the thermoplastic resin comprises a copolymer of an alkylene monomer and an epoxide and/or a copolymer of an alkylene monomer, an ethylenically unsaturated monomer comprising an epoxide, and a monomer selected from a monomer having acidic side groups, a monomer having ester side groups and a mixture thereof; and wherein the thermoplastic resin of the photovoltaic layer has been cured, for example, by a ring-opening reaction of the epoxide and/or a cross-linking reaction of the epoxide.
7. The printed photovoltaic cell of paragraph 2, wherein the first metal is selected from copper, titanium, chromium, iron, manganese, nickel, and combinations thereof; and/or
   wherein the second metal is selected from silver, gold, platinum, rhodium, iridium, and combinations thereof.
8. The printed photovoltaic cell of paragraph 2, wherein the shell completely encloses the core; and/or
   wherein the second metal comprises from about 10 wt. % to about 40 wt. % of the total weight of the metal particles.
9. A method of producing a printed photovoltaic cell comprising:
   printing a liquid electrophotographic photovoltaic ink composition onto a substrate comprising an anode to form a liquid electrophotographically printed photovoltaic layer; and
   printing an electrically conductive liquid electrophotographic ink composition to form a liquid electrophotographically printed cathode;
   wherein the printed photovoltaic layer is disposed between the anode and the printed cathode;
   wherein the photovoltaic ink composition comprises a dispersion of a material with a perovskite structure and a thermoplastic resin in a carrier liquid;
   wherein the material with a perovskite structure has a chemical formula selected from $ABX_3$ and $A_2BX_6$;
   wherein A is a cation, B is a cation and X is an anion;
   wherein the thermoplastic resin comprises:
      a copolymer of an alkylene monomer and a monomer having acidic side groups; and/or
      a copolymer of an alkylene monomer and an ethylenically unsaturated monomer comprising an epoxide; and/or
      a copolymer of an alkylene monomer, an ethylenically unsaturated monomer comprising an epoxide, and a monomer selected from a monomer having acidic side groups, a monomer having ester side groups and a mixture thereof;
   wherein the electrically conductive ink composition comprises:
   a liquid carrier; and
   particles comprising a thermoplastic resin and electrically conductive metal particles.
10. The method of paragraph 9, wherein the substrate further comprises an electron transport layer disposed on the anode.
11. The method of paragraph 10, wherein the substrate is produced by depositing an electron transport composition on the anode, wherein the electron transport composition comprises a metal oxide dispersed in an organic solvent and optionally, wherein the organic solvent is a diol, for example, a diol selected from ethylene glycol, propylene glycol, butanediol, pentanediol and hexanediol.
12. The method of paragraph 9, wherein the thermoplastic resin comprises a copolymer of an alkylene monomer and an ethylenically unsaturated monomer comprising an epoxide; and/or a copolymer of an alkylene monomer, an ethylenically unsaturated monomer comprising an epoxide, and a monomer selected from a monomer having acidic side groups, a monomer having ester side groups and a mixture thereof; and wherein the method further comprises curing the thermoplastic resin of the printed photovoltaic layer, for example, by heating at least the printed photovoltaic layer.

13. The method of paragraph 9, wherein the liquid electrophotographic photovoltaic ink composition was formed by
combining a liquid electrophotographic ink composition comprising a dispersion of a salt AX and a thermoplastic resin in a carrier liquid with a liquid electrophotographic ink composition comprising a dispersion of a salt selected from $BX_2$ and $BX_4$ and a thermoplastic resin in a carrier liquid;
or
dispersing a salt AX, a salt selected from $BX_2$ and $BX_4$, and a thermoplastic resin in a carrier liquid.

14. The method of paragraph 9, wherein the electrically conductive metal particles comprise a core comprising a first metal and a shell comprising a second metal; wherein the shell at least partially encloses the core and wherein the first metal is different from the second metal.

15. An ink set for producing a photovoltaic cell comprising:
an electrically conductive liquid electrophotographic ink composition comprising:
a liquid carrier; and
particles comprising a thermoplastic resin and electrically conductive metal particles; and
a liquid electrophotographic photovoltaic ink composition comprising:
a dispersion of a material with a perovskite structure and a thermoplastic resin in a carrier liquid;
wherein the material with a perovskite structure has a chemical formula selected from $ABX_3$ and $A_2BX_6$;
wherein A is a cation, B is a cation and X is an anion; and
wherein the thermoplastic resin comprises:
a copolymer of an alkylene monomer and a monomer having acidic side groups; and/or
a copolymer of an alkylene monomer and an ethylenically unsaturated monomer comprising an epoxide; and/or
a copolymer of an alkylene monomer, an ethylenically unsaturated monomer comprising an epoxide, and a monomer selected from a monomer having acidic side groups, a monomer having ester side groups and a mixture thereof.

The invention claimed is:

1. A liquid electrophotographic (LEP) photovoltaic ink composition comprising:
a dispersion of a material with a perovskite structure, a thermoplastic resin and conductive particles in a carrier liquid;
wherein the material with a perovskite structure has a chemical formula selected from $ABX_3$ and $A_2BX_6$;
wherein A is a cation, B is a cation and X is an anion; and
wherein the thermoplastic resin comprises:
a copolymer of an alkylene monomer and a monomer having acidic side groups; and/or
a copolymer of an alkylene monomer and an ethylenically unsaturated monomer comprising an epoxide; and/or
a copolymer of an alkylene monomer, an ethylenically unsaturated monomer comprising an epoxide, and a monomer selected from a monomer having acidic side groups, a monomer having ester side groups and a mixture thereof.

2. The LEP photovoltaic ink composition of claim 1, wherein the conductive particles comprise elongate particles.

3. The LEP photovoltaic ink composition of claim 1, wherein the conductive particles comprise metal particles, inorganic semiconductive particles, conductive carbon particles, conductive polymers or combinations thereof.

4. The LEP photovoltaic ink composition of claim 1, wherein the conductive particles comprise carbon nanotubes, carbon black, polypyrrole, sulfuric acid doped polyaniline, polyaniline emeraldine base, nickel oxide (NiO), copper oxide (CuO), metallic dendrimers or a combination thereof.

5. The LEP photovoltaic ink composition of claim 1, wherein the conductive particles are present in the solids of the LEP photovoltaic ink composition in an amount below the percolation threshold.

6. The LEP photovoltaic ink composition of claim 1, wherein the conductive particles comprise elongate conductive particles and are present in an amount of up to 10 vol. % of the solids of the LEP photovoltaic ink composition; or wherein the conductive particles comprise spherical particles and are present in an amount of up to 50 vol. % of the solids of the LEP photovoltaic ink composition.

7. The LEP photovoltaic ink composition of claim 1, wherein the conductive particles comprise elongate particles and are present in an amount of up to 1 vol. % of the solids of the LEP photovoltaic ink composition.

8. The printed photovoltaic cell of claim 1, wherein A is selected from a monovalent metal cation, a monovalent organic cation, or a mixture thereof; and/or
wherein B is a divalent metal cation or a tetravalent metal cation; and/or
wherein X is a halide ion.

9. A method of producing a printed photovoltaic cell comprising:
printing a liquid electrophotographic photovoltaic ink composition onto a substrate comprising an anode to form a liquid electrophotographically printed photovoltaic layer; and
applying a composition to form a cathode;
wherein the printed photovoltaic layer is disposed between the anode and the cathode;
wherein the photovoltaic ink composition comprises a dispersion of a material with a perovskite structure, a thermoplastic resin and conductive particles in a carrier liquid;
wherein the material with a perovskite structure has a chemical formula selected from $ABX_3$ and $A_2BX_6$;
wherein A is a cation, B is a cation and X is an anion;
wherein the thermoplastic resin comprises:
a copolymer of an alkylene monomer and a monomer having acidic side groups; and/or
a copolymer of an alkylene monomer and an ethylenically unsaturated monomer comprising an epoxide; and/or
a copolymer of an alkylene monomer, an ethylenically unsaturated monomer comprising an epoxide, and a monomer selected from a monomer having acidic side groups, a monomer having ester side groups and a mixture thereof.

10. The method of claim 9, wherein applying a composition to form a cathode comprises printing an electrically conductive liquid electrophotographic ink composition comprising:

a liquid carrier; and particles comprising a thermoplastic resin and electrically conductive metal particles.

11. The method of claim 9, wherein the conductive particles of the photovoltaic ink composition comprise elongate conductive particles and are present in an amount of up to 1 vol. % of the solids of the photovoltaic ink composition.

12. The LEP photovoltaic ink composition of claim 1, wherein the thermoplastic resin comprises:

a copolymer of an alkylene monomer and an ethylenically unsaturated monomer comprising an epoxide; and/or a copolymer of an alkylene monomer, an ethylenically unsaturated monomer comprising an epoxide, and a monomer selected from a monomer having acidic side groups, a monomer having ester side groups and a mixture thereof.

13. The LEP photovoltaic ink composition of claim 1, wherein the thermoplastic resin is poly(ethylene-co-glycidyl methacrylate).

14. The LEP photovoltaic ink composition of claim 1, wherein the LEP photovoltaic ink composition has a non-volatile solids content of 5 wt %.

15. The LEP photovoltaic ink composition of claim 1, wherein the LEP photovoltaic ink composition has a non-volatile solids content of 40 wt %.

* * * * *